(12) United States Patent
Dames et al.

(10) Patent No.: US 10,967,740 B2
(45) Date of Patent: Apr. 6, 2021

(54) INDUCTIVE POWER COUPLING SYSTEMS FOR ROADWAYS

(71) Applicants: Andrew Nicholas Dames, Cambridge (GB); Andrew Howe, Cambridge (GB); Timothy Sweyn Norris, Cambridge (GB)

(72) Inventors: Andrew Nicholas Dames, Cambridge (GB); Andrew Howe, Cambridge (GB); Timothy Sweyn Norris, Cambridge (GB)

(*) Notice: Subject to any disclaimer, the term of this patent is extended or adjusted under 35 U.S.C. 154(b) by 175 days.

(21) Appl. No.: 15/864,633

(22) Filed: Jan. 8, 2018

(65) Prior Publication Data

US 2018/0201139 A1  Jul. 19, 2018

Related U.S. Application Data

(62) Division of application No. 14/367,513, filed as application No. PCT/EP2012/005304 on Dec. 21, 2012, now Pat. No. 9,862,277.

(30) Foreign Application Priority Data

| Dec. 21, 2011 | (GB) | 1121938 |
| Mar. 22, 2012 | (GB) | 1205062 |
| Mar. 26, 2012 | (GB) | 1205285 |
| Mar. 26, 2012 | (GB) | 1205315 |
| Apr. 12, 2012 | (GB) | 1206442 |
| Apr. 30, 2012 | (GB) | 1207565 |

(Continued)

(51) Int. Cl.
*B60L 5/00* (2006.01)
*H02J 50/40* (2016.01)
(Continued)

(52) U.S. Cl.
CPC ............. *B60L 5/005* (2013.01); *B60M 3/04* (2013.01); *B60M 7/003* (2013.01); *H01F 27/36* (2013.01); *H01F 38/14* (2013.01); *H02J 5/005* (2013.01); *H02J 7/025* (2013.01); *H02J 50/12* (2016.02); *H02J 50/40* (2016.02); *H02J 50/70* (2016.02);
(Continued)

(58) Field of Classification Search
CPC .... B60L 5/00; B60L 5/005; B60L 5/36; B60L 9/00; B60L 53/00; B60L 53/10; B60L 53/12; B60L 53/122; B60L 53/126
See application file for complete search history.

(56) References Cited

U.S. PATENT DOCUMENTS 5,573,090 A * 11/1996 Ross .................... B60L 53/122
                                                                  191/10

* cited by examiner

*Primary Examiner* — Robert J McCarry, Jr.
(74) *Attorney, Agent, or Firm* — Michael P. Pettit

(57) ABSTRACT

This invention relates to a wireless vehicle recharging apparatus for an energy storage element of a vehicle. The apparatus has at least one drive unit arrangement coupled to at least one drive coil arrangement disposed for generating a magnetic field extending from the drive coil arrangement, and includes a corresponding vehicle-mounted pickup coil arrangement coupled to a power conditioning circuit arrangement for receiving the extending magnetic field. The drive unit arrangement is operable to excite the drive coil arrangement at a fundamental frequency and the drive coil arrangement is implemented to be substantially devoid of ferromagnetic components for providing a path for the extending magnetic field. Additional aspects of the invention relate to vehicle power coupling apparatus including pickup coil arrangements.

12 Claims, 51 Drawing Sheets

(30) Foreign Application Priority Data

May 3, 2012 (GB) .................................... 1207774
May 4, 2012 (GB) .................................... 1208009

(51) Int. Cl.
    *H02J 50/12*     (2016.01)
    *H02J 50/70*     (2016.01)
    *H02J 7/02*     (2016.01)
    *H01F 27/36*     (2006.01)
    *H01F 38/14*     (2006.01)
    *B60M 3/04*     (2006.01)
    *B60M 7/00*     (2006.01)
    *H02M 5/293*     (2006.01)
    *H05K 9/00*     (2006.01)
    *H02J 5/00*     (2016.01)

(52) U.S. Cl.
    CPC .......... *H02M 5/293* (2013.01); *H05K 9/0075* (2013.01); *B60L 2200/26* (2013.01)

INDUCTIVE POWER COUPLING SYSTEMS FOR ROADWAYS

CROSS-REFERENCE TO RELATED APPLICATIONS

This application is a divisional application of co-pending U.S. patent application Ser. No. 14/367,513, filed Jun. 20, 2014, which itself is a U.S. National Stage application of PCT/EP2012/005304, filed on Dec. 21, 2012; claiming priority from United Kingdom patent applications GB 1208009.9, filed on May 4, 2012, GB 1207774.9, filed on May 3, 2012, GB 1207565.1, filed on Apr. 30, 2012, GB 1206442.4, filed on Apr. 12, 2012, GB 1205285.8, filed on Mar. 26, 2012, GB 1205315.3, filed on Mar. 26, 2012, GB 1205062.1, filed on Mar. 22, 2012, GB 1121938.3, filed on Dec. 21, 2011, the entire disclosures of each of the applications identified above are incorporated herein by reference to provide continuity of disclosure.

FIELD OF THE INVENTION

The present invention relates to inductive power coupling systems for roadways, for example to an inductive power coupling system wherein electrical power is provided from a roadway to a vehicle by way of resonant inductive coupling. Moreover, the present invention also concerns methods of operating aforesaid inductive power coupling systems. Furthermore, the present invention concerns roadways and associated apparatus for use when implementing aforesaid inductive power coupling systems. Additionally, the present invention concerns power coupling apparatus for inclusion on electric vehicles for enabling the vehicles to operate with the aforementioned roadways with their associated apparatus. The present invention also relates to vehicle power coupling apparatus, for example for to vehicle power coupling apparatus for use with electrical roadway systems. "Vehicle" includes to all types of road vehicle, for example automobile, truck, bus, cycle, tricycle, but is not limited thereto. "Electrical vehicle" includes purely electrically-propelled vehicles, as well as hybrid vehicles inducting a combination of combustion technology and electrical technology. The present invention also relates to electrical vehicle power coupling apparatus for use with electrical roadway systems. Moreover, the present invention concerns methods of operating aforesaid electrical power coupling apparatus. Furthermore, the present invention also relates to methods of maintaining aforesaid electrical vehicle power coupling apparatus. "Vehicle" includes to all types of road vehicle, for example automobile, truck, bus, cycle, tricycle, but not limited thereto. "Electrical vehicle" includes purely electrically-propelled vehicles, as wen as hybrid vehicles including a combination of combustion technology and electrical storage technology. The present invention also relates to vehicle power coupling apparatus, for example to vehicle power coupling apparatus for use with electrical vehicles. The present invention also relates to electrical roadway apparatus, for example to electrical roadway apparatus for providing inductively-coupled power when in operation to vehicles travelling along the roadway and/or for recharging energy storage devices of such vehicles, for example when the vehicles are in a stationary state. Moreover, the invention also concerns methods of operating aforesaid electrical roadway apparatus, for example to methods of providing inductive power transfer to vehicles using aforementioned apparatus. "Roadways" in relation to the present invention pertain primarily to roadways for road vehicles, although the invention is not limited thereto. The present invention also relates to electrical roadway apparatus, for example to electrical roadway apparatus implemented in a modular manner for providing inductively-coupled power when in operation to vehicles travelling along the roadway and/or for recharging energy storage devices of such vehicles, for example when the vehicles are in a stationary state. Moreover, the invention also concerns methods of installing aforesaid electrical roadway apparatus into roadways for retrofitting them to cope with a post-Carbon human civilization. "Roadways" in relation to the present invention pertain primarily to roadways for road vehicles, although the invention is not limited thereto. The present invention also relates to theft prevention systems for electrical roadway apparatus, for example to theft prevention systems for electrical roadway apparatus to help avoid theft of roadway installed cables associated with the electrical roadway apparatus operable to provide inductive power coupling to vehicles. Moreover, the invention also concerns methods of using theft prevention systems for preventing theft of aforesaid electrical roadway apparatus, for example to methods of using theft, prevention systems to help avoid theft of roadway-installed cables from aforementioned apparatus. Furthermore, the invention also relates to software products recorded on machine-readable data storage media, the software products being executable upon computing hardware for implementing aforesaid methods. "Roadways" in relation to the present invention pertain primarily to roadways for road vehicles, although the invention is not limited thereto.

BACKGROUND OF THE INVENTION

Electrical power coupling systems for roadways have been known for many years. Trolley busses have been in use since the early 1900's which utilize associated flexible booms having at their distal ends power pickoff arrangements for drawing power from overhead power cables supported from buildings or poles. Such trolley busses have many benefits in urban surroundings, for example low operating noise, low air pollution at the trolley busses, fast acceleration and relatively simple drive trains in the trolley busses themselves. However, considerable maintenance is required for the overhead power cables, for example on account of arcing which occurs when the power pickoff arrangements are moved relative to the overhead power cables when in operation. On account of such practical difficulties, inductive power coupling systems for roadways have been described earlier in published literature as being a possible solution for future transport infrastructure.

In a United Kingdom patent no. GS 1418128 published in December 1975 ("Improvements in or relating to electrified transportation", Otto), there is described an electrical supply arrangement for an electrically driven vehicle, vein the supply arrangement comprises one or more current carrying conductors which are external to and separate from the vehicle. The one or more conductors are operable to provide an induced inductive electrical supply in at least one electrical circuit located in or on the vehicle so as to drive the vehicle. The electrical circuit comprises one or more inductive and one or more capacitive elements in series, and are integrally formed as a sandwich arrangement of two or more electrically conducting members and one or more electrically insulating members. Optionally, the frequency of the electrical supply to the one or more current carrying conductors is at, or close to, the resonant frequency of the electrical circuit. Optionally, the electrical circuit is formed in an integral manner from one or more series-conned sandwich arrangements of highly-conducting metal strips and very low loss dielectric strips. More optionally, the or each integrally-formed circuit of capacitive and inductive elements has a resonant frequency at or close to the supply frequency of the current flowing through the one or more current carrying conductors. In an example described in the patent, a 6 kW power transfer is described at a resonant frequency of 7.5 kHz. Such power transfer is insufficient to meet contemporary power requirements for electric vehicles which often employ electric drive trains with electric motors of 10 kW or greater. Contemporary hybrid electric trucks often employ traction motors of up to 100 kW rating.

In a published European patent application no. EP 0 289 868A2 ("Roadway power and control system for inductively coupled transportation system", Induction Corporation, published November 1988), there is described an electrical modular roadway system which is operable to transmit power to and to control inductively coupled vehicles travelling thereon. The system comprises a plurality of elongate, electrically connected inductor modules arranged in an aligned end-to-end spaced apart for forming a continuous vehicle path. Each module has a magnetic core and power windings which generate a magnetic field extending above the road surface. Controllable relays are connected between the modules for allowing operating electric current to either activate or bypass selected modules. Moreover, sensing windings in the modules are activated by the presence of a vehicle on one module to provide control signals to relays for other modules. The patent application does not mention operating frequency, but it is implicit that this operating frequency is electrical power fine frequency of circa 50 Hz or 60 Hz in view of ferromagnetic tore materials needing to be employed. The system does not appear to have come into general widespread use, presumably in view of major road works being requited to install the modules.

In a granted German patent no. DE 4429656C1 ("Einrichtung zur berührungsfreien Übenragung elekrischer Energie auf einen Gegenstand", Professor Meins) published in April 1996, there is described a resonant inductive energy coupling system for road vehicles, wherein the system employs inductive coupling coils with series resonant capacitors.

Despite being proposed on many occasions in earlier patent applications and granted patents, wireless inductive power coupling for road vehicles has not been generally adopted within contemporary transport infrastructure. A reason for such lack of adoption may arise on account of high initial installation cost of road-embedded inductive coils and low petroleum prices. However, with an onset of "peak oil" and concerns regarding potential anthropogenic climate change associated with Carbon Dioxide emissions, interest has been recently reawakened in respect of such inductively-coupled roadways, especially when many new designs of road vehicles are now being based upon plug-in hybrid drive train configurations. However, there still arises a need for an optimal internationally standardized configuration of inductive power transfer system for roadways before major investments are likely to be implemented. The present invention seeks to address the aforementioned problems associated with known technical art to render possible practical inductive power transfer systems for roadways and electric vehicle which are compatible therewith.

Many demonstrations of supplying electrical grid power to moving vehicles have been made. Most demonstrators that have been implemented in practice involve guided vehicles, for example tams, light rail and trains, or vehicles with restricted movement such as trolley busses. Inductively powered roadway systems have been proposed for powering trams, and, to a lesser extent, busses; for example a system was proposed some years ago by Bombardier. Despite successful operation of these systems, they have not been adopted into road vehicle applications, primarily on account of major infrastructure changes required and corresponding installation of vehicle fitments.

Electrical roadway systems have been known for many years. Trolley busses have been in use since the early 1900's which utilize associated flexible booms having at their distal ends power pickoff arrangements for drawing power from overhead power cables supported from buildings or poles. Such trolley busses have many benefits in urban surroundings, for example low operating noise, low air pollution at the trolley busses, fast acceleration and relatively simple drive trains in the trolley busses themselves. However, considerate maintenance is required for the overhead power cables, for example on account of arcing which occurs when the power pickoff arrangements are moved relative to the overhead power cables when in operation.

In the foresaid electrical supply arrangement of GB 1418128, it is found in practice that mounting a resonant power coupling arrangement onto an underside of a vehicle reduces access to other vehicle parts from the underside of the vehicle. Such access is important when the vehicle is a hybrid vehicle which includes a combustion engine system for generating motive power from carbonaceous fuel oxidation, wherein combustion gases are directed in operation via an exhaust system having an exhaust pipe mounted underneath the vehicle. Removing the resonant power coupling arrangement for gaining access to the exhaust pipe is time consuming. Moreover, a resonant power coupling apparatus which covers the underside of the vehicle results in impaired coating to the exhaust pipe. Moreover, implementing the resonant power coupling apparatus to occupy less area reduces a performance of the apparatus to couple power for gaining access the exhaust pipe.

Electrical roadway systems have been known for many years. Trolley busses have been in use since the early 1900's which utilize associated flexible booms having at their distal ends power pickoff arrangements for drawing power from overhead power cables supported from buildings or poles. Such trolley busses have many benefits in urban surroundings, for example low operating noise, low air pollution at the trolley busses, fast acceleration and relatively simple drive trains in the trolley busses themselves. However, considerable maintenance is required for the overhead power cables, for example on account of arcing which occurs when the power pickoff arrangements are moved relative to the overhead power, cables when in operation.

In the foresaid electrical supply arrangement of GB 1418128, it is found in practice that a relatively small clearance has to be employed between an upper surface of a roadway in which excitation coils are housed and a pickup coil mounted to an underside of a vehicle which is operably compatible with the roadway. Such a relatively small clearance, for example in a range of 10 cm to 20 cm, potentially represents a safety hazard when vehicles are travelling a high speeds, for example 120 km/hour, upon the roadway, especially when there is a risk of loose objects, namely debris being present on the upper surface of the roadway. Such loose objects risk being wedged under the vehicles and damaging their respective pickup coil. A conventional manner to address this risk is to employ larger clearances and increase an area or number of turns included on the pickup coil, but potentially adds considerably to cost.

Despite the aforementioned wireless-powered electrical supply arrangement being described in December 1975, the arrangement has not been adopted into, general use, presumably on account of petroleum being plentiful and there being little impetus to employ alternative vehicle propulsion technologies.

Electric vehicles for use with electrical roadway systems have been known for many years. Trolley busses have been in use since the early 1900's which utilize associated flexible booms having at their distal ends power pickoff arrangements for drawing power from overhead power cables supported from buildings or poles. Such trolley busses have many benefits in urban surroundings, for example low operating noise, low air pollution at the trolley busses, fast acceleration end relatively simple drive trains in the trolley busses themselves. However, considerable, maintenance is required for the overhead power cables, for example on account of arcing which occurs when the power pickoff arrangements are moved relative to the overhead power cables when in operation.

A problem with the electrical supply arrangement described in aforesaid patent no. GB 1418128 is that a relatively close spacing is required to be maintained between the one or more current conductors which are external to and separate from the vehicles relative to the at least one electrical circuit located in or on the vehicle for driving the vehicle. In an event of road debris or occluding material, for example snow, being present upon a road surface above the one or more current conductors, there arises a risk of the road debris or occluding material damaging an underside of the vehicle, for example causing damage to the one or more conductors. When high vehicle speeds are employed, for example greater than 50 km/hour, the road debris or occluding material can potentially cause accidents. Conventionally, careful maintenance of roadways to remove the road debris or occluding material would be considered necessary, but such maintenance is not economically feasible to achieve in practice for all sections of road equipped with the one or more current conductors.

When the electrical supply arrangement is evolved to a form suitable for delivering 10 kW of more, fax example 50 kW, for propelling contemporary electrical vehicles, or electric-hybrid vehicles including chemical oxidation processes for providing a source of energy for motive power, the aforesaid electrical circuits are excited with considerable signal magnitudes and associated alternating currents such that safety issues then need to be taken seriously into account. Safely issues can relate to one or more of the following:

(a) exposure of personnel to high-power alternating electromagnetic fields which can potentially represent a biological hazard;

(a) electrical shock risk to personnel when circuit cable windings embedded into a roadway are faulty or damaged, resulting in a breakdown of cable insulation;

(b) corrosion causing damage to conductors of circuit cable windings embedded into the roadway, resulting in en increase in cable resistance and associated resistive power losses when excited in operation, namely losses which are potentially spatially concentrated and can result in fire risk by setting adjacent asphalt and/or cable insulation into combustion; and (c) gross roadway surface damage which can potentially result in circuit cable windings being severed and exposed at a surface of the roadway, representing an electrical shock hazard, for example as a consequence of Earthquake, road subsidence or major road accident.

Although such safety issues can potentially be addressed, at least in part, by human inspection of roadways, it is desirable to employ more robust and less personnel-intensive approaches to ensure safety of electrical roadways employing inductive power transfer to vehicles.

In a published European patent application no. EP 0, 289, 868 ("Roadway power and control system for inductively coupled transportation system", Inductran Corporation, California, USA), there is described an electrical modular roadway adapted for transmitting power to and controlling inductively-coupled vehicles travelling thereon. The system comprises a plurality of elongate, electrically-connected inductor modules arranged in an aligned end-to-end spaced apart manner in order to form a continuous vehicle path. Each module has a magnetic core and power windings which generate a magnetic field extending above the road surface. Controllable relays are connected between modules for allowing operating electric current to either activate or bypass selected modules. Sensing windings included in the modules are activated by the presence of a vehicle on one module to provide control signals to relays for other modules. Although an operating frequency for creating the magnetic field is not described, the modules are constructed in a manner which would allow them to be energized at normal line frequency, for example 50 Hz or 60 Hz.

The aforesaid electrical supply arrangement (Otto) and the aforementioned roadway power and control system (Inductran Corp.) potential represent a major installation task when being retrofitted to existing roadways. For example, the aforementioned roadway power and control system requires a major trench to be prepared along vehicle-bearing lanes of a roadway for accommodating the modules, including their magnetic cores. Moreover, the aforesaid electrical supply arrangement requires a complex configuration of coil windings to be installed in a roadway which is costly and time consuming. Such cost and complication represent a technical problem which dissuades implementation of inductively-coupled vehicle roadways, thus favouring contemporary alternatives such as continuing to employ Carbon-fuel driven vehicles and/or to employ vehicles with large heavy rechargeable batteries, for example sealed Lead-acid accumulators which are environmentally damaging and Lithium batteries which represent a potential fire risk.

Concerns regarding "peak oil" and anthropogenic forcing of climate change require that road transport in future be evolved away from burning of fossil fuels. Moreover, resource limitations on battery materials, for example World supply of Lithium, prevents a majority of road vehicles in the World being implemented as electric rechargeable vehicles. Furthermore, heavy rechargeable batteries in road vehicles is undesirable from a safety viewpoint on account of kinetic energy $K_E$ in the road vehicles being given by ½ $mV^2$, wherein m is a mass of the vehicle, and V is a velocity of the vehicle when in motion. For example, a contemporary Tesla Roadster vehicle is a very highly regarded and respected quality product and includes a Lithium rechargeable battery having a mass in an order of 500 kg; at a speed of 100 km/h, such a Roadster vehicle has a kinetic energy in an order of 500 kJ which is potentially instantaneously released in an event of a severe crash situation. Similar considerations pertain also to other types of contemporary electric and hybrid vehicles.

There thus arises a problem of implementing an inductively-coupled roadway for providing motive power to electric and hybrid vehicles in a manner which is commercially more attractive and more straightforward to implement in comparison to known arrangements and systems.

As World population increases from presently 7 billion people to around 10 billion people by year 2050, Earth's resources are being shared between increasingly more people, especially as living standards improve in Asia, in particular China and India Energy-per-capita based upon known oil and gas reserves falls rapidly from year 2020 onwards. On account of metals requiring considerable energy in their mining, processing and adaptation into products such as electrical cables, transformers and weatherproof housings for example, it is anticipated that metal thefts will become a major problem in the future. When such theft concerns infrastructure such as cables along sides of railway tracks, theft of such cables for their metal content can be highly disruptive to reliable operation of such infrastructure. Moreover, damage caused by hasty cable thefts can be very costly to repair, often much more costly than merely metal value of the cables themselves.

In an event that electrical roadways are developed to provide contactless inductive transfer of motive power to electrically-propelled vehicles, for example as described in aforesaid United Kingdom patent no. GB 1418128, a problem potentially arises when cables embedded into road surfaces for implementing such roadways are stolen on account of their scrap metal value. A conventional approach would be to employ an army of roadway policemen and roadway policewomen in situ to keep watch of roadways, namely to arrest promptly any thieves who attempt to steal roadway-embedded cables; such an approach would be extremely expensive, although it could assist to reduce contemporary unemployment in a post "peak-oil" society. Alternatively, another conventional approach would be to provide surveillance equipment along roadways, for example surveillance cameras, coupled to a centralized security facility with rapid-deployment policemen and policewomen to travel out and arrest thieves in an event of cable theft being detected. A yet alternative conventional approach would be to embed the cables is such a mechanically secure manner into roadways that theft would be difficult to undertake by unauthorized parties. However, such secure embedding of cables renders thorn difficult to access in an event that authorized parties are required to replace or to repair the cables. Moreover, operating surveillance equipment is costly in personnel time, wherein personnel remotely monitor surveillance camera images for traces of theft or potentially thieving activities.

SUMMARY OF THE INVENTION

The present invention seeks to provide an inductive power coupling system which is less expensive and simpler to implement.

Moreover, the present invention seeks to provide an inductive power coupling system which is lightweight, both in respect of vehicle fittings as well as road infrastructure needed to support such vehicles.

Moreover, the present invention seeks to provide an inductive power coupling system which avoids a need to include ferromagnetic components within a roadway along which the system is implemented.

Furthermore, the present invention seeks to provide an inductive power coupling system which is operable to provide an efficient power transfer to vehicles even when the vehicles are not accurately spatially located in respect of lanes of a roadway along which the inductive power coupling system is implemented.

Additionally, the present invention seeks to provide a responsive lead which is capable of assisting with implementation of smart grid technologies which are perceived to be important for the integration of renewable energy systems into electrical supply grids.

The present invention also seeks to provide a vehicle power coupling apparatus for inclusion into or onto a vehicle which enables improved cooling and access to combustion system components of the vehicle, for example to an exhaust pipe arrangement of the vehicle.

The present invention also seeks to provide an electrical vehicle power coupling apparatus for inclusion into or onto an electrical vehicle which enables the vehicle to receive power from an in-road mounted excitation system in a reliable, inexpensive and practical manner.

The present invention also seeks to provide a vehicle power coupling apparatus for inclusion into or onto a vehicle, for inductive power transfer thereto, which enables improved reliability, for example greater robustness, when road debris or occluding material ere present along roadways.

The present invention also seeks to provide an electrical roadway apparatus which is capable of operating with increased safety when one or more vehicles are travelling along a roadway equipped with the apparatus.

The present invention also seeks to provide an electrical roadway apparatus which is more straightforward and rapid to install, for example when retrofitting to existing roadways.

The present invention also seeks to provide a theft prevention system for electrical roadway apparatus which is capable of detecting unauthorized tampering and theft of one or more component parts of the electrical roadway apparatus.

According to a first aspect of the present invention, there is provided an inductive power transfer system as defined in appended claim 1: there is provided an inductive power transfer system for roadways, wherein the system includes at least one drive unit arrangement coupled to at least one drive coil arrangement disposed along a roadway for generating a magnetic field extending upwardly from the roadway, and at least one vehicle including a corresponding pickup coil arrangement coupled to a power conditioning circuit arrangement for receiving the extending magnetic field for providing power to operate the at least one vehicle, characterized in that:
(i) the at least one drive unit arrangement is operable to excite the at least one drive coil arrangement at a fundamental frequency ($f_0$) of at least 30 kHz; and
(ii) the at least one drive coil arrangement is implemented to be substantially devoid of ferromagnetic components for providing a path for the extending magnetic field.

The invention is of advantage in that the inductive power transfer system is capable, on account of its higher frequency of operation, of transferring larger amounts of power without a need for the roadway to include ferromagnetic components.

Such an implementation of the system synergistically both addresses issues of system implementation cost and system power transfer performance.

Optionally, in the inductive power transfer system, the at least one drive unit arrangement is operable to excite the at least one drive coil arrangement, for example into resonance, at a fundamental frequency ($f_0$) of at least 50 kHz, preferably at least 100 kHz, and more preferably at least 140 kHz.

Optionally, in the inductive power transfer system, the at least one drive unit arrangement is operable to employ a balanced class-E amplifier arrangement for exciting the at least one drive coil arrangement, for example into resonance, at the fundamental frequency ($f_0$).

Optionally, in the inductive power transfer system, the at least one drive unit arrangement is operable to employ one or more Silicon Carbide semiconductor devices for switching the currents provided to the corresponding at least one drive coil arrangement.

Optionally, in the inductive power transfer system, the at least one vehicle includes a magnetic shield arrangement disposed spatially adjacent to the pickup coil arrangement with a gap therebetween, such that the pickup coil arrangement is disposed between the magnetic shield arrangement and the drive coil arrangement when the system is in operation. More optionally, the magnetic shield arrangement is fabricated from a non-ferromagnetic electrically-conductive metallic material. More optionally, the non-ferromagnetic conductive metallic material is at least one of: Aluminium, Aluminium alloy, Aluminium-Copper alloy, Magnesium alloy, Titanium, Titanium alloy. Optionally, the shield is implemented as a composite material component including electrically conductive material, for example Aluminium sheet.

Optionally, in the inductive power transfer system, at least one of the drive coil arrangement and the pickup coil arrangement is implemented as at least one coil including one or more turns, wherein the one or more turns are provided with one or more corresponding capacitors is series.

Optionally, in the inductive power transfer system, the pickup coil arrangement of the at least one vehicle is prodded with a plurality of coils, and the power conditioning circuit arrangement is operable to select amongst the plurality of coils for achieving a most efficient inductive power coupling to the at least one vehicle.

Optionally, in the inductive power transfer system, the at least one vehicle is operable to emit a pilot signal which is receivable at the at least one drive coil arrangement and/or its corresponding drive unit arrangement for the system to control excitation of the at least one drive coil arrangement when the at least one vehicle is approaching or overlaid onto the at least one drive coil arrangement.

More optionally, in the inductive power transfer system, the pilot signal includes information for uniquely identifying the corresponding at least one vehicle, wherein the at least one drive unit arrangement is operable to convey the information to a payment system for invoicing a party responsible for the at least one vehicle for power which is inductively transferred to the at least one vehicle when in use on the roadway.

More optionally, in the inductive power transfer system, the at least one drive coil arrangement includes a plurality of coils which are operable to receive the pilot signal when the at least one vehicle is approaching or overlaid onto the at least one drive coil arrangement, and wherein the corresponding at least one drive unit arrangement is operable to excite selectively one or more of the plurality of coils depending upon an amplitude of the pilot signal as received at the plurality of coils.

Optionally, the inductive power transfer system is implemented such that the at least one drive unit arrangement of the system is operable to energize its corresponding at least one drive coil arrangement to transfer power at the at least one vehicle only when the at least one vehicle is travelling greater than a threshold speed in relation to the at least one drive unit arrangement.

Optionally, the inductive power transfer system further including a passive and/or active suppression arrangement for suppressing harmonic magnetic field components at multiples of the fundamental frequency ($f_0$) generated by the system when in operation.

According to a second aspect of the invention, there is provided a vehicle which is operable with an inductive power transfer system according to the first aspect of the invention, characterized in that the vehicle includes a pickup coil arrangement for received inductively coupled power from the system, a magnetic shield arrangement disposed spatially adjacent to the pickup coil arrangement, such that the pickup coil arrangement is disposed between the magnetic shield arrangement and a drive coil arrangement of the system when the system is in operation, and a power conditioning circuit arrangement coupled to the pickup coil arrangement for forming inductively coupled power received at the vehicle to provide motive force to propel the vehicle.

Optionally, in the vehicle, the magnetic shield arrangement is fabricated from a non-ferromagnetic electrically-conductive metallic material. More optionally, the non-ferromagnetic conductive metallic material is at least one of: Aluminium, Aluminium alloy, Aluminium-Copper alloy, Magnesium alloy, Titanium, Titanium alloy.

Optionally, in the vehicle, the pickup coil arrangement is provided with a plurality of coils, and the power conditioning circuit arrangement is operable to select amongst the plurality of coils for achieving a most efficient inductive power coupling to the vehicle.

Optionally, the vehicle is operable to emit a pilot signal which is receivable at at least one drive coil arrangement and/or its corresponding drive unit arrangement of the system for the system to control excitation of the at least one drive coil arrangement when the vehicle is approaching or overlaid onto the at least one drive coil arrangement.

Optionally, in the vehicle, the pilot signal includes information for uniquely identifying the corresponding vehicle, wherein an at least one drive unit arrangement of the system is operable to convey the information to a payment system for invoicing a party responsible for the vehicle for power which is inductively transferred to the vehicle when use on a roadway of the system.

According to a third aspect of the invention, there is provided a roadway for use when implementing a system according to the first aspect of the invention, wherein the roadway includes a plurality of drive coil arrangements coupled to associated drive unit arrangements, characterized in that each drive coil arrangement is implemented by way of one or more coils embedded into the roadway, wherein a magnetic path associated with the one or more cods is substantially devoid of ferromagnetic materials, and the one or more coils are operable to provide inductive power transfer to one or more vehicles on the roadway at a fundamental frequency ($f_0$) of at least 30 kHz.

Optionally, in the roadway, the at least one drive coil arrangement is operable to be excited into resonance at a fundamental frequency ($f_0$) of at least 50 kHz, preferably at least 100 KHz, and more preferably at least 140 kHz.

Optionally, in the roadway, the at least one drive unit arrangement is operable to employ a balanced class-E amplifier arrangement for exciting the at least one drive coil arrangement at the fundamental frequency ($f_0$).

Optionally, in the roadway, the at least one drive unit arrangement is operable to employ one or more Silicon Carbide semiconductor devices for switching the currents provided to the corresponding at least one drive coil arrangement.

Optionally, in the roadway, the at least one drive coil arrangement is implemented as at least one coil including one or more turns, wherein the one or more turns are provided with one or more corresponding series capacitors.

Optionally, in the roadway, the at the at least one drive coil arrangement and/or its corresponding drive unit arrangement is operable to receive one or more pilot signals emitted from one or more vehicles travelling in operation along the roadway for the drive unit arrangement to control excitation of the at least one drive coil arrangement in response to the received pilot signal when the at least one vehicle is approaching or overlaid onto the at least one drive coil arrangement.

More optionally, in the roadway, the drive unit arrangement is operable to identify from the pilot signal information for uniquely identifying the corresponding at least one vehicle, wherein the at least one drive unit arrangement is operable to convey the information to a payment system for invoicing a party responsible for the at least one vehicle for power which is inductively transferred to the at least one vehicle when used on the roadway.

More optionally, in the roadway, the at least one drive unit arrangement is operable to energize its corresponding at least one drive coil arrangement to transfer power at the at least one vehicle only when the at least one vehicle is travelling greater than a threshold speed in relation to the at least one drive unit arrangement.

More optionally, in the roadway, the at least one drive coil arrangement includes a plurality of coils which are operable to receive the plot signal when the at least one vehicle is approaching or overlaid onto the at least one drive coil arrangement and wherein the corresponding at least one drive unit arrangement is operable to excite selectively one or more of the plurality of coils depending upon an amplitude of the pilot signal as received at the plurality of coils.

Optionally, in the roadway, the at least one drive coil arrangement is embedded within slots formed into an upper surface of the roadway, wherein the slots are backfilled so that the upper surface of the roadway is substantially planar for receiving the at least one vehicle.

Optionally, in the roadway, the at least one drive coin arrangement includes one or more coils, wherein the coils are formed using cables, and wherein the cables are at least one of: individually-insulated multicore cables, Litz wire, ribbon cables and bundles of individually insulated metal strips.

Optionally, in the roadway, the at least one drive unit arrangement is disposed along one or more outer peripheral edges of the roadway and coupled to corresponding at least one drive coil arrangement embedded within the roadway.

According to a fourth aspect of the invention, there is provided a wireless vehicle recharging apparatus for providing recharging power to an energy storage element of a vehicle, characterized in that the apparatus includes at least one drive unit arrangement coupled to at least one drive coil arrangement disposed for generating a magnetic field extending from the at least one drive coil arrangement and includes a corresponding vehicle-mounted pickup coil arrangement coupled to a power conditioning circuit arrangement for receiving the extending magnetic field for providing power to recharge the energy storage element, wherein:
(i) the at least one drive unit arrangement is operable to excite the at least one drive coil arrangement at a fundamental frequency ($f_0$) of at least 30 kHz; and
(ii) the at least one drive coil arrangement is implemented to be substantially devoid of ferromagnetic components for providing a path for the extending magnetic field.

Optionally, in the wireless vehicle recharging apparatus, the at least one drive unit arrangement is operable to excite the at least one drive coil arrangement, for example into resonance, at a fundamental frequency ($f_0$) of at least 50 kHz, preferably at least 100 kHz, and most preferably at least 140 kHz.

Optionally, in the wireless vehicle recharging apparatus, the at least one drive unit arrangement is operable to employ a balanced class-E amplifier arrangement for exciting the at least one drive coil arrangement for example into resonance, at the fundamental frequency ($f_0$).

Optionally, in the wireless vehicle recharging apparatus, the at least one drive unit arrangement is operable to employ one or more Silicon Carbide semiconductor devices for switching the currents provided to the corresponding at least one drive coil arrangement.

Optionally, in the wireless vehicle recharging apparatus, the vehicle includes a magnetic shield arrangement disposed spatially adjacent to the pickup coil arrangement, such that the pickup coil arrangement is disposed between the magnetic shield arrangement and the drive coil arrangement when the apparatus is in operation.

More optionally, in wireless vehicle recharging apparatus, the magnetic shield arrangement is fabricated from a non-ferromagnetic electrically-conductive metallic material. Mom optionally, in the wireless vehicle recharging apparatus, the non-ferromagnetic conductive metallic material is at least one or: Aluminium, Aluminium alloy, Aluminum-Copper alloy, Magnesium alloy, Titanium, Titanium alloy.

Optionally, in the wireless vehicle recharging apparatus, at least one of the drive coil arrangement and the pickup coil arrangement is implemented as at least one coil including one or more turns, wherein the one or more turns are provided with one or more corresponding series capacitors. Such an arrangement ensures lower potential drop within the drive coil arrangement and improves operating safety.

Optionally, in the wireless vehicle recharging apparatus, the pickup coil arrangement of the vehicle is provided with a plurality of coils, and the power conditioning circuit arrangement is operable to select amongst the plurality of coils for achieving a most efficient inductive power coupling to the at least one vehicle.

Optionally, in the wireless vehicle recharging apparatus, the vehicle is operable to derive its motive power from compressed air driving an air motor to provide torque to wheels of the vehicle, and the energy stored element is implemented as a combination of an air compressor and at least one high-pressure compressed air tank for received compressed air from the air compressor for energy storage purposes in the vehicle.

According to a fifth aspect of the invention, there is provided a method of inductively transferring power for roadways, wherein the methods includes:
(a) using at least one drive unit arrangement coupled to at least one drive coil arrangement disposed along a roadway for generating a magnetic field extending upwardly from the roadway; and
(b) at at least one vehicle including a corresponding pickup coil arrangement coupled to a power conditioning circuit arrangement, receiving the extending magnetic field for providing power to operate the at least one vehicle;
characterized in that the method further includes:

(i) using the at least one drive unit arrangement to excite the at least one drive coil arrangement at a fundamental frequency ($f_O$) of at least 30 kHz; and (ii) implementing the at least one drive coil arrangement to be substantially devoid of ferromagnetic components for providing a path for the extending magnetic field.

Optionally, the method includes using the at least one drive unit arrangement to excite the at least one drive coil arrangement, for example into resonance, at a fundamental frequency ($f_O$) of at least 50 kHz, preferably at least 100 kHz and more preferably at least 140 kHz.

Optionally, the method includes employing in the at least one drive unit arrangement a balanced class-E amplifier arrangement for exciting the at least one drive coil arrangement at the fundamental frequency ($f_O$).

Optionally, the method includes employing in the at least one drive unit arrangement one or more Silicon Carbide semiconductor devices for switching the currents provided to the corresponding at least one drive coil arrangement.

Optionally, the method includes disposing in the at least one vehicle a magnetic shield arrangement spatially adjacent to the pickup coil arrangement with a gap therebetween, such that the pickup coil arrangement is disposed between the magnetic shield arrangement and the drive oil arrangement when in operation.

More optionally, the method includes fabricating the magnetic shield arrangement from a non-ferromagnetic electrically-conductive metallic material. More optionally, the non ferromagnetic conductive metallic material is at least one of: Aluminium, Aluminium alloy, Aluminium-Copper alloy, Magnesium alloy, Titanium, Titanium alloy.

Optionally, the method includes implementing at least one of the drive coil arrangement and the pickup coil arrangement as at least one coil including one or more turns, wherein the one or more turns are provided with one or more corresponding series capacitors.

Optionally, the method includes providing the pickup coil arrangement of the at least one vehicle with a plurality of coils, and operating the power conditioning circuit arrangement to select amongst the plurality of coils for achieving a most efficient inductive power coupling to the at least one vehicle.

Optionally, the method includes operating the at least one vehicle to emit a pilot signal which is receivable at the at least one drive coil arrangement and/or its corresponding drive unit arrangement for the system to control excitation of the at least one drive coil arrangement when the at least one vehicle is approaching or overlaid onto the at least one drive coil arrangement. Optionally, the pilot signal is communicated by inductive coupling and/or wireless radio coupling and/or optical coupling.

Optionally, the method includes incorporating into the pilot signal information for uniquely identifying the corresponding at least one vehicle, wherein the at least one drive unit arrangement is operable to convey the information to a payment system for invoicing a party responsible for the at least one vehicle for power which is inductively transferred to the at least one vehicle when in use on the roadway.

Optionally, the method includes operating the at least one drive unit arrangement to energize its corresponding at least one drive coil arrangement to transfer power at the at least one vehicle only when the at least one vehicle (30) is travelling greater than a threshold speed in relation to the at least one drive unit arrangement.

Optionally, the method includes incorporating in the at least one drive coil arrangement a plurality of coils which are operable to receive the pilot signal when the at least one vehicle is approaching or overlaid onto the at least one drive coil arrangement, and wherein the corresponding at least one drive unit arrangement is operable to excite selectively one or more of the plurality of coils depending upon en amplitude of the pilot signal as received at the plurality of coils.

According to a sixth aspect of the invention, there is provided a method of installing a drive coil arrangement into a roadway for implementing a system according to the first aspect of the invention, characterized in that the method includes:

(a) employing a cutting tool to cut one or more slots into asphalt and/or concrete on an upper surface of the roadway so as to define a complete loop path, including one or more slots leading to a peripheral edge of the roadway;

(b) installing one or more turns of a coil of a drive coil arrangement into the one or more slots, terminating the coil along slots to the peripheral edge of the roadway; and (c) backfilling remaining regions of the one or more slots devoid of cable therein with a filling material such that the one or more slots are fled such that upper surfaces of the filled slots are substantially flush with an upper surface of the roadway.

According to a seventh aspect of the invention, there is provided a method of employing an inductive power transfer system according to the first aspect of the invention for providing responsive load functionality for assisting to stabilize an electrical supply network providing power to the inductive power transfer system, characterized in that the method includes:

(a) generating a signal in respect of the electrical supply network indicative of a degree of balance of the supply network; and (b) communicating the signal to at least one of a drive unit arrangement of a roadway and a power conditioning circuit arrangement on board a vehicle operable to receive inductively coupled power provided via the drive unit arrangement for controlling power delivered to the vehicle for assisting to balance the electrical supply network.

According to an eighth aspect of the invention, there is provided a software product recorded on machine readable data storage media, wherein the software product is executable on computing hardware for implementing a method according to one or more of the third, fourth, fifth, sixth and seventh aspect of the invention.

According to a ninth aspect of the present invention, there is a vehicle power coupling apparatus for a vehicle, wherein the apparatus includes a pickup coil arrangement for receiving an alternating magnetic field applied to the vehicle for generating power to operate the vehicle, characterized in that the apparatus further includes a shield for shielding a region including the pickup coil arrangement from an interior of the vehicle wherein a user of the vehicle is present when the vehicle is in operation; and the shield includes at least one hole therein for providing access to one or more components of the vehicle for working on the one or more components.

The invention is of advantage in that the one or more components of the vehicle can be worked upon without needing to demount the vehicle power coupling apparatus.

Optionally, in the vehicle power coupling apparatus, the at least one hole is included substantially spatially adjacent to a magnetic centre of the pickup coil arrangement.

Optionally, in the vehicle power coupling apparatus, the shield includes a peripheral lip around at least one of an outer periphery of the shield and an inner periphery of the at least one hole.

Optionally, in the vehicle power coupling apparatus, the shield is fabricated from a non-ferromagnetic electrically-conductive material. More optionally, the shield is fabricated from metal sheet and/or metal mesh. More optionally, the metal sheet and/or metal mesh has a thickness in a range of 025 mm to 5 mm. More optionally, the non-ferromagnetic electrically-conductive material includes Aluminium.

Optionally, in the vehicle power coupling apparatus, the at least one hole has an area corresponding to at least 5% of a total area of the shield, more preferably at least 10% of the total area of the shield, and most preferably at least 25% of the total area of the shield.

Optionally, in the vehicle power coupling apparatus, the at least one hole is positioned in the shield such that the at least one hole provides access to an exhaust system of the vehicle.

Optionally, in the vehicle power coupling apparatus, the apparatus is implemented to be retrofitted to the vehicle.

According to a tenth aspect of the invention, there is provided a method of maintaining an exhaust system of a vehicle to which a vehicle power coupling apparatus according to the ninth aspect of the invention is fitted, characterized in that the method includes:
(a) accessing an exhaust system of the vehicle via at least one hole ail shield of the vehicle power coupling apparatus, wherein the shield is positioned to shield magnetically a pickup coil arrangement of the apparatus from an interior of the vehicle; and
(b) working upon the exhaust system of the vehicle via the at least one hole.

According to an eleventh aspect of the present invention, there is provided an electrical vehicle power coupling apparatus for receiving an alternating magnetic field and converting the alternating magnetic field into electrical power for recharging a vehicle and/or for providing motive power to the vehicle, characterized in that
the apparatus includes at least one pickup coil for receiving the alternating magnetic field;
a shield for shielding a region above the shield remote from the at least one pickup coil from the alternating magnetic field;
wherein the at least one pickup coil is implemented as a plurality of elongate cable bunches.

The invention is of advantage in that the plurality of bunches enables electrical power to be provided to the vehicle in an efficient, robust and practical manner.

Optionally, in the electrical vehicle power coupling apparatus, the at least one pickup coil includes in a range of 30 to 400 turns, more preferably substantially 120 turns. Optionally, the substantially 120 turns are connected as eight parallel chains of coils, wherein each chain includes fifteen turns. Such a number of turns provides for practical magnitudes of potentials and currents within the cable bunches for providing kW of power to the vehicle when in operation.

Optionally, in the electrical vehicle power coupling apparatus, each turn of the at feast one pickup coq is coupled to a corresponding blocking capacitor in series therewith. Such use of capacitors has advantages of spreading potential drop in a reliable manner between the windings, thereby increasing safety.

Optionally, in the electrical vehicle power coupling apparatus, the at least one pickup coil is operable to exhibit a fundamental resonance in a frequency range of 20 kHz to 200 kHz, more preferably in a range of 50 kHz to 140 kHz.

Optionally, in the electrical vehicle power coupling apparatus, the plurality of cable bunches have elongate axes which are in operation aligned substantially parallel to a direction of travel of the vehicle. Such a disposition of the bunches is of advantage in providing a mechanically robust arrangement for the apparatus mounted onto an underside of the vehicle.

Optionally, in the electrical vehicle power coupling apparatus, the plurality of cable bunches are fabricated from ribbon cable, Litz wire, individually insulated conductors and/or individually insulated metal conductive tapes. Such individually insulated conductors results in a higher Q-factor for the at least one pickup coil when operating in a resonant manner, thereby potentially resulting in more efficient power coupling to the apparatus. The individually insulated conductors address skin-depth effects which become more significant at elevated resonant frequencies in excess of 20 kHz.

Optionally, in the electrical vehicle power coupling apparatus, the plurality of cable bunches are mounted onto the vehicle via a support arrangement which is elastically deformable for enabling the bunches to withstand impact forces applied thereonto. The support arrangement enables the cable bunches to withstand small impacts and shocks without sustaining damage.

Optionally, in the electrical vehicle power coupling apparatus, the plurality of cable bunches are elongate and disposed so that their height is greater above a road surface supporting the vehicle towards a front portion of the vehicle relative to their height above the road surface supporting the vehicle towards a rear portion of the vehicle. In other words, the elongate bunches are upwardly angled towards a front of the vehicle so that impact of one or more of the bunches onto an object, for example roadway debris, has a tendency to force the one or more bunches in an upward direction, wherein movement of the one or more bunches is accommodated by the support arrangement. More optionally, in the electrical vehicle power coupling apparatus, elongate axes of the cable bunches are disposed at an angle in a range of 0° to 5° relative to a surface supporting the vehicle when in operation.

Optionally, in the electrical vehicle power coupling apparatus, the plurality of cable bunches are mounted to the vehicle via a support arrangement which is actuated to vary a height of the cable bunches. For example, when providing motive power to propel the vehicle up a steep hill, a need for increased power transfer is often required in combination with the vehicle tending to stow down; this results in a risk of impact damage to an underside of the vehicle being reduced, such that the one or more pickup coils can be lower in height to allow for an increased power coupling. Thus, more optionally, in the electrical vehicle power coupling apparatus, the support arrangement is operable to adjust a height of the cable bunches relative to a surface supporting the vehicle in operation depending upon a speed of travel of the vehicle.

More optionally, the electrical vehicle power coupling apparatus further includes a sensor arrangement for detecting roadway debris and generating a corresponding sensor signal indicative of the roadway debris, and the actuator arrangement is operable to retract one or more of the bunches in an event that roadway debris are detected by the sensor arrangement.

Optionally, the electrical vehicle power coupling apparatus is implemented to be retrofitted to vehicles for converting them for electrical propulsion via wireless magnetic-field power transfer, for example resonant wireless magnetic-field power transfer.

Optionally, in the electrical vehicle power coupling apparatus, the cable bunches are mutually identical. Such mutual similarity is of benefit because fewer different parts need to be manufactured for constructing the apparatus, thereby benefitting from economies of scale in manufacture.

Optionally, in the electrical vehicle power coupling apparatus, the cable bunches are substantially planar and mounted onto the vehicle such that their planes are substantially parallel to a surface supporting the vehicle when in operation. Such a planar construction of the one or more bunches reduces a height required to accommodate the apparatus and thereby renders it easier to accommodate on an underside of the vehicle.

Optionally, in the electrical vehicle power coupling apparatus, the bunches are at least partially encapsulated in a flexible polymeric material, for example polyurethane encapsulating polymer material. Polyurethane material is relatively chemically inert, waterproof, and capable of withstanding millions of flexural motions without suffering work-hardening effects. Moreover, the polyurethane material is contemporarily relatively inexpensive.

Optionally, in the electrical vehicle power coupling apparatus, one or more capacitors associated with the plurality of cable bunches are mounted within a capacitor block mounted onto the vehicle.

Optionally, in the electrical vehicle power coupling apparatus, the plurality of cable bunches are mutually coupled together via disconnectable connectors for enabling individual cable bunches to be replaced when damaged.

Optionally, in the electrical vehicle power coupling apparatus, the shield is fabricated from at least one of: Aluminium, Aluminium Copper alloy, Magnesium alloy, Titanium, Titanium alloy.

Optionally, in the electrical vehicle power coupling apparatus, the shield is implemented as a substantially planar component with a downwardly orientated peripheral lip when mounted upon the vehicle.

Optionally, in the electrical vehicle power coupling apparatus, the shield is fabricated from a sheet metallic material having a thickness in a range of 0.25 mm to 5 mm. Optionally, the shield is included as a part of a composite structure. Optionally the shield includes perforated holes therethrough for enable the composite material to bond more reliably to the shield.

Optionally, in the electrical vehicle power coupling apparatus, the apparatus is implemented as an integral replaceable unit.

According to a twelfth aspect of the invention, there is provided a method of operating an electrical vehicle power coupling apparatus pursuant to the eleventh aspect of the invention, characterized in that the method includes:
(a) using a sensor arrangement to detect one or more debris present on a roadway which are approaching the vehicle when it travels along the roadway and generating a corresponding sensor signal; and
(b) retracting one or more cable bunches of the apparatus in an event that the sensor signal indicatives one or more debris approaching the apparatus for avoiding impact damage of the one or more debris onto the cable bunches.

According to a thirteenth aspect of the present invention, there is provided a vehicle power coupling apparatus for a vehicle, characterized in that the apparatus includes a pickup coil arrangement for receiving inductively coupled power, wherein the pickup arrangement is supported by a plurality of pivotally-attached members to the vehicle, such that the pickup coil arrangement is operable to swing backwards on its plurality of pivotally-attached members in response to the pickup coil arrangement being affected by a presence of unevenness and/or debris present upon and/or at an upper surface of a roadway along which the vehicle is operable to travel.

The invention is of advantage in that the coupling apparatus is capable of providing a simple, reliable and robust inductive power transfer for propelling the vehicle and/or for recharging an energy storage device of the vehicle.

Optionally, in the vehicle power coupling apparatus, the pickup coil arrangement is mounted via a supporting frame to the plurality of pivotally-attached members, wherein the supporting frame is operable to swing via the members such that a principal plane of the supporting frame remains substantially parallel to the upper surface of the roadway.

Optionally, in the vehicle power coupling apparatus, at least one idle wheel or roller is included at a rear end of the supporting frame relative to a forward direction or travel of the vehicle for maintaining a substantially constant separation distance between the pickup coil arrangement and the upper surface of the roadway.

Optionally, in the vehicle power coupling apparatus, at least one idle wheel or roller is included at a front end of the supporting frame relative to a forward direction or travel of the vehicle for maintaining a substantially constant separation distance between the pickup coil arrangement and the upper surface of the roadway.

Optionally, in the vehicle power coupling apparatus, at least one idle wheel or roller is included at a middle portion of the supporting frame relative to a forward direction or travel of the vehicle for maintaining a substantially constant separation distance between the pickup coil arrangement and the upper surface of the roadway.

Optionally, in the vehicle power coupling apparatus, the supporting frame includes at least one hole in a substantially central region thereof. More optionally, in the vehicle power coupling apparatus, the shield includes at least one corresponding hole in a substantially central region thereof to coincide substantially with the at least one hole in the supporting frame.

Optionally, in the vehicle power coupling apparatus, the supporting frame includes at least one hole in a substantially central region thereof, and the shield includes at least one corresponding hole in a substantially central region thereof.

Optionally, in the vehicle power coupling apparatus, the pickup coil arrangement includes a plurality of bundles of windings which are disconnectable from the supporting frame for purposes of maintenance or replacement.

Optionally, in the vehicle power coupling apparatus, the shield is provided with at least one outer peripheral lip and/or at least one inner peripheral lip.

Optionally, in the vehicle power coupling apparatus, the supporting frame is provided with a dampening arrangement to reduce a tendency of the support frame to oscillate mechanically when subject to air turbulence in operation underneath the vehicle.

Optionally, in the vehicle power coupling apparatus, the supporting frame is provided with an actuator arrangement for raising the support frame when the vehicle is to be driven in a reverse direction.

According to a fourteenth aspect of the invention, there is provided an electric vehicle including an electric drive train for propelling the vehicle, characterized in that the vehicle includes a vehicle power coupling apparatus pursuant to the thirteenth aspect of the invention for providing power for the electric drive train.

According to a fifteenth aspect of the invention, there is provided a method of supporting a pickup coil arrangement of a vehicle power coupling apparatus for a vehicle, characterized in that the method includes:

(a) supporting the pickup coil arrangement for receiving inductively coupled power by a plurality of pivotally-attached members to the vehicle; and
(b) arranging for the pickup coil arrangement to be operable to swing backwards on its plurality of pivotally-attached members in response to the pickup coil arrangement being affected by a presence of unevenness and/or debris present upon and/or at an upper surface of a roadway along which the vehicle is operable to travel.

According to a sixteenth aspect of the present invention, there is provided an electrical roadway apparatus for providing inductively coupled power to one or more vehicles equipped to receive the power, characterized in that the apparatus includes one or more drive coil arrangements disposed along a roadway which are excitable to generate magnetic fields for being inductively received at the one or more vehicles for coupling the power thereto, and the apparatus includes one or more safety elements (V2, M2, $V_T$, Q) for monitoring operation of the one or more drive coil arrangements and/or the one or more vehicles end for hindering excitation of the one or more drive coil arrangements in an event of a fault condition or an unsafe condition being detected.

The invention is of advantage in that the one or more safety elements are operable to increase operating safety of the roadway.

Optionally, in the electrical roadway apparatus, the one or more safety elements include a measuring arrangement (V2, M2) for measuring a leakage current through insulation of cables employed to implement the one or more drive coil arrangements when subject to a test potential difference applied across the insulation.

Optionally, in the electrical roadway apparatus, the one or more safety elements include a measuring arrangement for measuring Q-factors of the one or more drive coil arrangements for detecting an occurrence of a fault condition or an unsafe condition and for hindering excitation of the one or more drive coil arrangements in an event of a fault condition or an unsafe condition being detected. More optionally, the one or more safety elements are operable to monitor changes in Q-factors of the one or more drive coil arrangements and to detect an occurrence of a fault condition or an unsafe condition when the changes in Q-factors are less than a threshold Q-factor. More optionally, the one or more safety elements are operable to monitor rates of changes in Q-factors of the one or more drive coil arrangements and to detect an occurrence of a fault condition or an unsafe condition when the rates of changes in Q-factors exceed a threshold rate of change of Q-factor.

Optionally, in the electrical roadway apparatus, the one or more safety elements include an arrangement for hindering excitation of the one or more drive coil arrangements in an event that the one or more vehicles are detected to be travelling along the roadway at a speed which is less than an activation speed ($V_T$). Optionally, the activation speed ($V_T$) is in a range of 10 km/h to 80 km/h, more preferably in a range of 20 km/h to 50 km/h. Optionally, the apparatus is operable to change the activation speed ($V_T$) dynamically as a function of weather conditions pertaining to the roadway for example reducing the activation speed in snow conditions when vehicles travel more slowly and an increased requirement for vehicle cabin heating arises.

Optionally, in the electrical roadway apparatus, the one or more drive coil arrangements are excited by signals conveyed via one of more relay switching units coupled to an output bus provided with one or more excitation signals from an excitation signal source which is common to a plurality of the one or more relay switching units. More optionally, the one or more relay switching units are selectively switchable to enable the one or more drive coil arrangements to be individually tested for safety, and also tested collectively as a group of drive coil arrangements for safety.

Optionally, in the electrical roadway apparatus, the one or more drive coil arrangements are coupled individually to associated one or more drive units which are operable to excite their one or more drive coil arrangements and also monitor the one or more drive coil arrangements for safety.

According to a seventeenth aspect of the invention, there is profiled a method of monitoring operating safety of an electrical roadway apparatus pursuant to the sixteenth aspect of the invention for providing inductively coupled power to one or more vehicles equipped to receive the power, characterized in that the method includes:

(a) exciting one or more drive coil arrangements of the apparatus disposed along a roadway to generate magnetic fields for being inductively received at the one or more vehicles for coupling the power thereto;
(b) using one or more safety elements (V2, M2, $V_T$, Q) of the system for monitoring operation of the one or more drive coil arrangements and/or the one or more vehicles; and
(c) hindering excitation of the one or more drive coil arrangements in an event of a fault condition or an unsafe condition being detected.

Optionally, the method includes using a measuring arrangement (V2, M2) of the one or more safety elements for measuring leakage current through insulation of cables employed to implement the one or more drive coil arrangements when subject to a test potential difference applied across the insulation.

Optionally, the method includes utilizing a measuring arrangement of the one or more safety elements for measuring Q-factors of the one or more drive coil arrangements for detecting an occurrence of a fault condition or an unsafe condition and for hindering excitation of the one or more drive coil arrangements in an event of a fault condition or an unsafe condition being detected. More optionally, the method includes operating the one or more safety elements to monitor changes in Q-factors of the one or more drive coil arrangements and to detect an occurrence of a fault condition or an unsafe condition when the Q-factors are less than a threshold Q-factor. More optionally, the method includes operating the one or more safety elements to monitor rates of changes in Q-factors of the one or more drive coil arrangements and to detect an occurrence of a fault condition or an unsafe condition when the rates of changes in Q-factors exceed a threshold rate of change of Q-factor.

Optionally, the method includes utilizing an arrangement of the one or more safety elements for hindering excitation of the one or more drive coil arrangements in an event that the one or more vehicles are detected to be travelling along the roadway at a speed which is less than an activation speed ($V_T$). More optionally, the activation speed ($V_T$) is in a range of 10 km/h to 80 k/h, more preferably in a range of 20 km/h to 50 km/h.

Optionally, the method includes exciting the one or more drive coil arrangements via one of more relay switching units coupled to an output bus provided with one or more excitation signals from an excitation signal source which is common to a plurality of the one or more relay switching units. More optionally, the method includes implementing the one or more relay switching units to be selectively switchable to enable the one or more drive coil arrangements to be individually tested for safety, and also tested collectively as a group of drive coil arrangements for safety.

Optionally, the method includes individually coupling the one or more drive coil arrangements to associated one or more drive units which are operable to excite their one or more drive coil arrangements and also monitor the one or more drive coil arrangements for safety.

According to an eighteenth aspect of the present invention, there is provided an electrical roadway apparatus for providing inductively coupled power to one or more vehicles equipped to receive the power, characterized in that the apparatus includes one or more drive coil arrangements disposed along a roadway which are excitable to generate magnetic fields for being inductively received at the one or more vehicles for coupling the power thereto, and the apparatus includes one or more safety elements including an arrangement for hindering excitation of the one or more drive coil arrangements in an event that the one or more vehicles are detected to be travelling along the roadway at a speed which is less than en activation speed ($V_T$).

Optionally, the electrical roadway apparatus is implemented such that the activation speed ($V_T$) is in a range of 10 km/h to 80 km/h, more preferably in a range of 20 km/h to 50 km/h.

According to a nineteenth aspect of the invention, there is provided a software product recorded on machine-readable data storage media, the software product being executable upon computing hardware for implementing a method according to the eighteenth aspect of the invention.

According to a twentieth aspect of the present invention, there is provided an electrical roadway apparatus for providing in operation inductively coupled power to one or more vehicles upon a roadway, characterized in that the apparatus includes drive unit modules disposed along at least one peripheral edge of the roadway and/or along a central reservation of the roadway, and coil arrangements coupled to the drive unit modules, wherein the drive coil arrangements are implemented as cables disposed in slots formed transversely across at least one lane of the roadway.

The invention is of advantage in that a modularized approach to implementing the drive unit modules and the cables, for example remotely in factory premises, and then installing along the roadway allows for rapid and cost-effective deployment of the apparatus.

Optionally, in the electrical roadway apparatus, the drive unit modules are disposed end-on-end and coupled together to provide for excitation along the roadway.

Optionally, in the electrical roadway apparatus, the cables are disposed in a plurality of loops which are at least partially overtopping for providing a continuous power transfer to the one or more vehicles when travelling along the roadway. More optionally, in the electrical roadway apparatus, plurality of loops are operable to be excited with drive signals from the drive unit modules, wherein the drive signals are in mutually different phases. Yet more optionally, in the electrical roadway apparatus, the phases are implemented as three-phases at substantially 120° phase spacings, or in quadrature with 90° phase spacings.

Optionally, in the electrical roadway apparatus, each cable includes an arrangement of individually-insulated electrical conductors for conducting excitation signals provided from the drive unit modules, wherein the conductors are disposed in a mutually spaced-apart manner within a dielectric electrically insulating material, and the arrangement is included within an overall dielectric insulating pipe along at least a part of its length.

Optionally, in the electrical roadway apparatus, the cables for receiving excitation signals from the drive unit modules are prod spatially concurrently therewith with one or more resistive heating wires for de-icing the roadway and also drying out dielectric material of the cables, the one or more resistive wires being provided with heating power from the drive unit modules.

Optionally, in the electrical roadway apparatus, the slots are outwardly tapered with increasing depth into the roadway and are filed with flexible polymeric plastics material for retaining the cables within the slots.

Optionally, in the electric roadway apparatus, the cables are arranged in loops, and the drive unit modules are operable to excite the loops with differential excitation signals ($-\phi$, $+\phi$) such that a mean potential of each loop remains substantially zero when excited. More optionally, in the electric roadway apparatus, a mid-point along at least one loop formed from the cables is coupled to Earth.

Optionally, in the electric roadway apparatus, the drive unit modules include testing arrangements (V2, M2) for performing insulation integrity testing of their associated cables.

Optionally, in the electric roadway apparatus, the drive unit modules are factory-manufactured and are substantially mutually similar, and include connector arrangements for being coupled together end-on-end along the roadway and for receiving one or more cables forming one or more power coupling loops along at least one lane of the roadway.

According to a twenty first aspect of the invention, there is provided a method of installing an electric roadway apparatus pursuant to the twentieth aspect of the invention, characterized in that the method includes:

(a) forming one or more slots transversely across at least one lane of a roadway;

(b) installing drive unit modules end-on-end along at least one side of the roadway and/or along a central reservation of the roadway;

(c) installing cables within the one or more slots to form one or more loops within the roadway for inductively coupling power in operation to vehicles travelling along the roadway; and (d) coupling the drive unit modules together to form a continuous arrangement along the roadway for exciting the one or more loops in operation.

Optionally, the method includes manufacturing at least one of the drive unit modules and/or the cables in factory premises remote from the roadway and transporting the at least one drive module and/or the cables to the roadway for installation.

Optionally, the method includes cutting the one or more slots using a diamond-tipped cutting wheel which is traversed across at least one lane of the roadway.

Optionally, the method includes forming the one or more slots to have a cross-section which is outwardly tapered with increasing depth into the roadway.

Optionally, the method includes filling the one or more slots with flexible polymeric plastics material to retain the cables in position within the one or more slots.

According to a twenty second aspect of the present invention, there is provided a theft preventing system for an electrical roadway apparatus, the electrical roadway apparatus being operable to provide inductive power coupling therefrom when installed in respect of a roadway to one or more vehicles upon the roadway, the electrical roadway apparatus including one or more drive units for exciting one or more drive coil arrangements disposed in the roadway, characterized in that the theft prevention system includes a sensing arrangement for detecting abrupt changes in one or more electrical characteristics of cables employed to implement the one or more drive coil arrangements disposed in the roadway, and a theft detection and notification arrangement for receiving signals from the sensing arrangement for detecting and notifying an event of theft to a security facility for summoning assistance in respect of the one or more drive coil arrangements for hindering the event of theft.

The invention is of advantage in that the system is capable of providing automated detection of events of theft and summoning of personnel assistance for hindering the events of theft.

Optionally, the theft prevention system is implemented such that the detection and notification arrangement is operable to notify the security facility regarding a spatial location of the cables of the one or more drive coil arrangements whereat the event of theft is detected.

Optionally, the theft prevention system is implemented such that the sensing arrangement is operable to sense at least one of Q-factors and cable resistances of the cables employed to implement the one or more drive coil arrangements disposed in the roadway.

Optionally, the theft prevention system is implemented such that the theft detection and notification arrangement is operable to identify in collaboration with the security facility whether the cables employed to implement the one or more drive coil arrangement have been affected by theft or operational failure.

Optionally, the theft prevention system is implemented such that the theft prevention system is operable to employ low frequency signal interrogation of the cables employed to implement the one or more drive coil arrangement for determining the one or more electrical characteristics of the cables, whereas the one or more drive units are operable to employ high frequency excitation of the drive coil arrangements for inductively coupling power to the one or more vehicles upon the roadway. More optionally, the low frequency signal interrogation is performed at frequencies of less than 10 kHz, and the high frequency excitation is performed at frequencies of ore than 30 kHz.

According to a twenty third aspect of the invention, there is provided a method of employing a theft prevention system for an electrical roadway apparatus, the electrical roadway apparatus being operable to provide inductive power coupling therefrom when installed in respect of a roadway to one or more vehicles upon the roadway, the electrical roadway apparatus including one or more drive units for exciting one or more drive ea arrangements disposed in the roadway, characterized in that the method includes:

(a) using a sensing arrangement of the theft prevention system for detecting abrupt changes in one or more electrical characteristics of cables employed to implement the one or more drive coil arrangements disposed in the roadway; and (b) using a theft detection and notification arrangement for receiving signals from the sensing arrangement for detecting and notifying an event of theft to a security facility for summoning assistance in respect of the one or more drive coil arrangements for hindering the event of theft.

According to a twenty fourth aspect of the invention, there is provided a software product recorded on machine-readable data storage media, the software product being executable upon computing hardware for implementing a method according to the twenty third aspect of the invention.

It will be appreciated that features of the invention are susceptible to being combined in various combinations without departing from the scope of the invention as defined by the appended claims.

DESCRIPTION OF THE DIAGRAMS

Embodiments of the present, invention will now be described, by way of example only, with reference to the following diagrams wherein.

Figure 18:
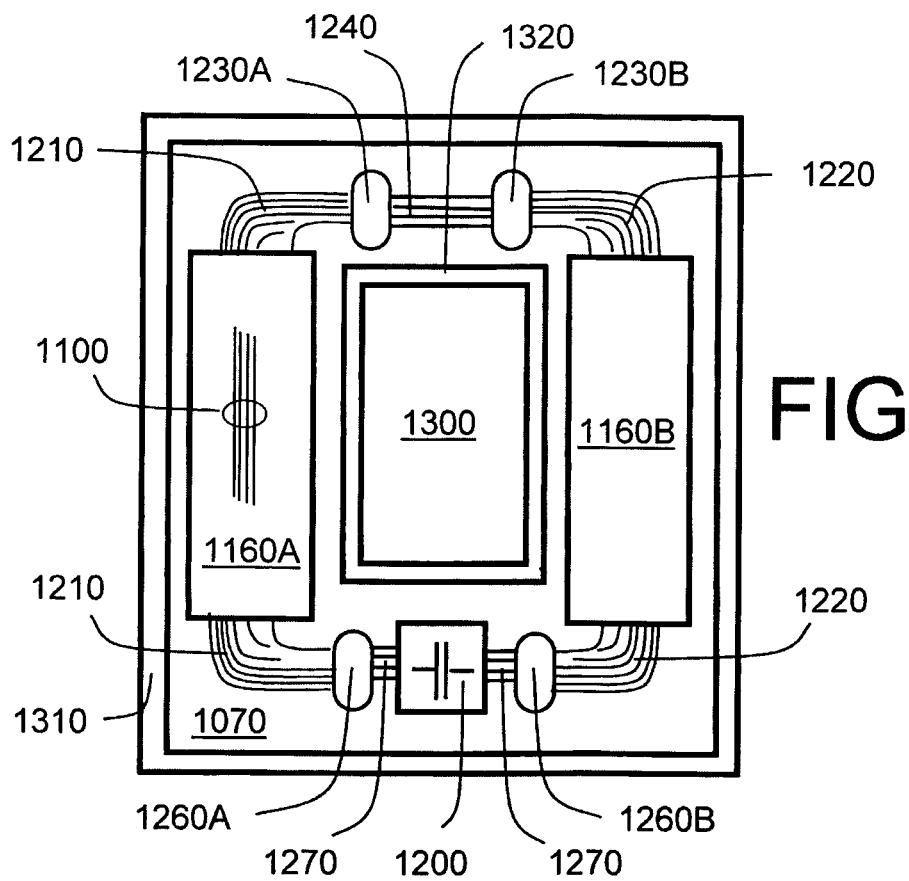
FIG. 18 is a more detailed illustration of the pickup coil arrangement of FIG. 17 together with its associated shield, wherein the shield includes at least one access hole spatially disposed at a centre of the pickup coil arrangement.
Figure 20:
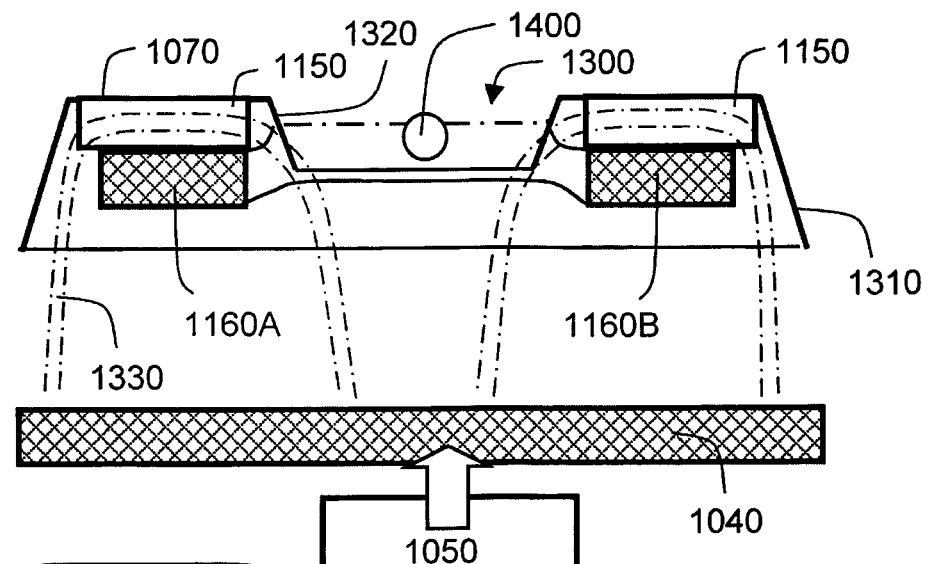
Figure 20:
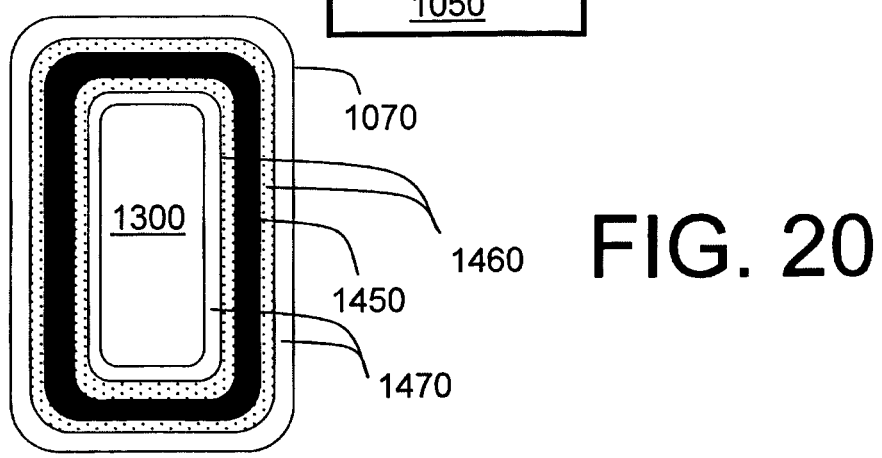
Figure 21:
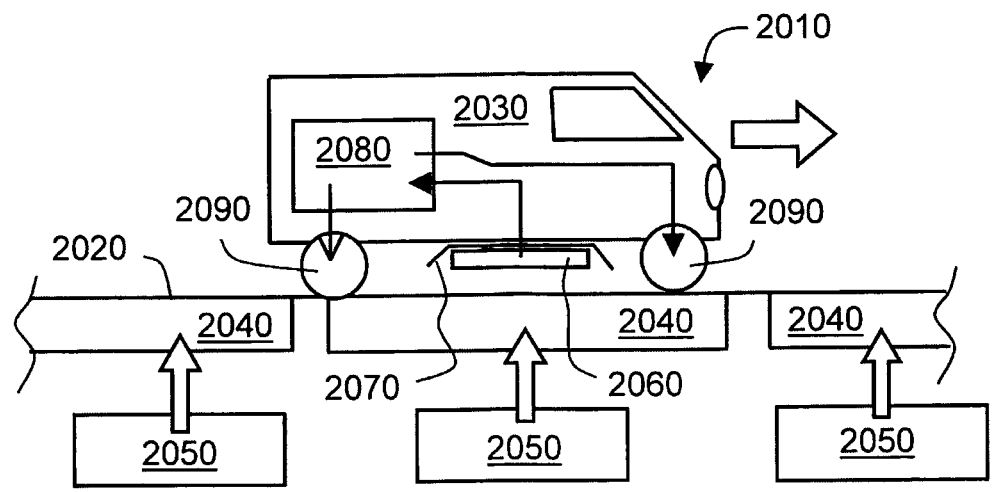
Figure 22:
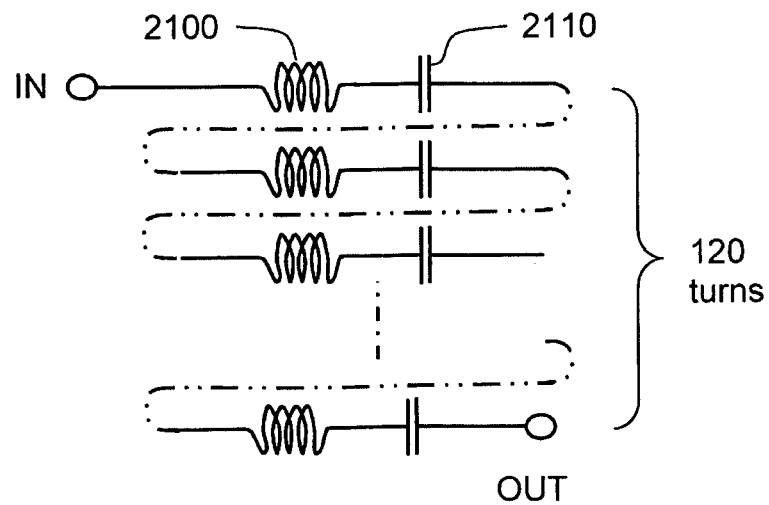
Figure 23:
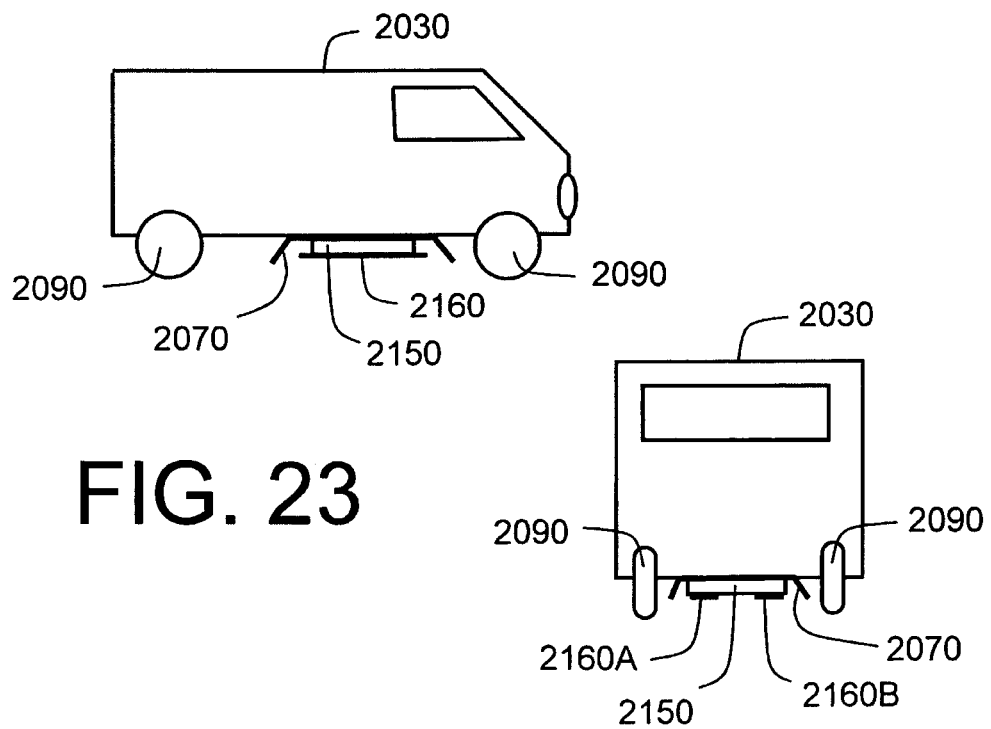
Figure 24:
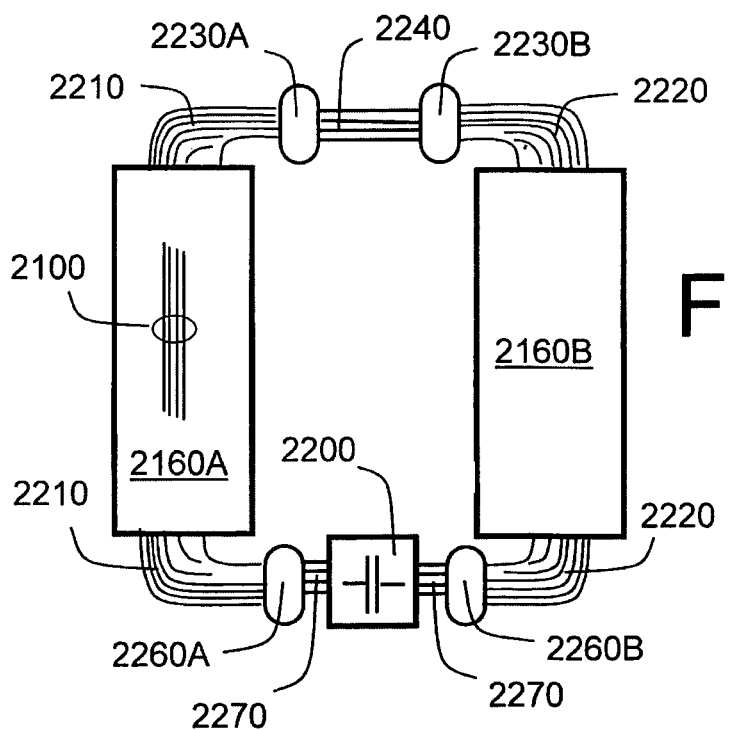
Figure 25:
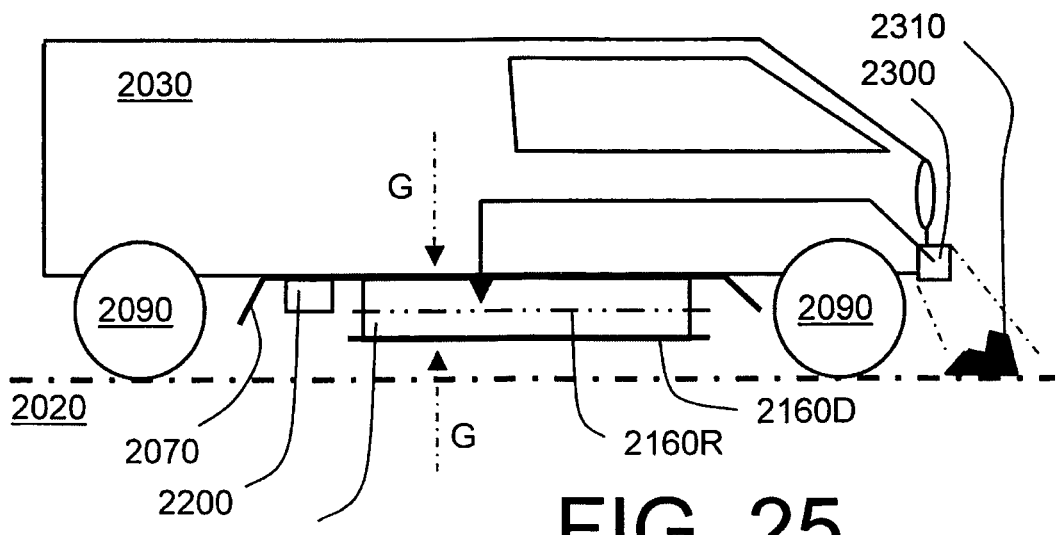
Figure 26:
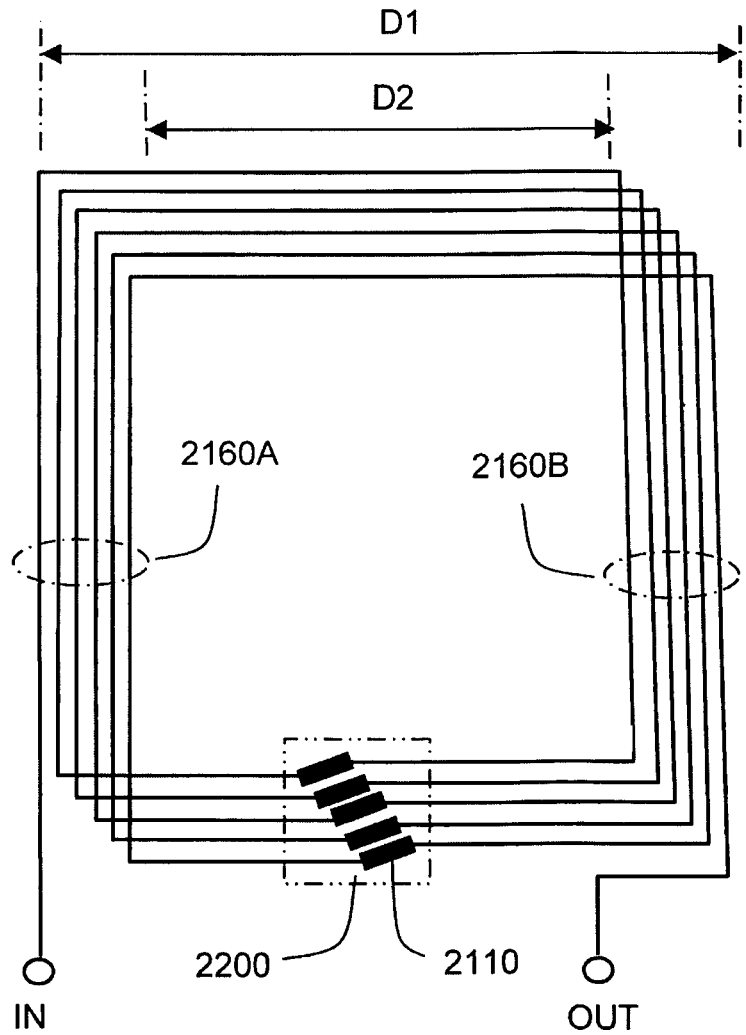
Figure 27:
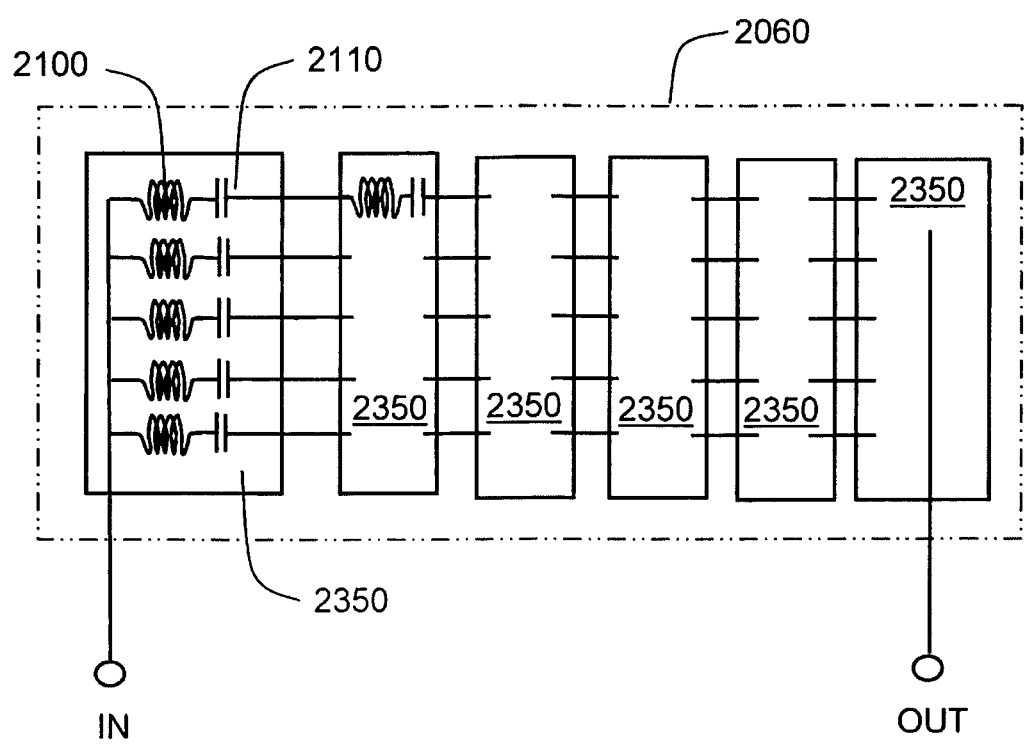
Figure 28:
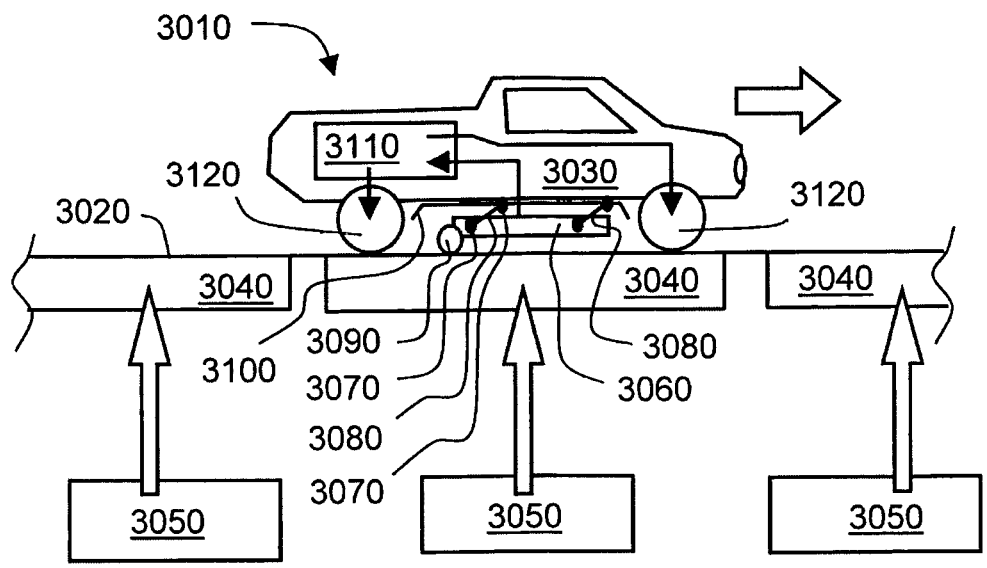
Figure 29:
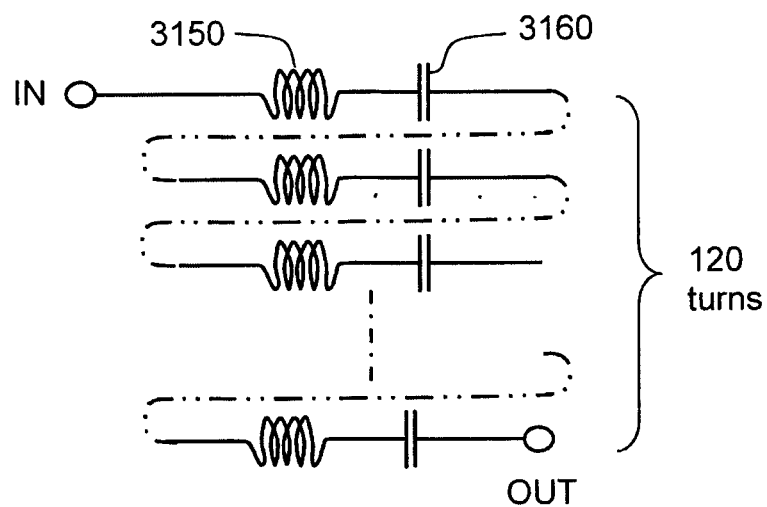
Figure 30:
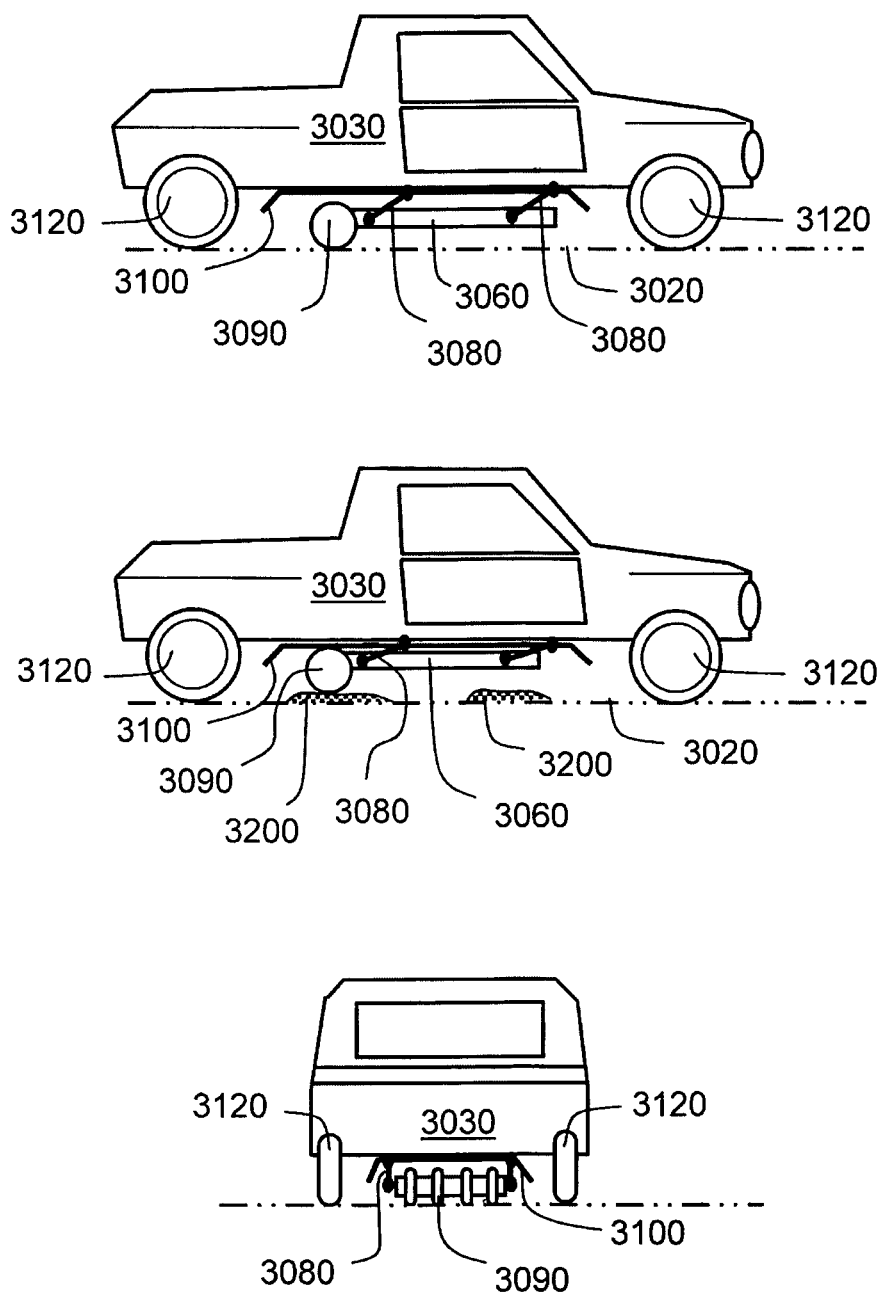
Figure 31:
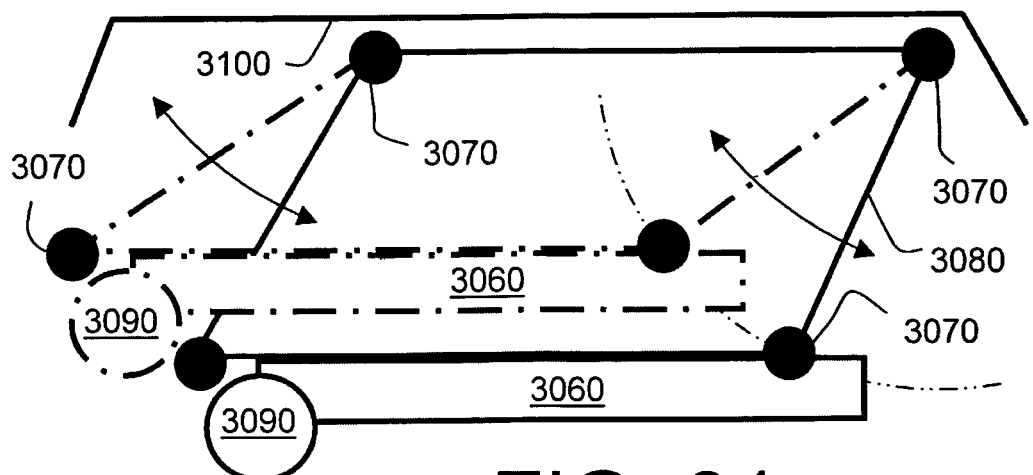
Figure 32:
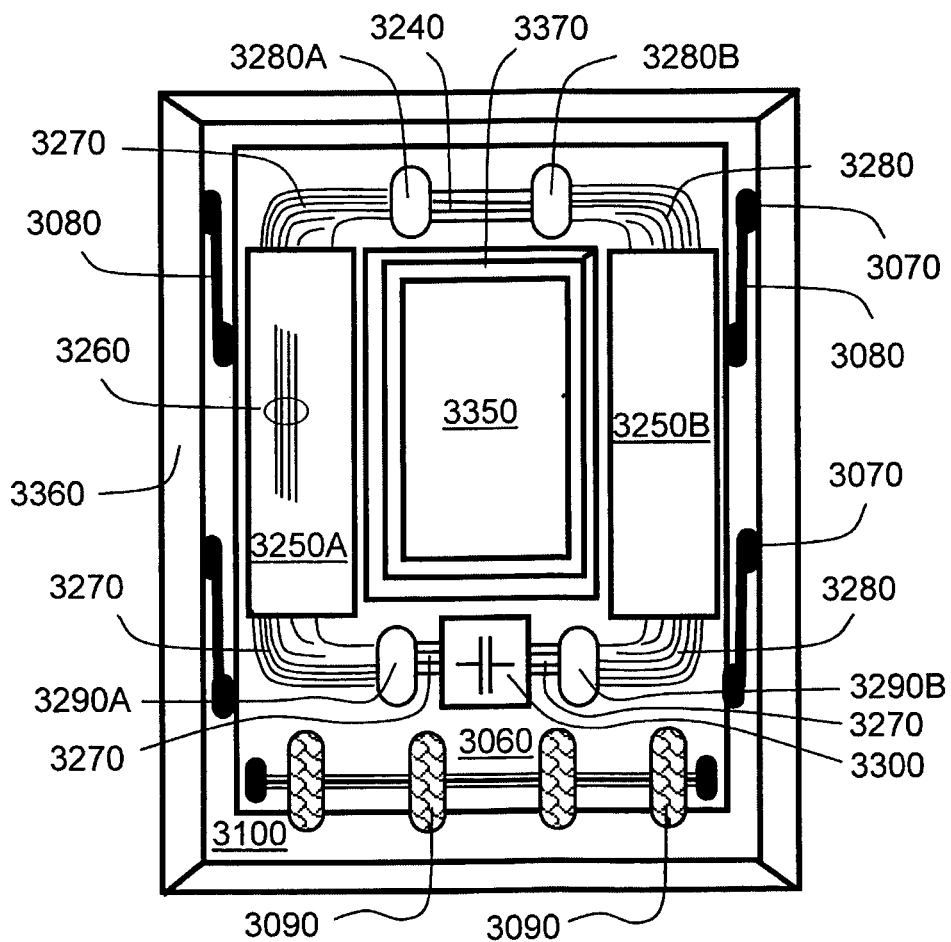
Figure 33:
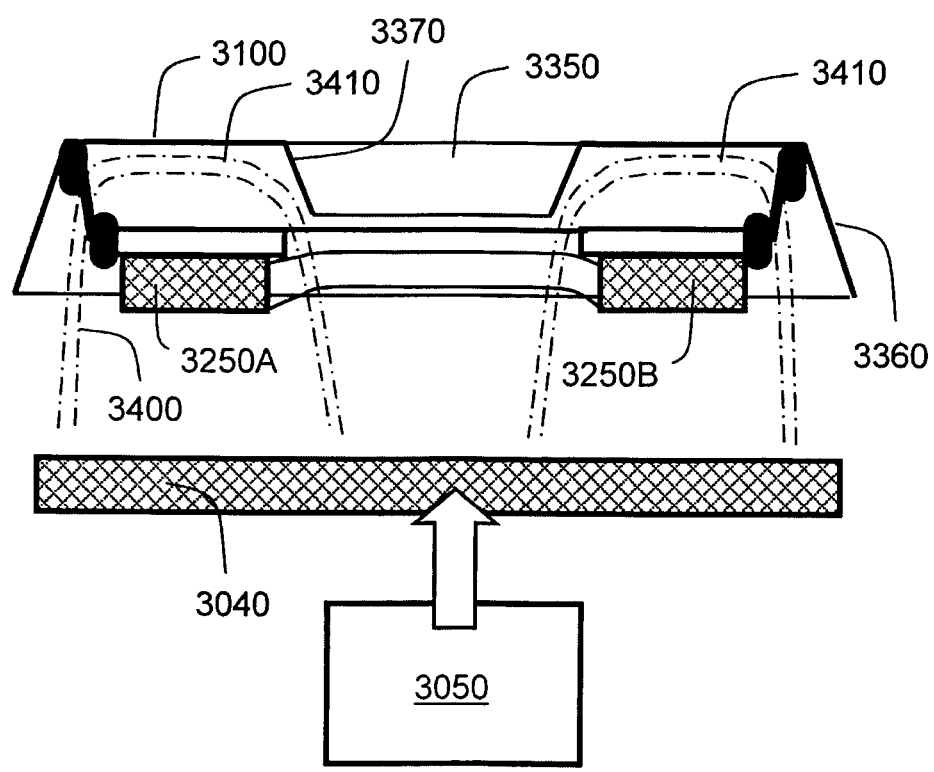
Figure 34:
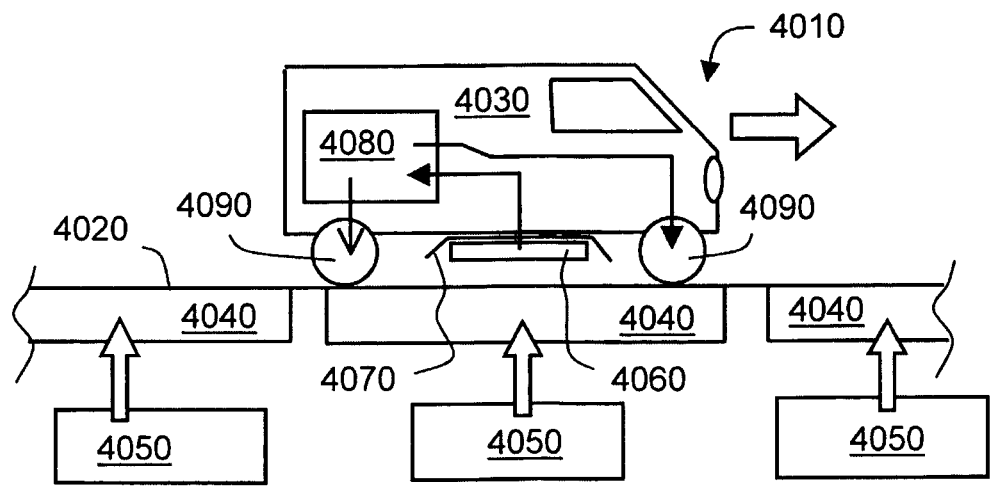
Figure 35:
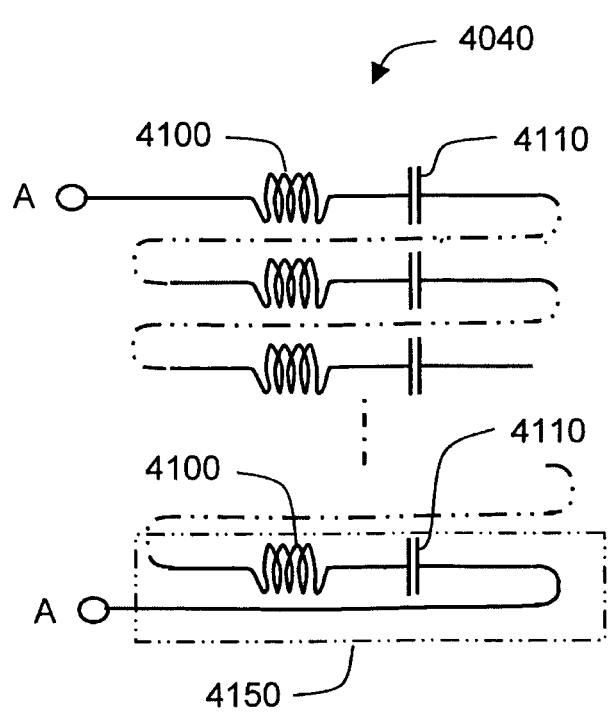
Figure 36:
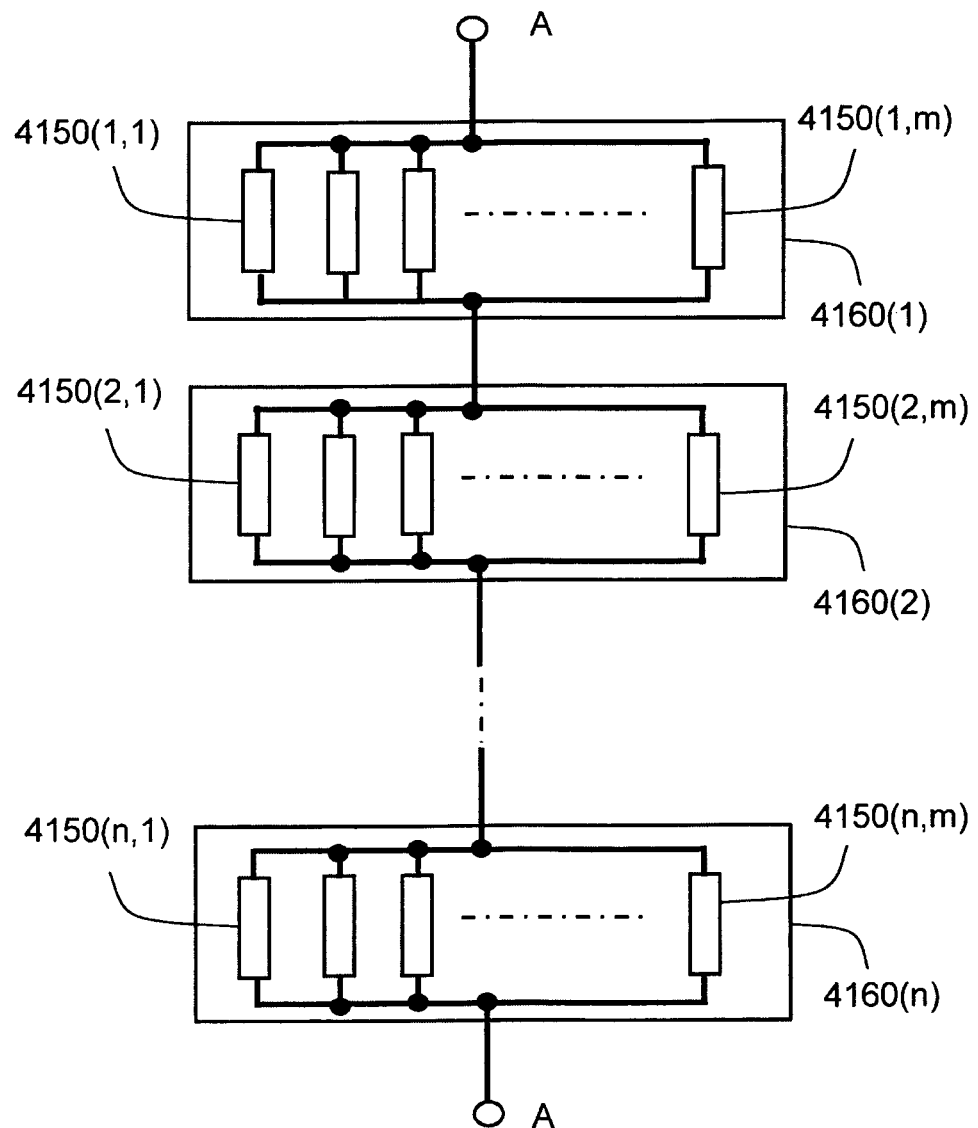
Figure 37:
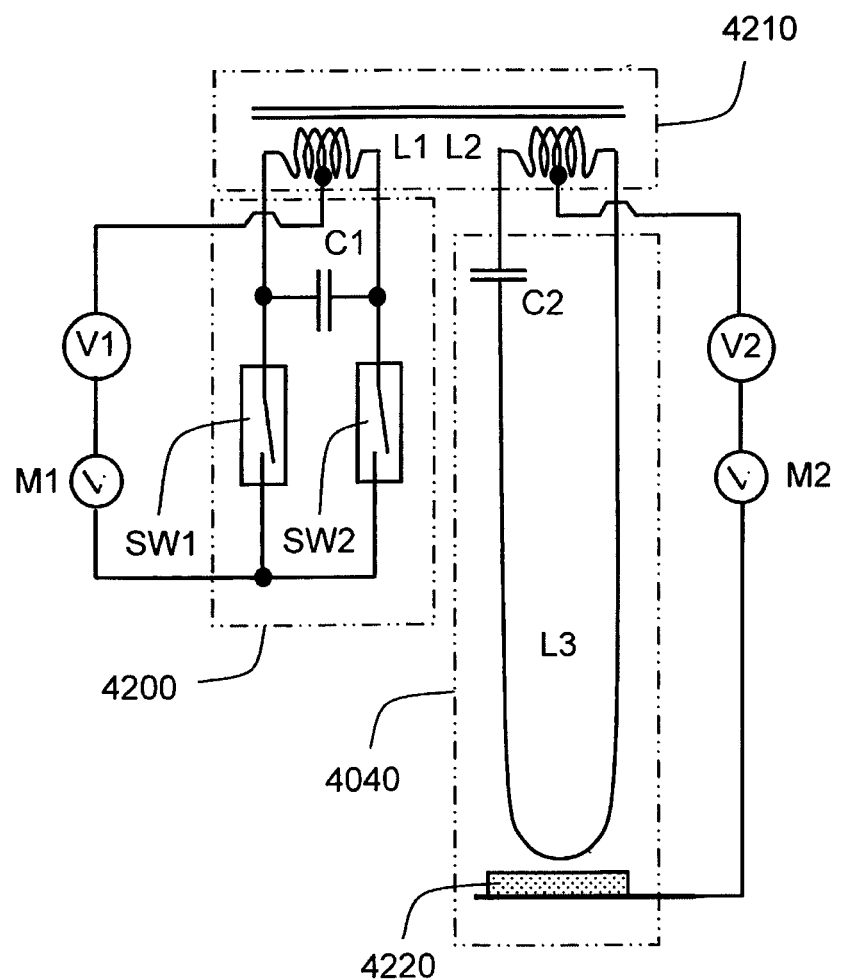
Figure 38:
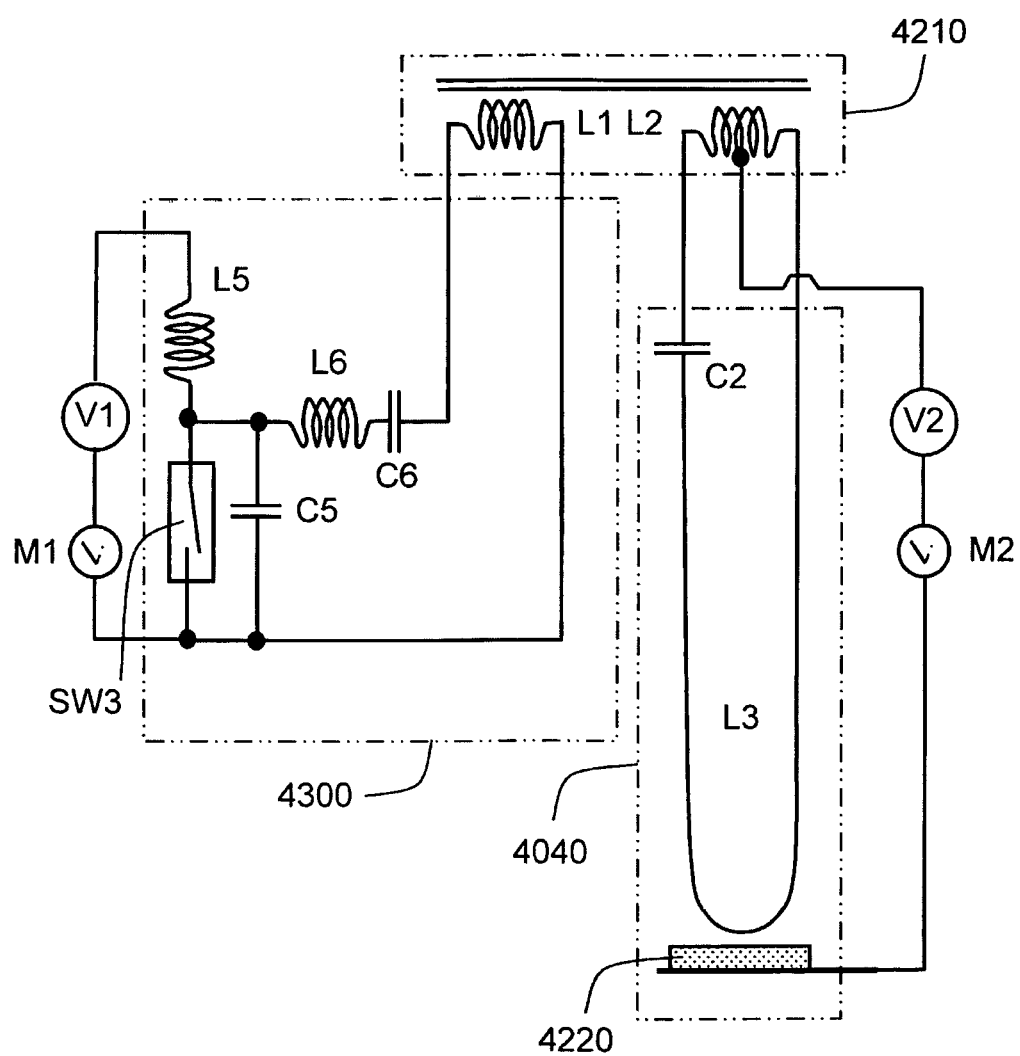
Figure 39:
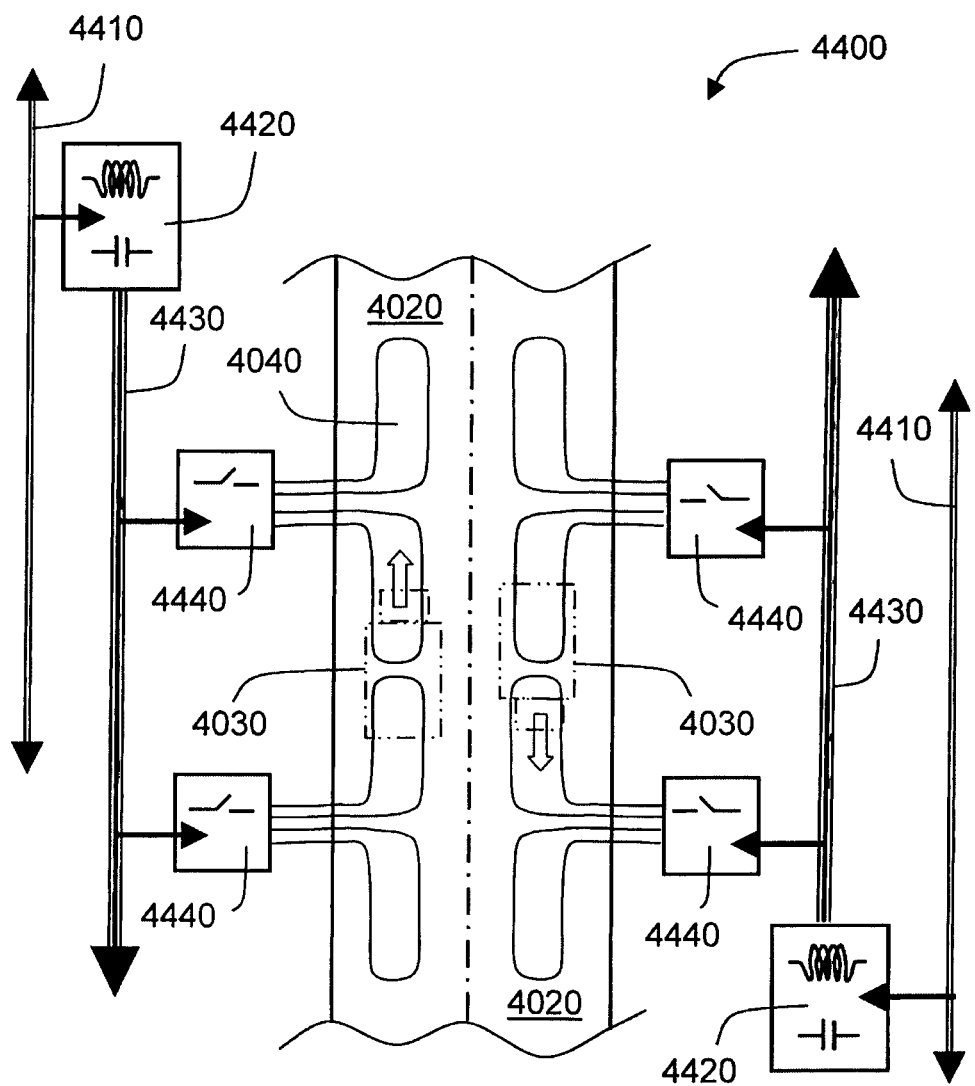
Figure 40:
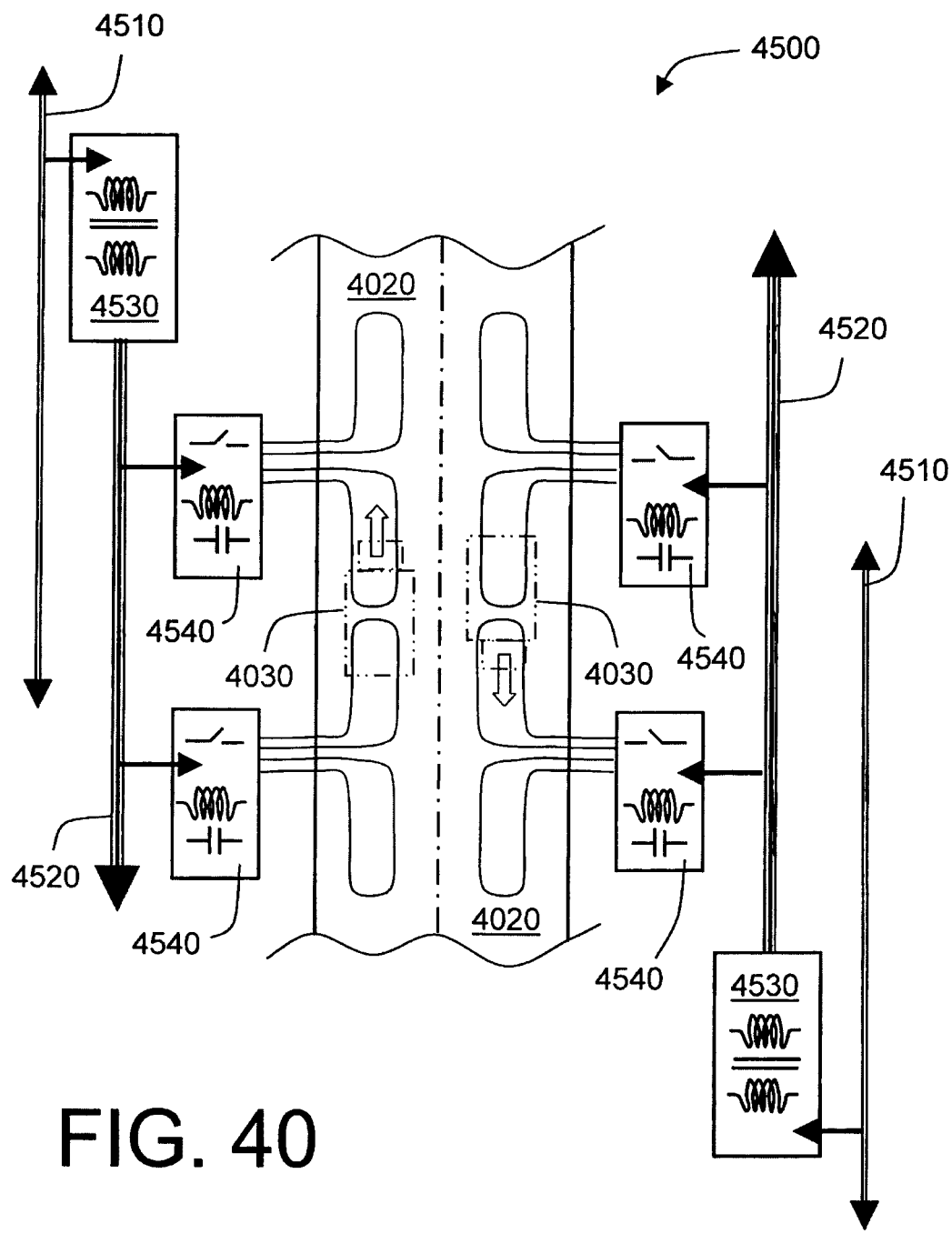
Figure 41A:
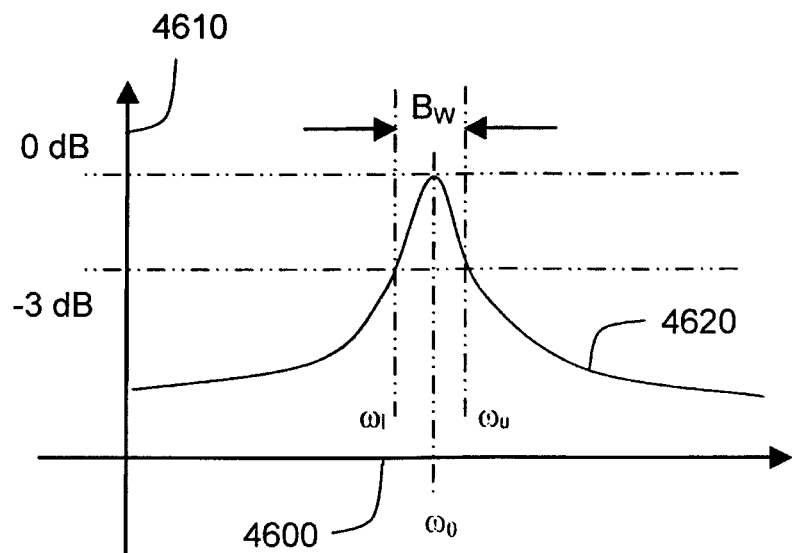
Figure 41B:
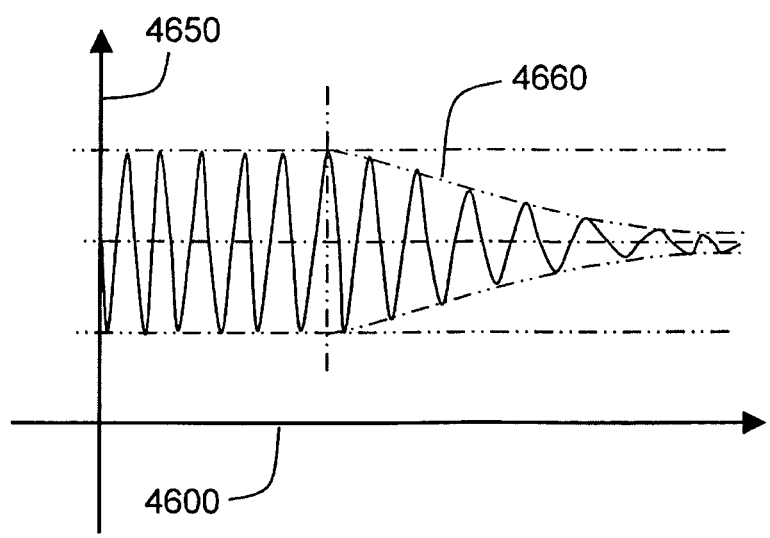
Figure 42A:
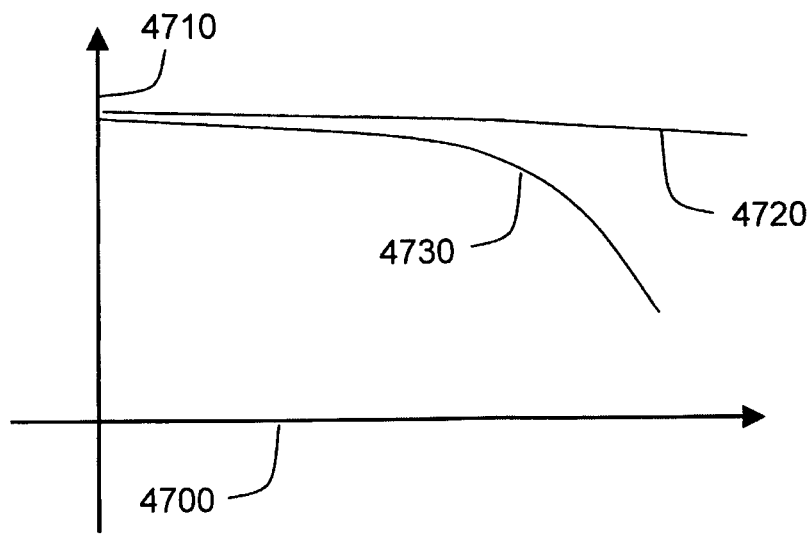
Figure 42B:
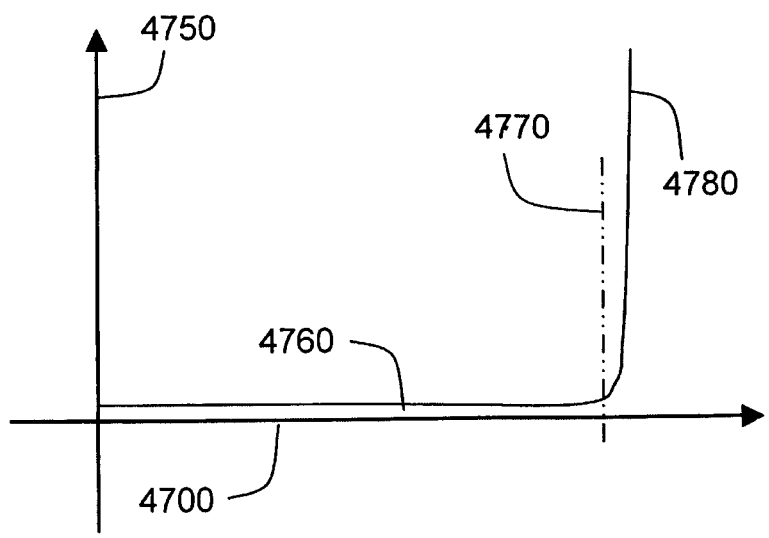
Figure 43A:
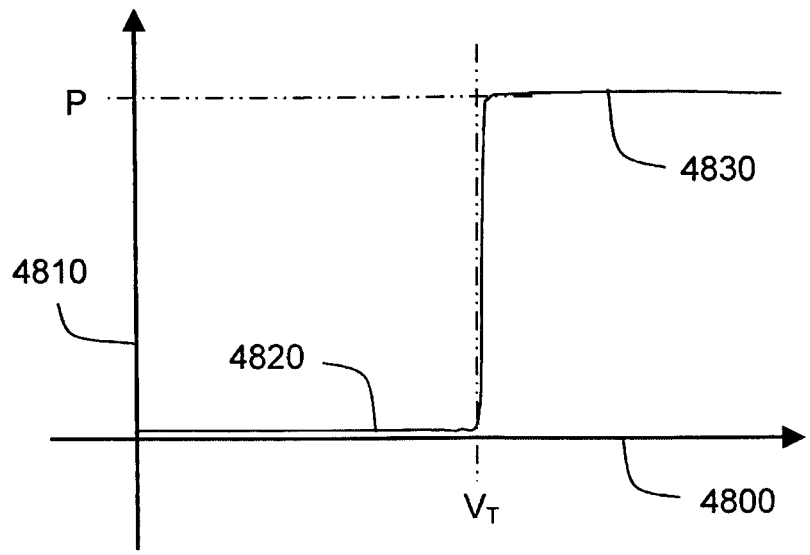
Figure 43B:
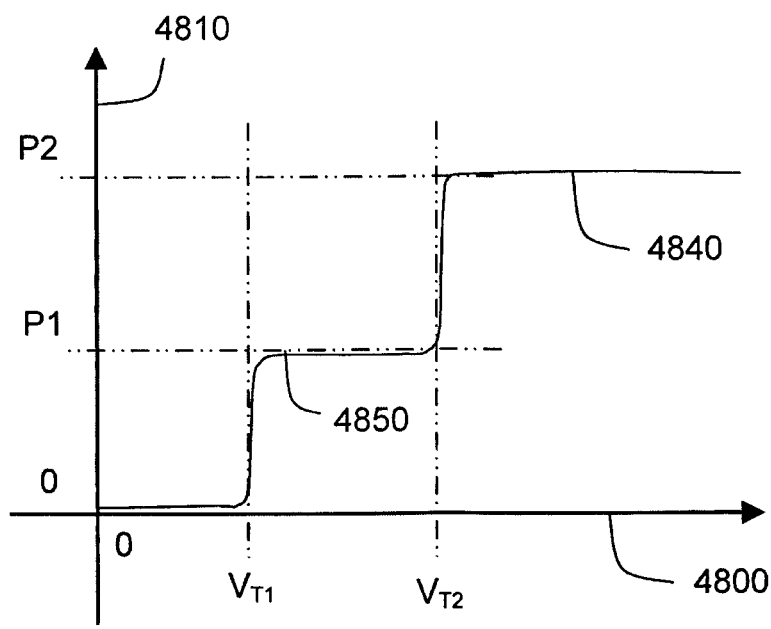
Figure 43C:
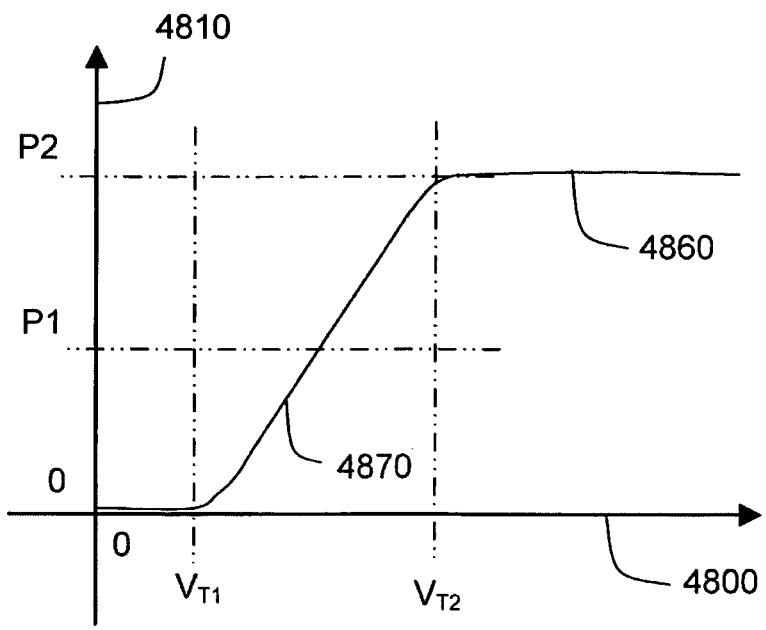
Figure 43D:
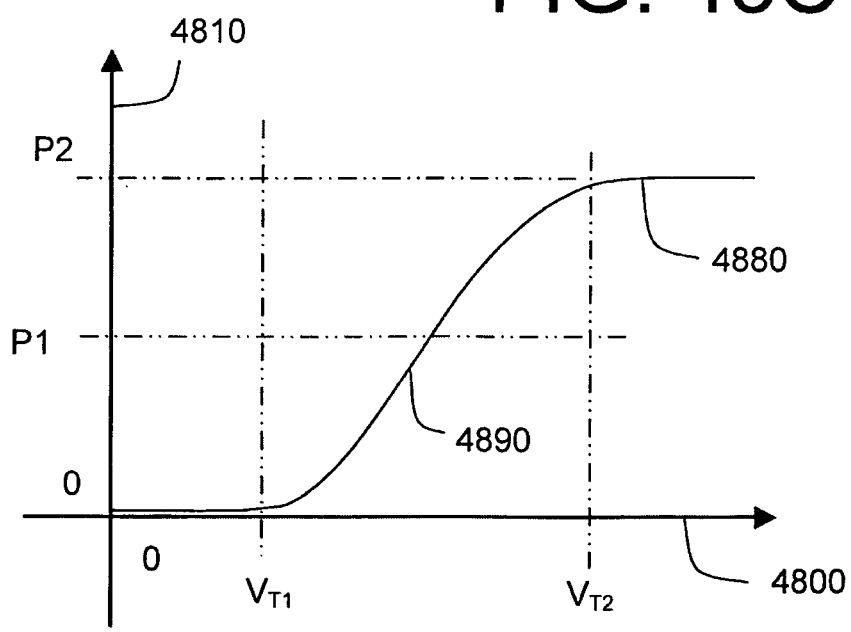
Figure 44A:
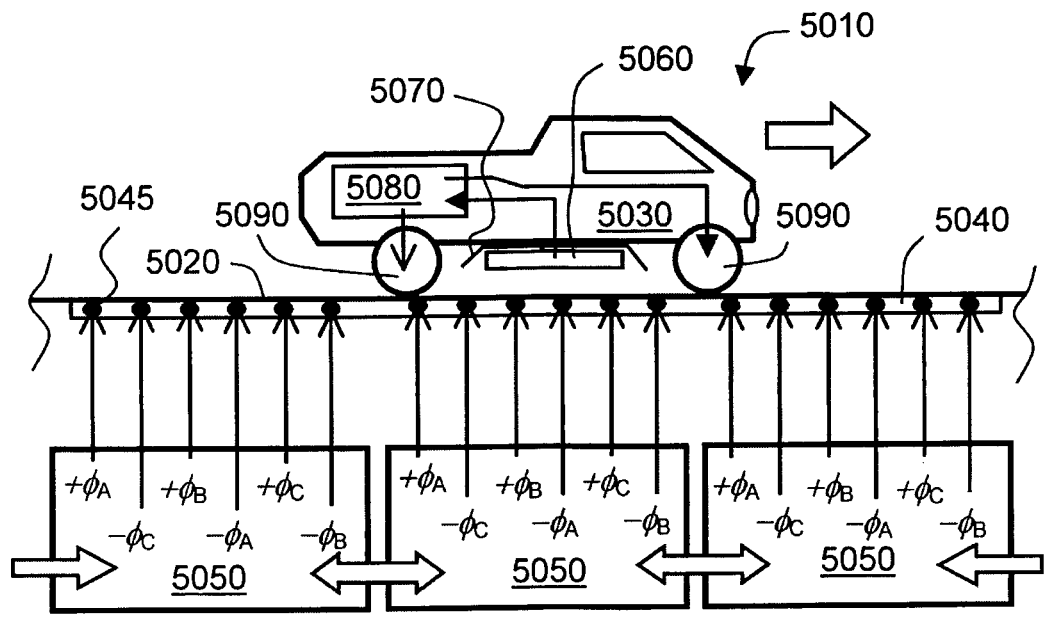
Figure 44B:
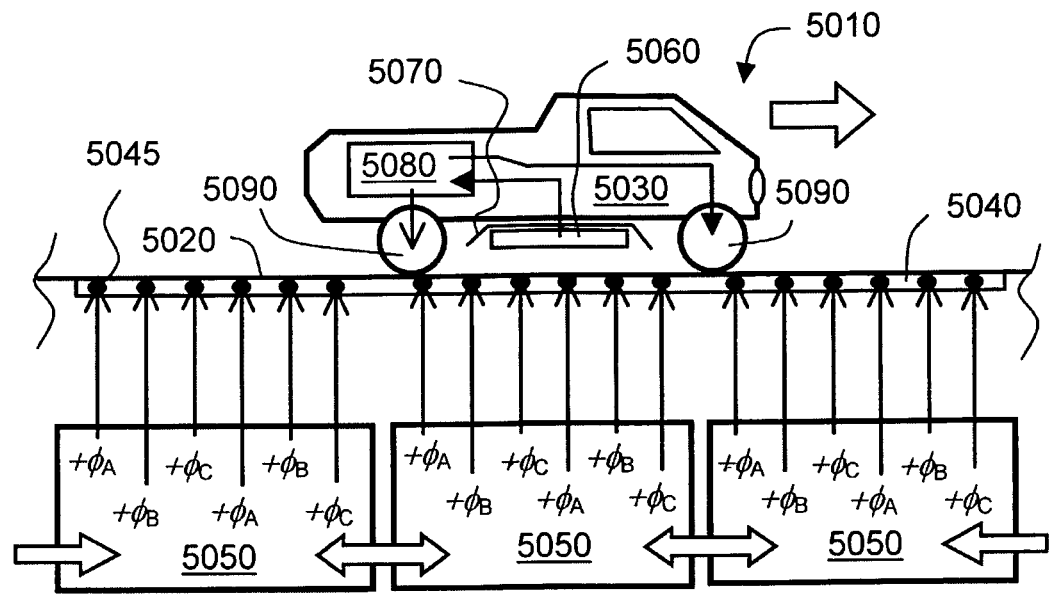
Figure 45A:
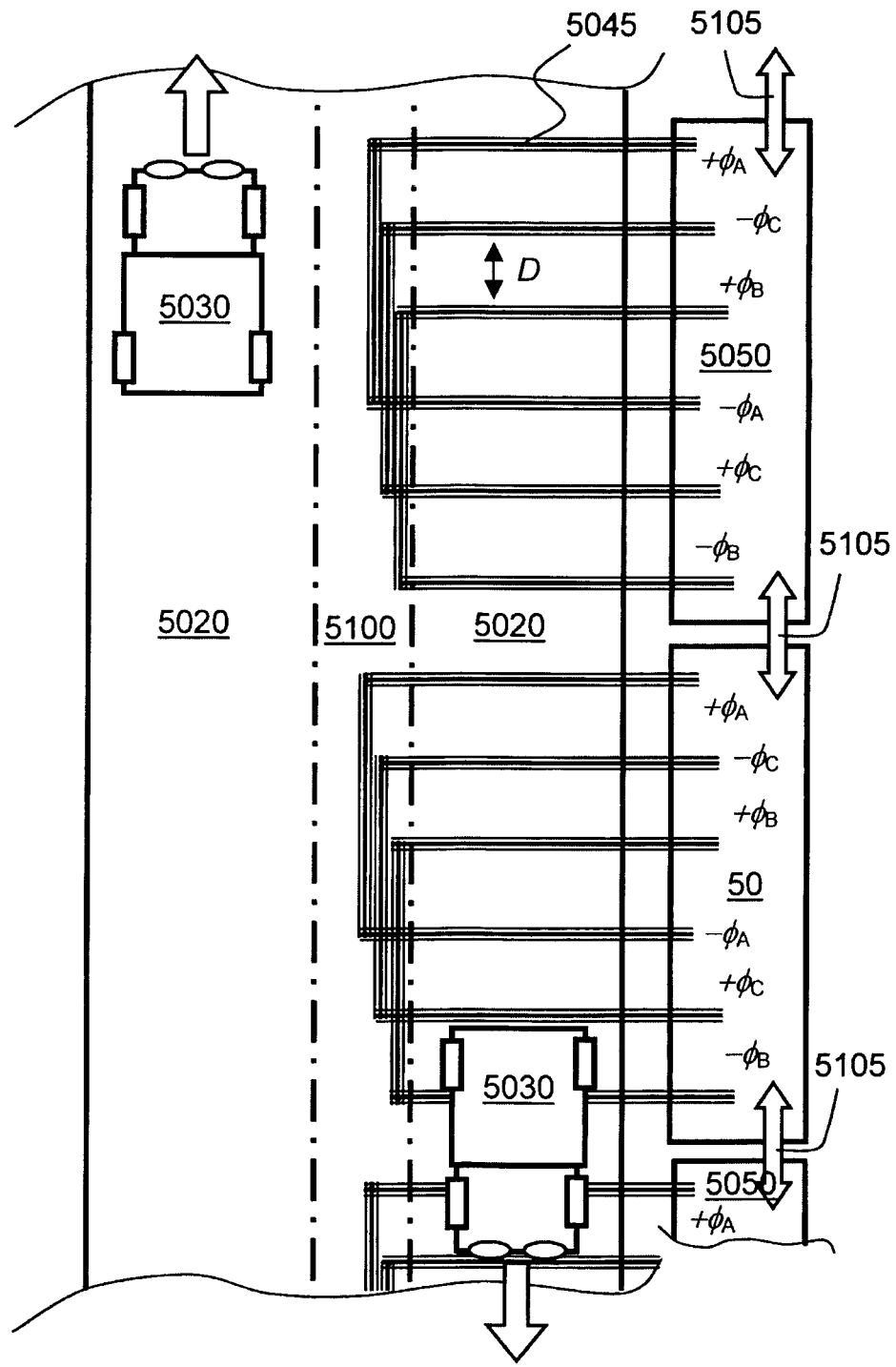
Figure 45B:
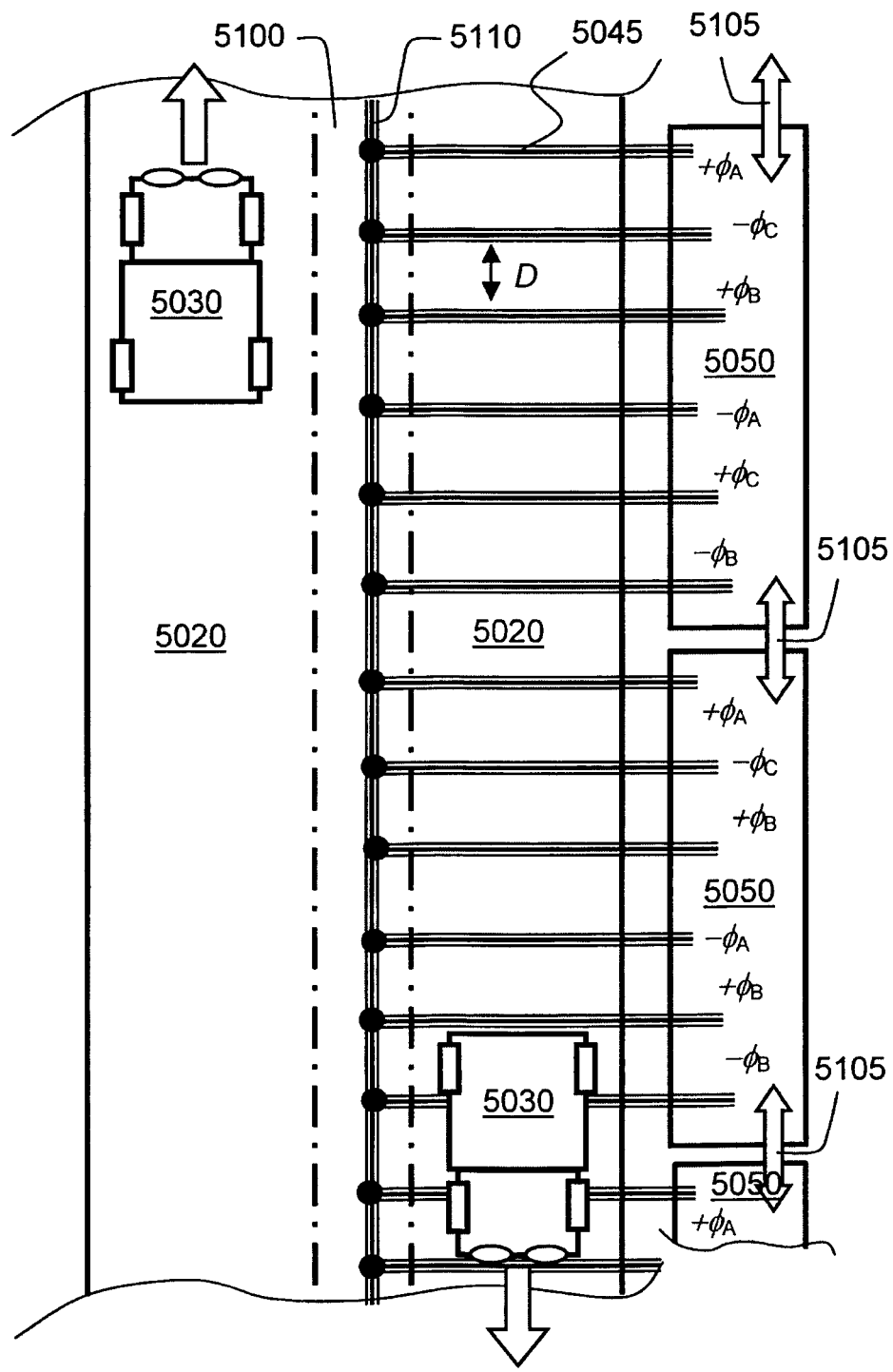
Figure 45C:
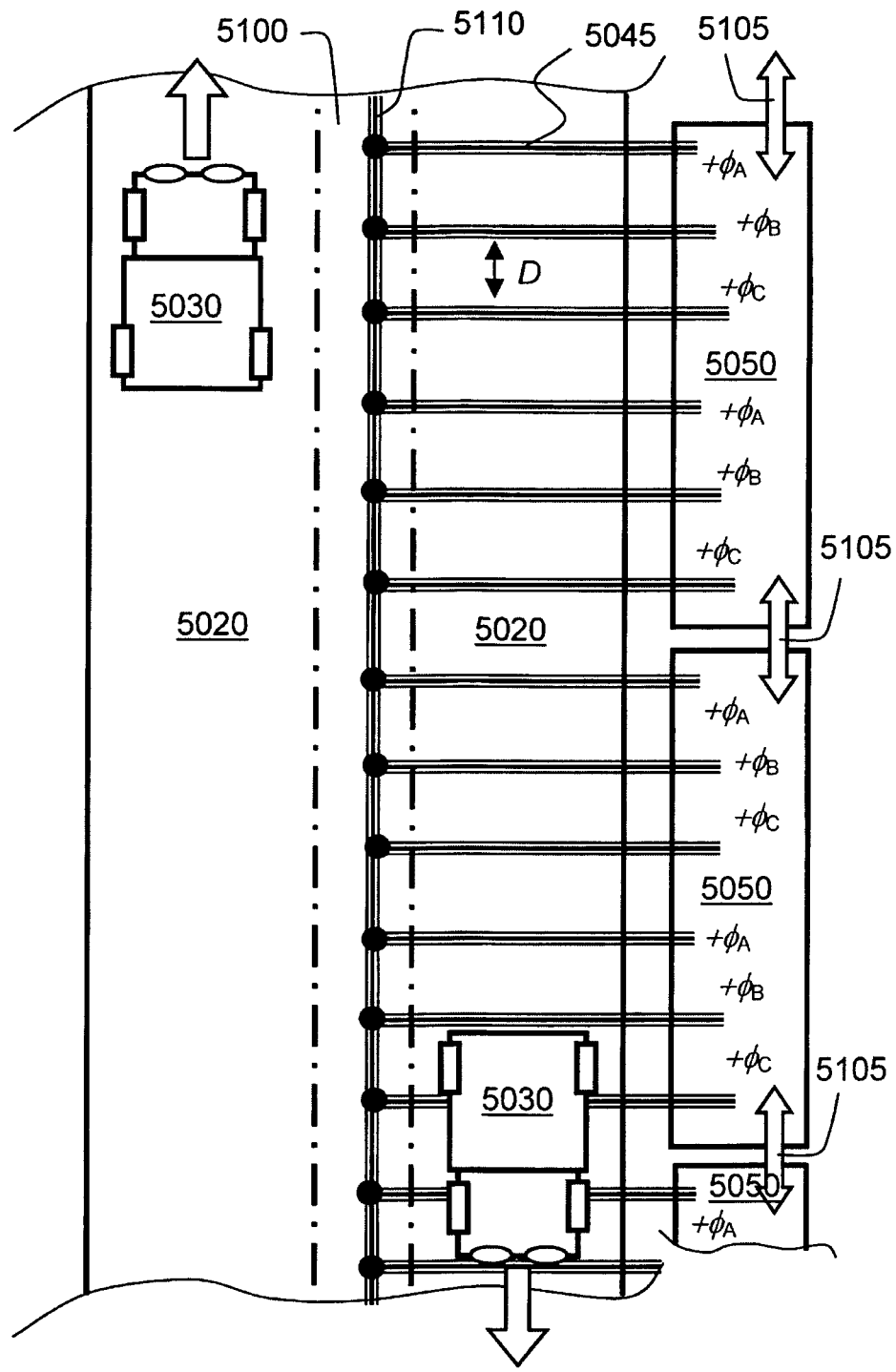
Figure 45D:
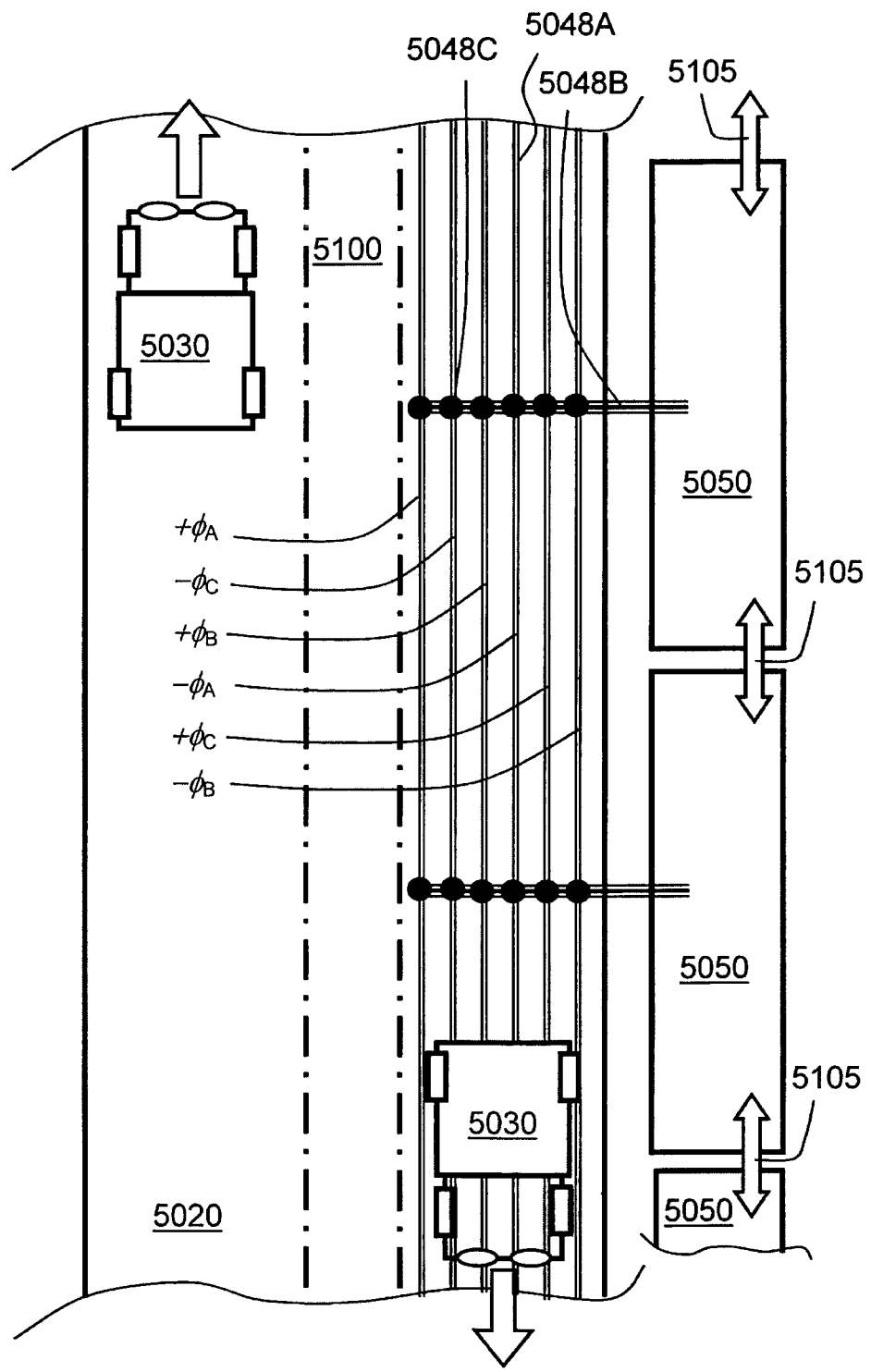
Figure 46A:
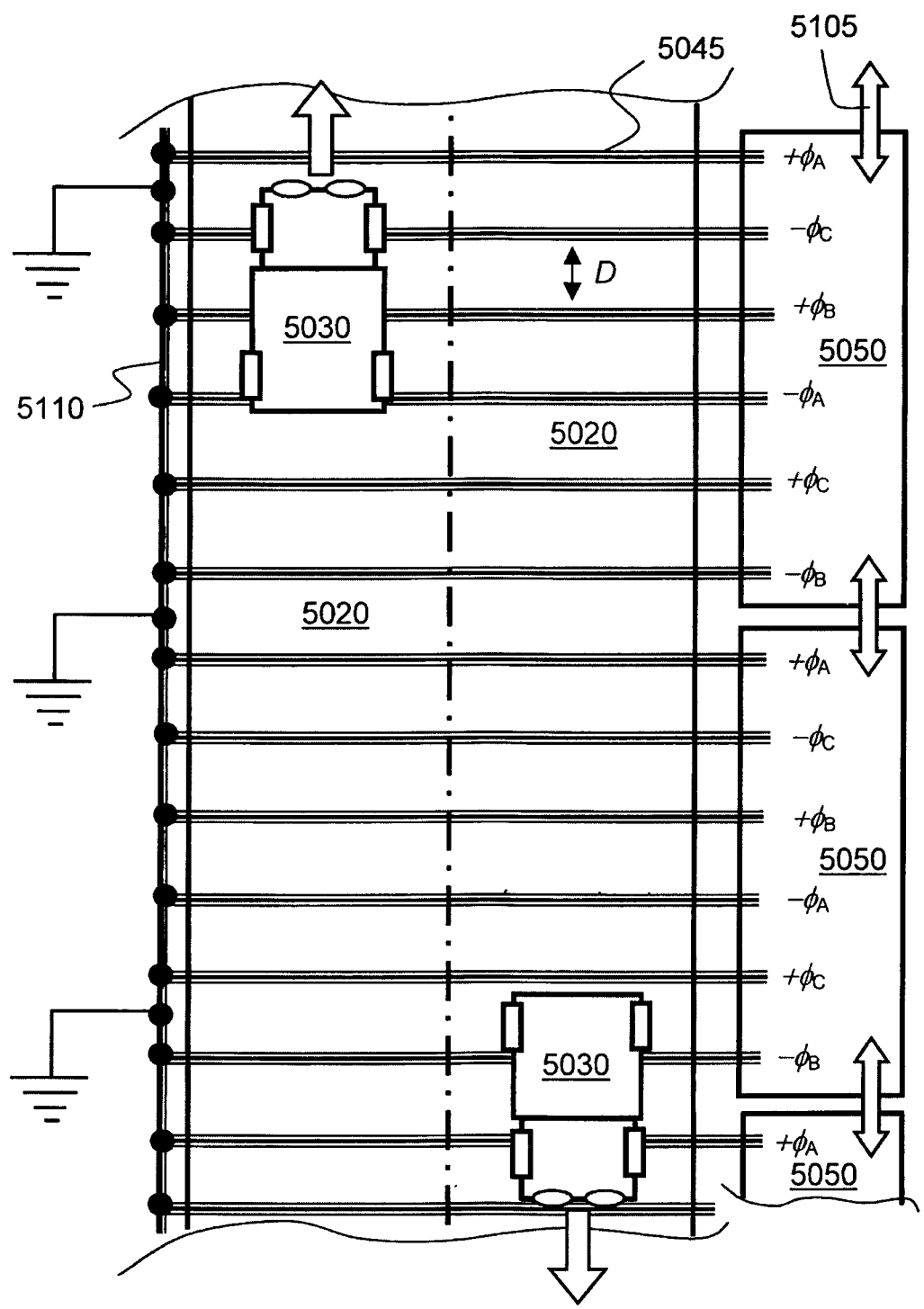
Figure 46B:
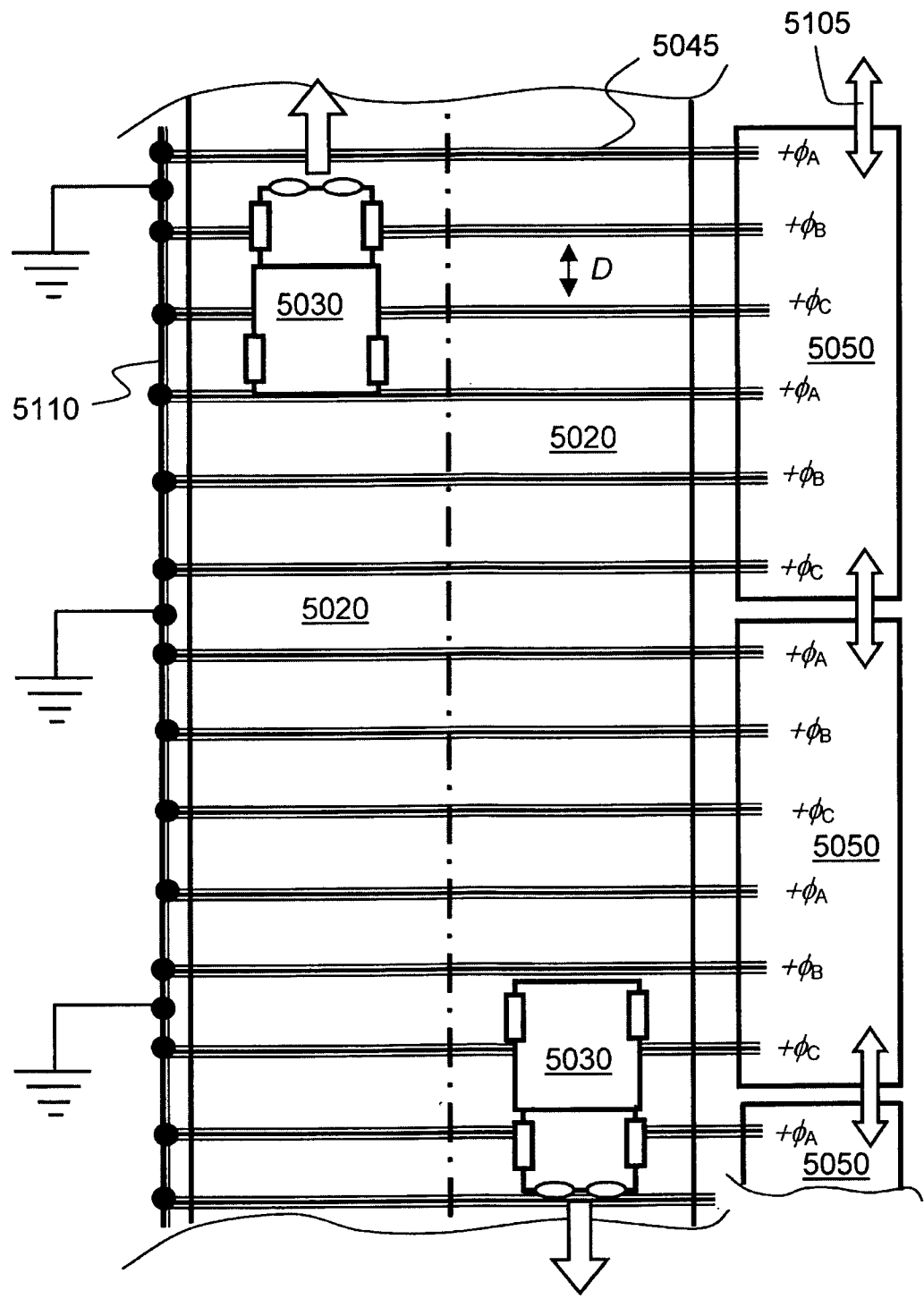
Figure 47:
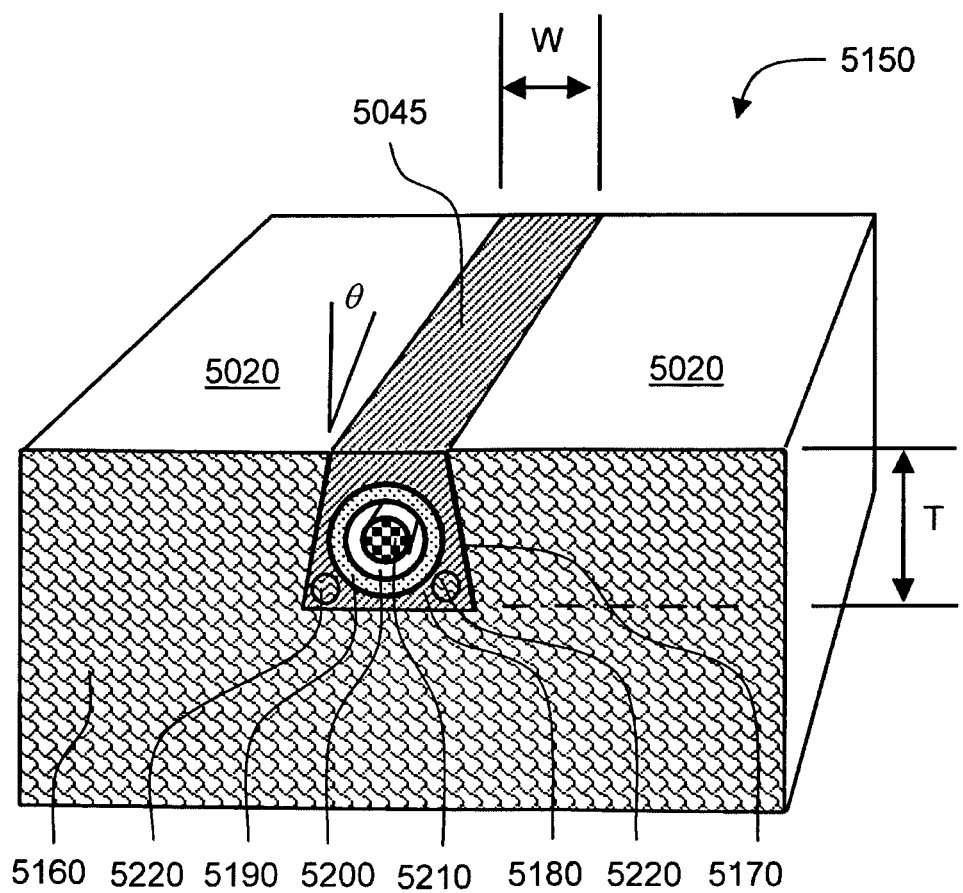
Figure 48A:
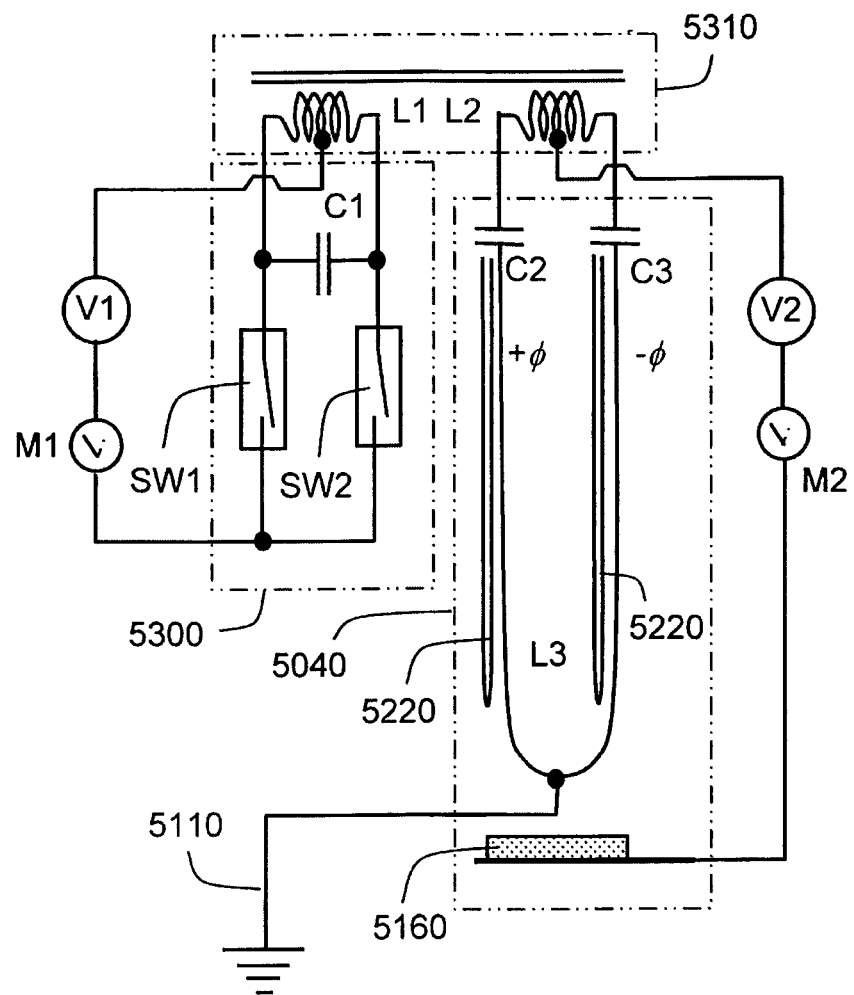
Figure 48B:
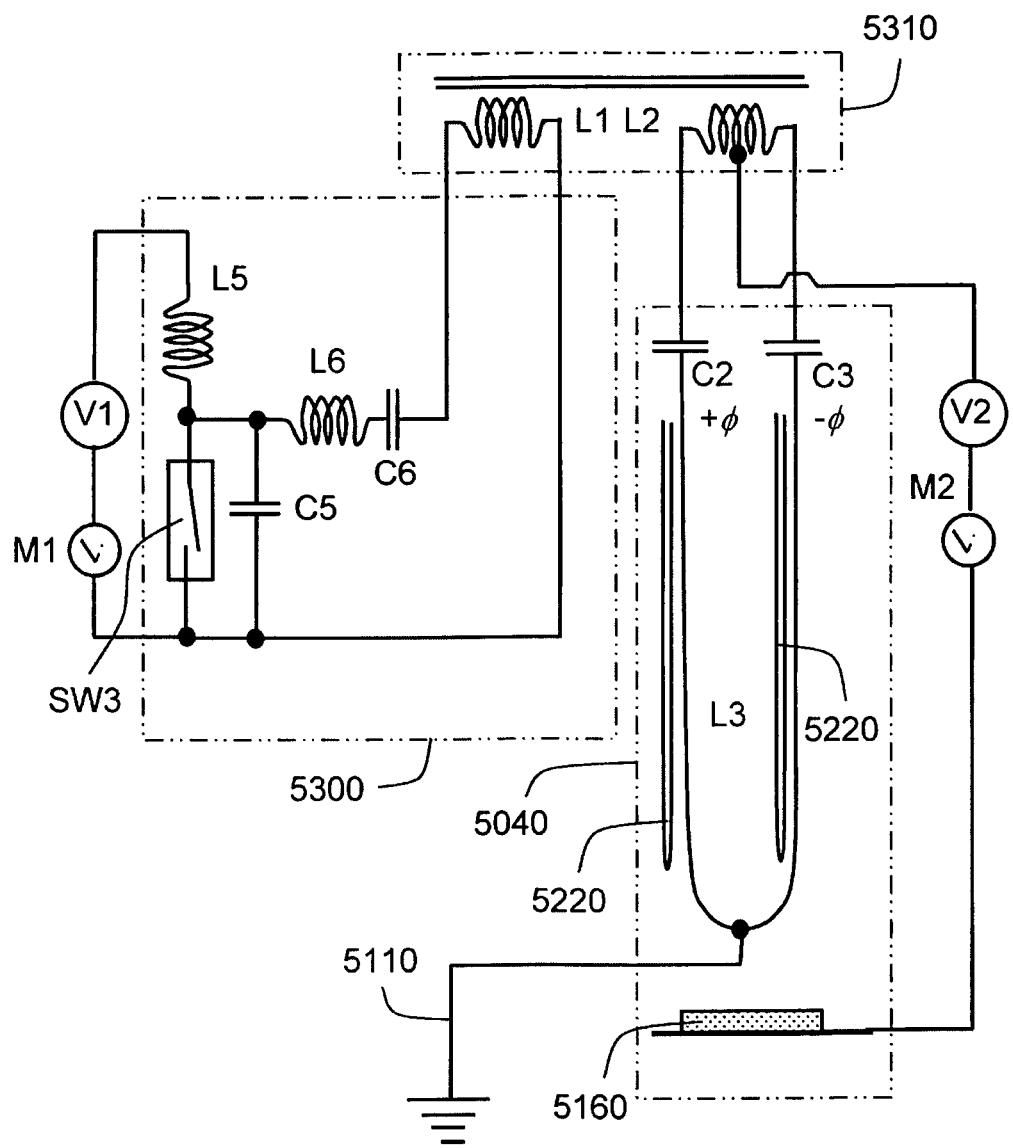
Figure 49:
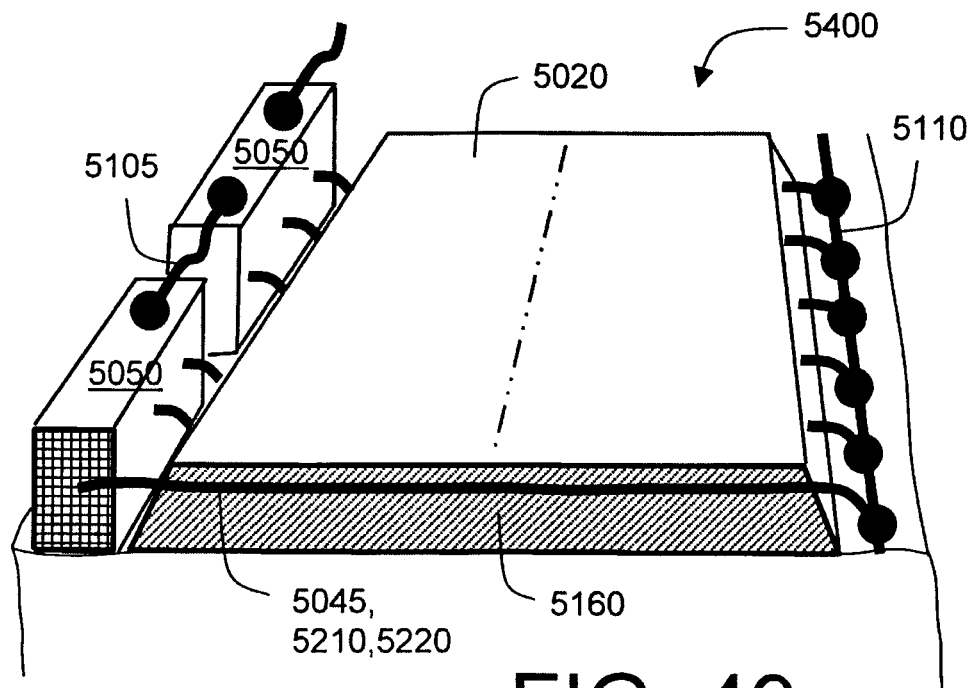
Figure 50:
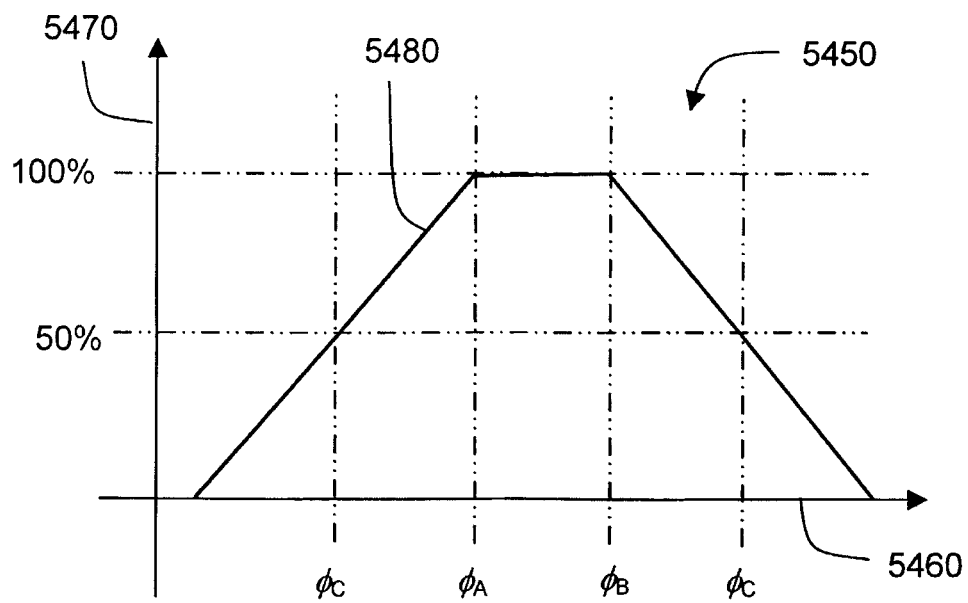
Figure 51:
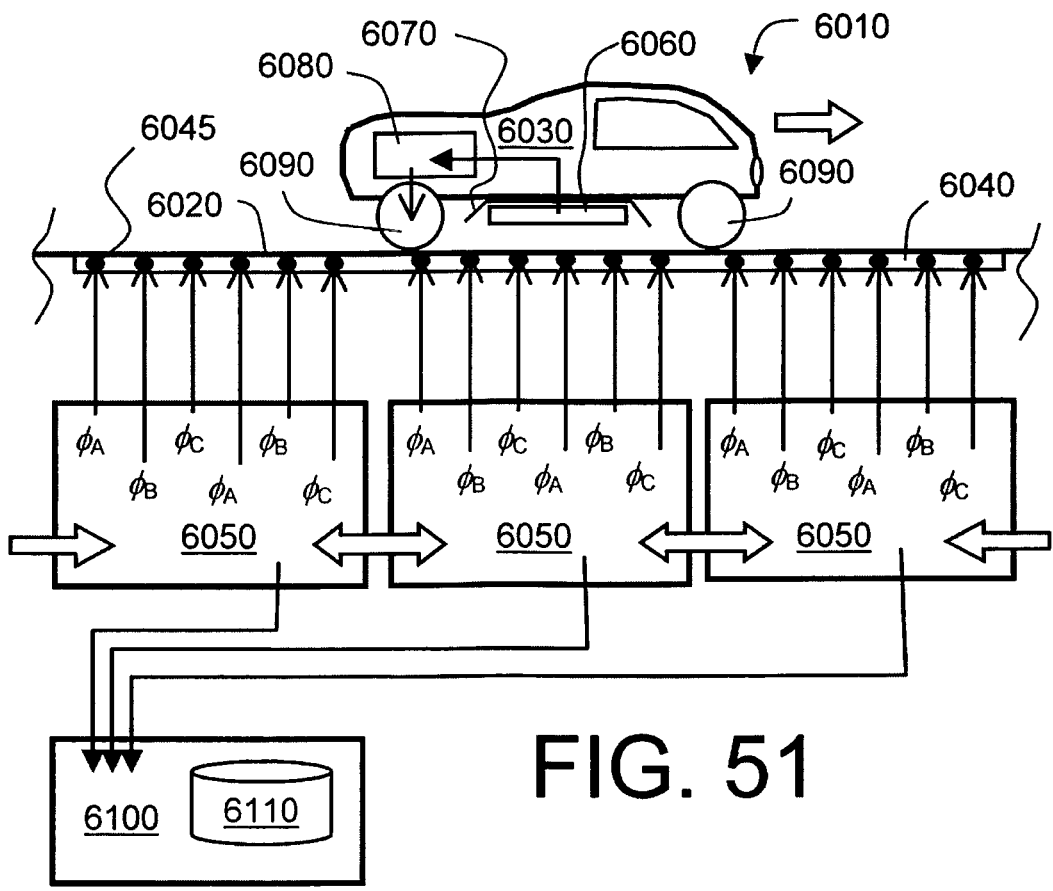
Figure 52A:
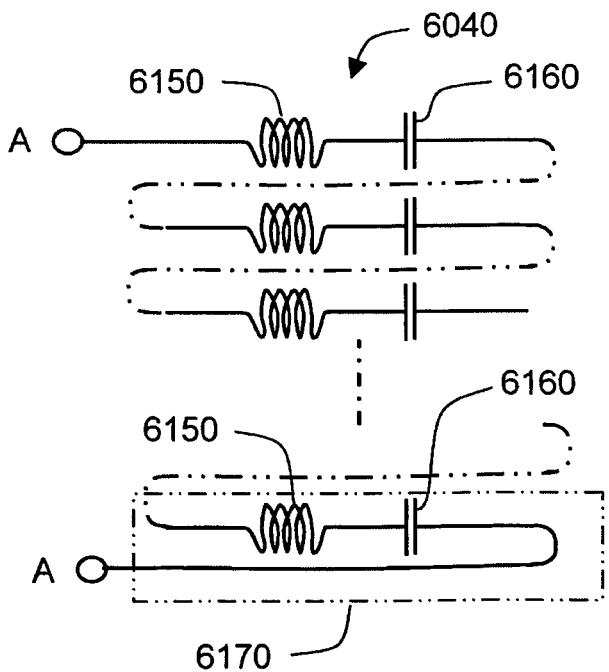
Figure 52B:
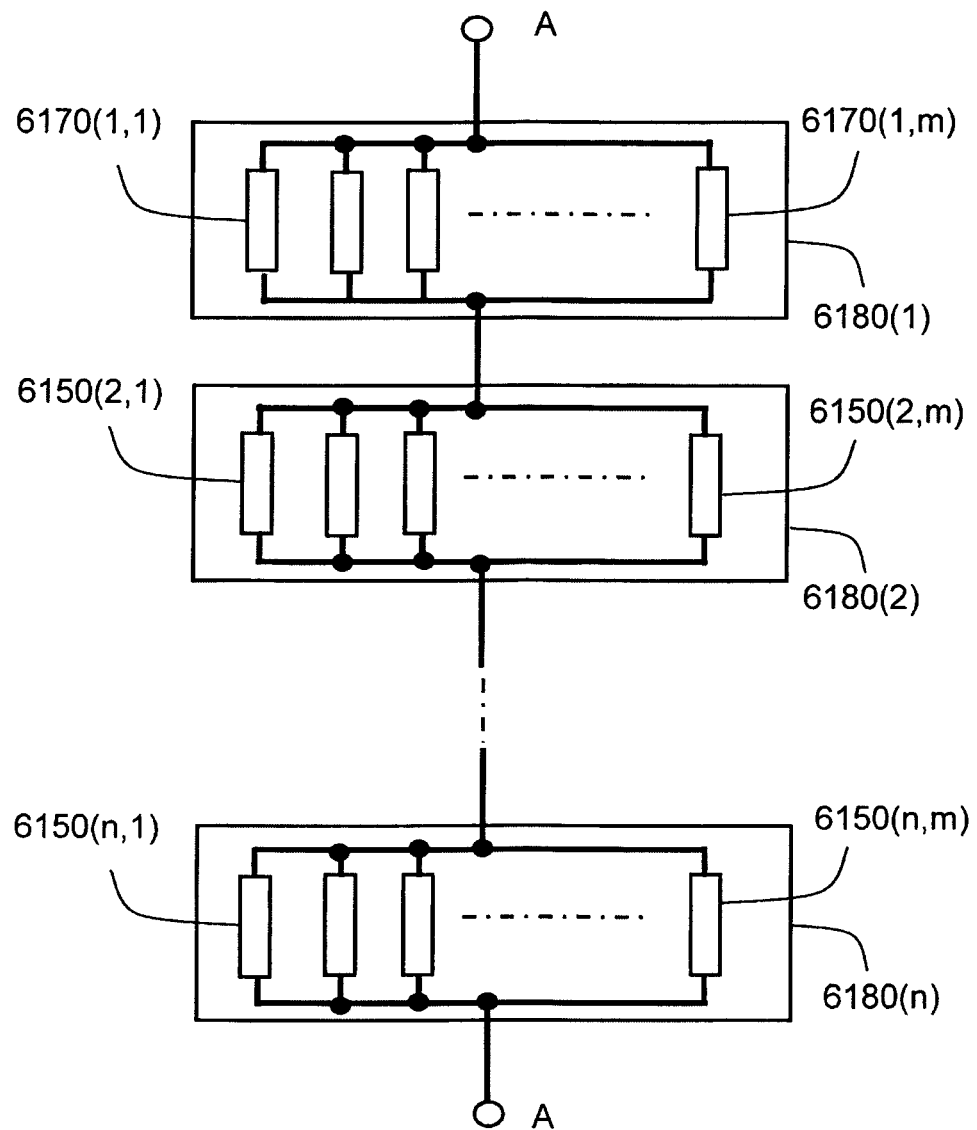
Figure 53A:
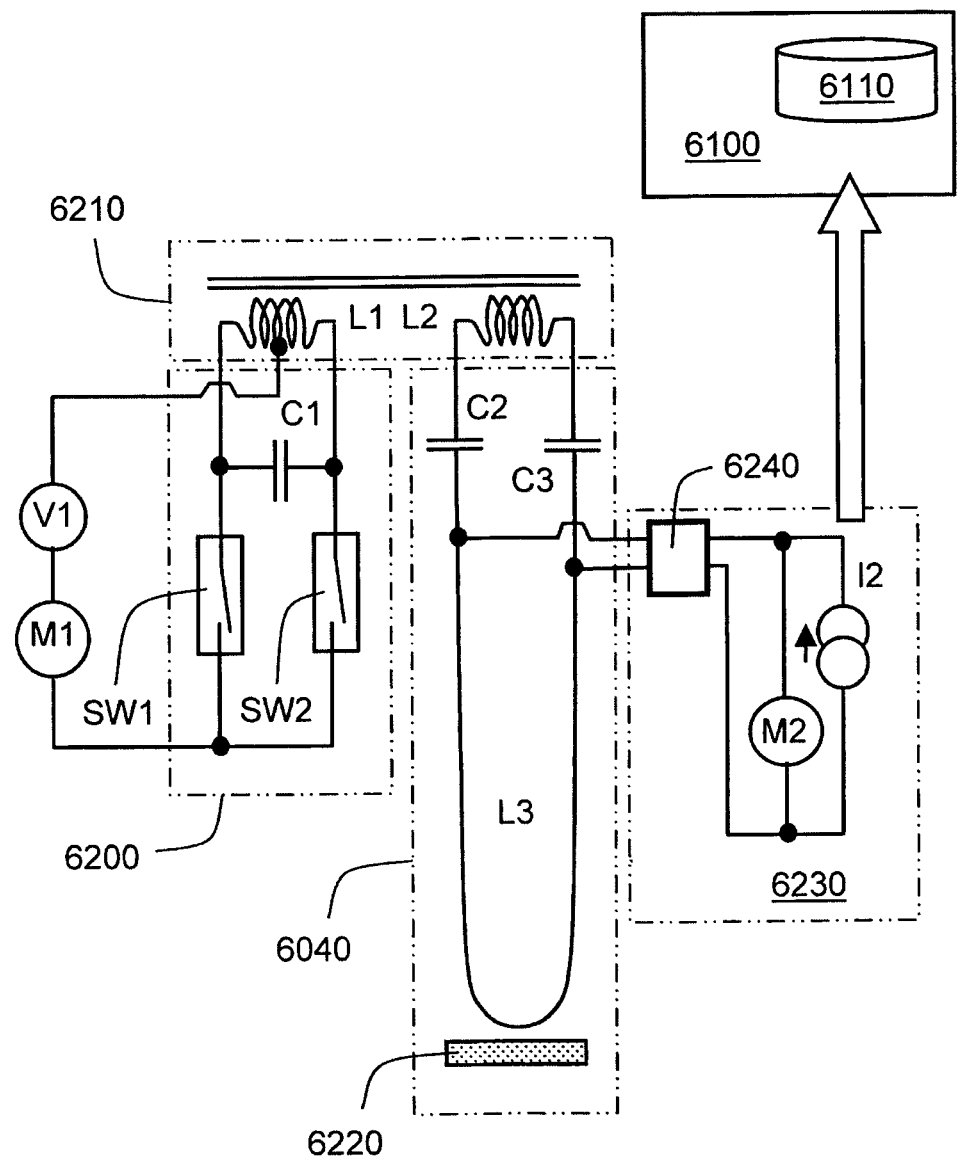
Figure 53B:
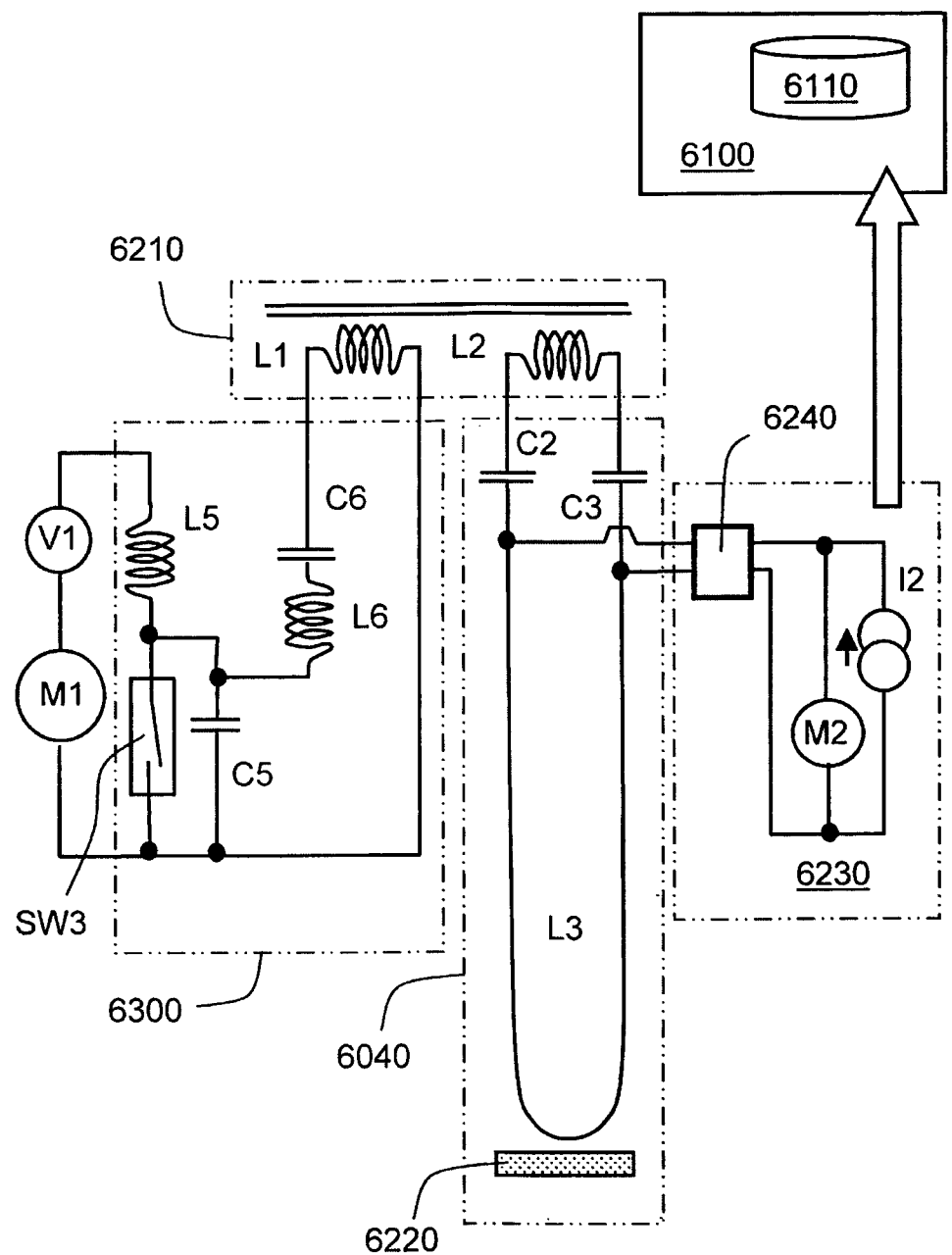
Figure 53C:
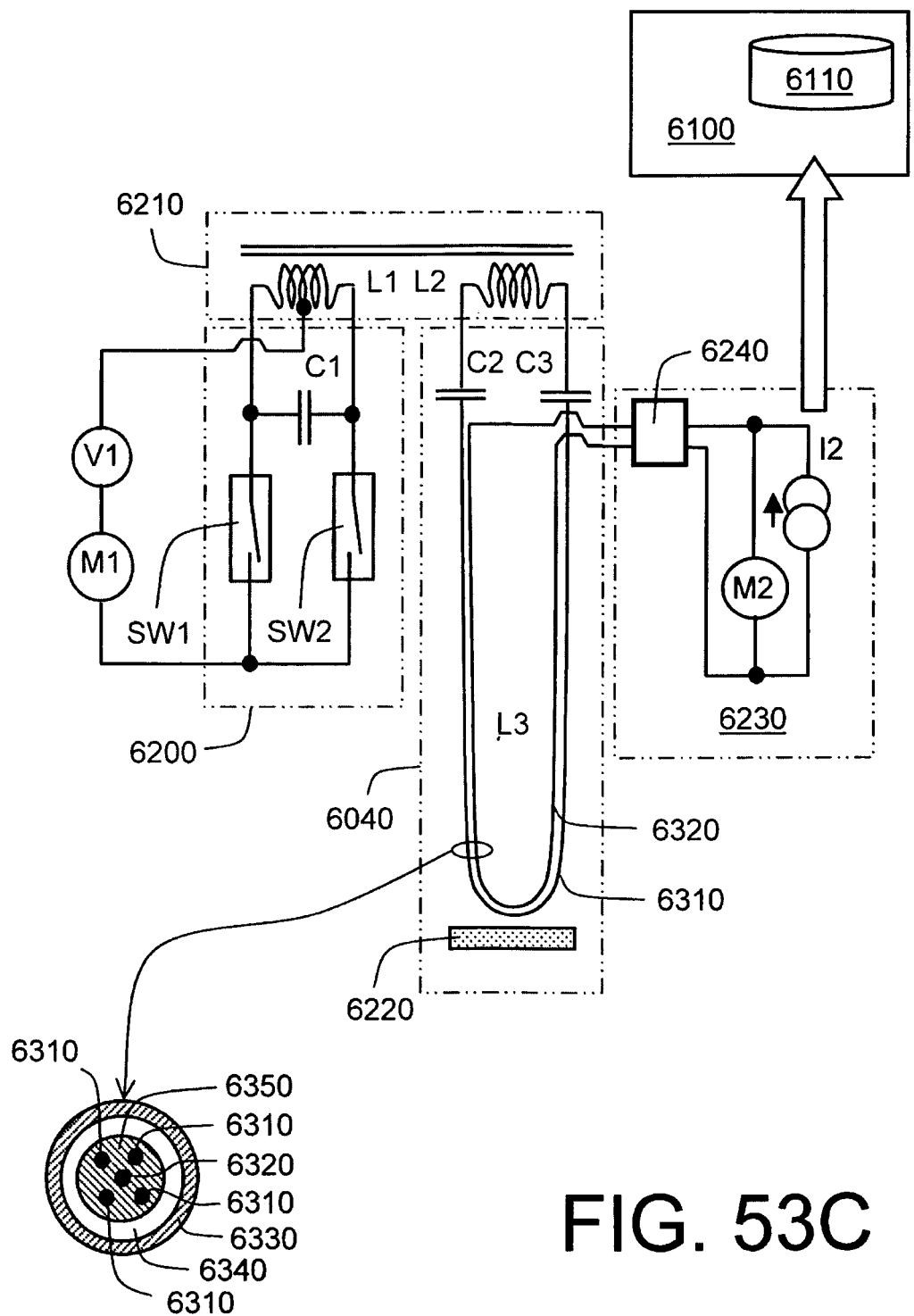
Figure 53D:
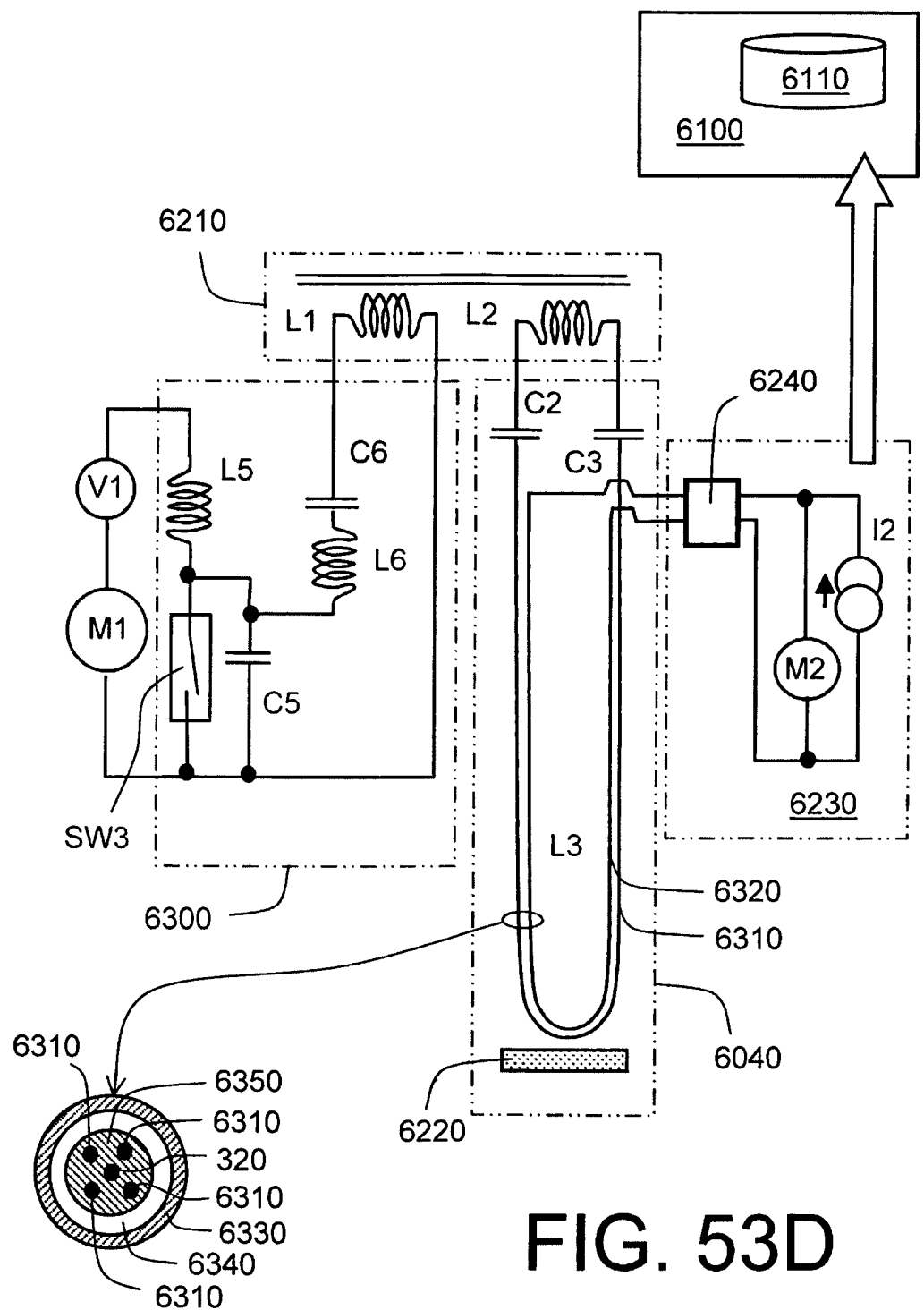
Figure 54A:
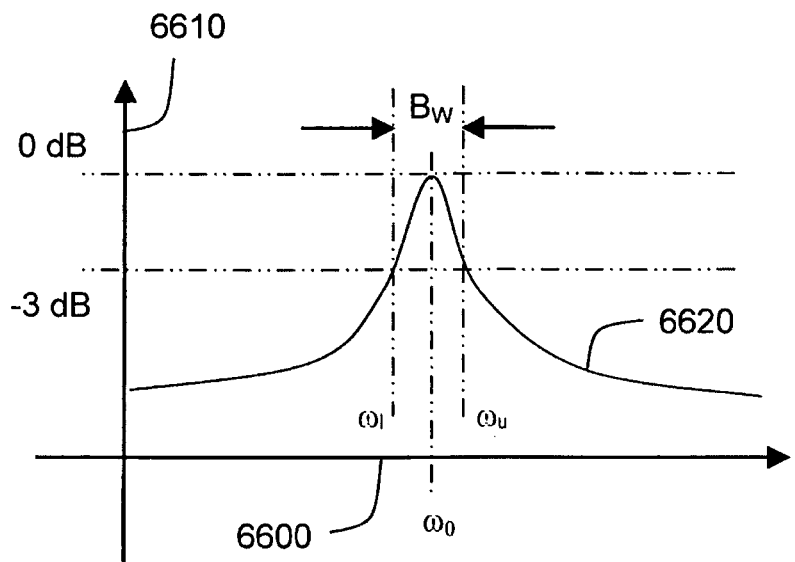
Figure 54B:
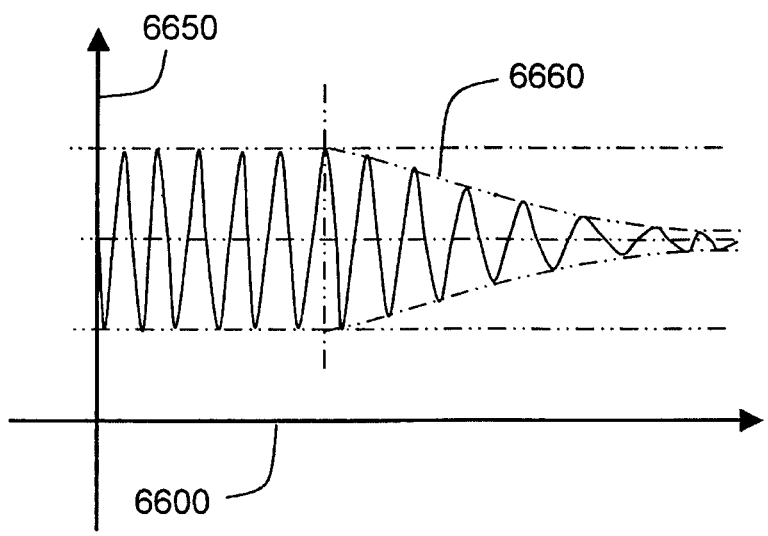
Figure 55A:
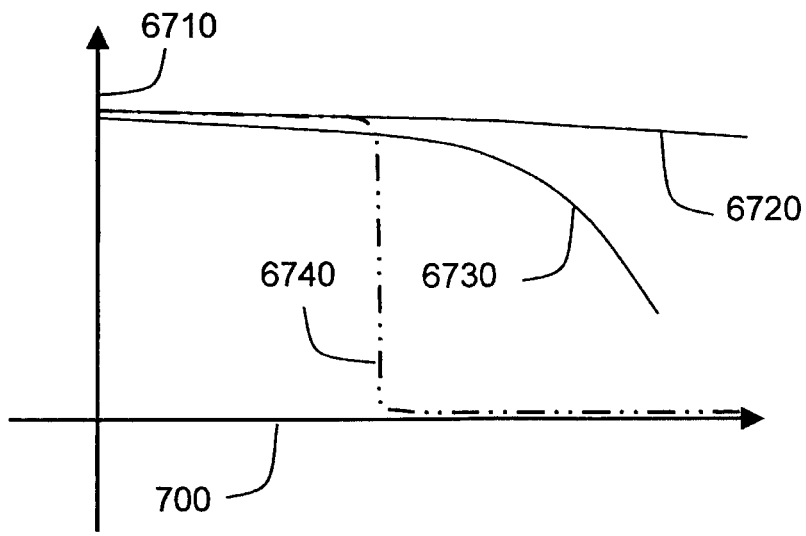
Figure 55B:
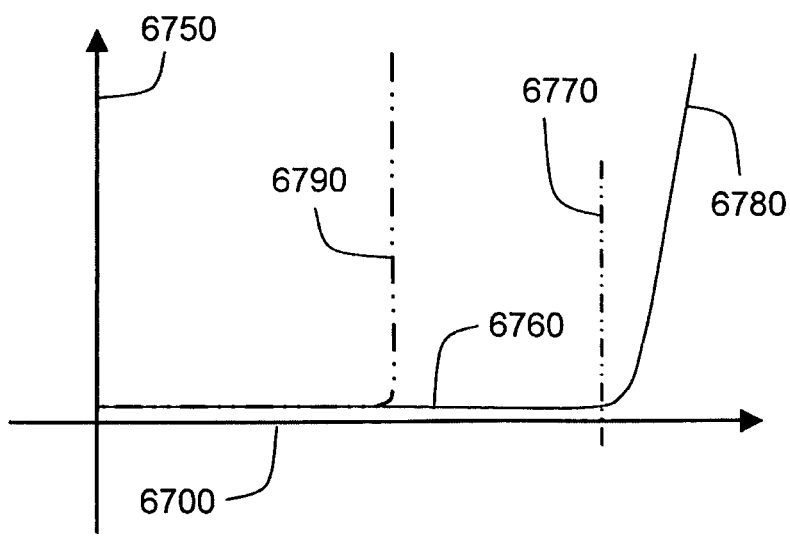

FIG. 20 is an illustration of an alternative implementation of the pickup coil arrangement of FIG. 18, together with an inset diagram illustrating eddy current magnitude induced in operation in a screen of the pickup coil arrangement, FIG. 21 is an illustration of an electric roadway system including induction coils, for example resonant induction coils, embedded within a roadway and an electric vehicle including an electrical power coupling apparatus pursuant to the present invention, wherein the electric vehicle is operable to receive motive via its coupling apparatus from the induction coil in the roadway;

FIG. 22 is an illustration of a pickup coil arrangement of the coupling apparatus of FIG. 21;

FIG. 23 is an illustration of a side view and an end view of the electric vehicle of FIG. 21;

FIG. 24 is an illustration of a pickup coil arrangement of the electric vehicle of FIG. 23;

FIG. 25 is an illustration of a mounting arrangement far the pickup coil of FIG. 22;

FIG. 26 is an illustration of a practical implementation of the pickup coil arrangement of FIG. 22;

FIG. 27 is an illustration of an alternative pickup coil arrangement for the vehicle of FIG. 23;

FIG. 28 is an illustration of an electric roadway system including a vehicle power coupling apparatus pursuant to the present invention;

FIG. 29 is an illustration of a resonant pickup coil arrangement for use in the vehicle power coupling apparatus of FIG. 28;

FIG. 30 is an illustration of a vehicle power coupling apparatus pursuant to the present invention, wherein the apparatus is mounted to an underside of a vehicle;

FIG. 31 is en illustration of a manner of trapezoidal movement of component parts of the apparatus of FIG. 30;

FIG. 32 is an illustration of an underside of the vehicle of FIG. 30 whereat the apparatus of FIG. 30 is deployed;

FIG. 33 is an illustration from a view along an elongate axis of the vehicle of FIG. 30 showing the apparatus as mounted onto vehicle;

FIG. 34 is an illustration of an electric roadway including an electric roadway apparatus pursuant to the present invention;

FIG. 35 is an illustration of an example drive coil arrangement for use in the apparatus of FIG. 34, wherein the drive coil arrangement includes a plurality of series resonant circuits coupled together in sequence;

FIG. 36 is an illustration of an example drive coil arrangement for use in the apparatus of FIG. 34, wherein the drive coil arrangement includes a plurality of groups of series resonant circuits, wherein each group includes a plurality of the series resonant circuits coupled together in parallel, and wherein the plurality of groups are coupled in series;

FIG. 37 is an illustration of a first configuration of driver circuit for exciting the drive coil arrangements of FIG. 35 and FIG. 36, wherein the first configuration of driver circuit includes a parallel resonant "tank" circuit which is providing with excitation power via two electronic switching devices SW1, SW2;

FIG. 38 is an illustration of a second configuration of driver circuit for exciting the drive coil arrangements of FIG. 35 and FIG. 36, wherein the second configuration of driver employs an E-type amplifier circuit including a high-speed switching device SW3, for example implemented as a Silicon Carbide transistor;

FIG. 39 is an illustration of a first general configuration of the apparatus of FIG. 34;

FIG. 40 is an illustration of a second general configuration of the apparatus of FIG. 34;

FIG. 41A is a first graph depicting a resonance characteristic of the drive cry arrangement of FIG. 35 or FIG. 36;

FIG. 41B is a second graph depicting a resonance decay characteristic of the drive coil arrangement of FIG. 35 or FIG. 36;

FIG. 42A is a graph illustrating changes in resonance Q-factor of the drive coil arrangements of FIG. 35 or FIG. 36 as a function of drive coil arrangement operating time;

FIG. 42B is a graph illustrating a potential change in leakage current of the drive coil arrangements of FIG. 35 or FIG. 36 as a function of drive coil arrangement operating time;

FIG. 43A is a graph illustrating excitation of one or more drive coil arrangements of the system in FIG. 34 as a function of vehicle speed, the excitation being negligible when the vehicle is travelling at less than a threshold speed $V_T$, and at a power P suitable for propelling the vehicle when the vehicle speed exceeds the threshold speed $V_T$;

FIG. 43B is a graph illustrating excitation of one or more drive coil arrangements of the system in FIG. 34 as a function of vehicle speed, the excitation being negligible when the vehicle is travelling at less than a lower threshold speed $V_{T1}$, the excitation being intermediate at an intermediate power P1 when the vehicle is travelling at a speed between the lower threshold speed $V_{T1}$ and an upper threshold speed $V_{T2}$, and at a power P2 suitable for propelling the vehicle when the vehicle speed exceeds the upper threshold speed $V_{T2}$, the excitation being changed in a stepwise manner at the threshold speeds $V_{T1}$, $V_{T2}$;

FIG. 43C is a graph illustrating excitation of one or more drive coil arrangements of the system in FIG. 34 as a function of vehicle speed, the excitation being negligible when the vehicle is travelling at less than a lower threshold speed $V_{T1}$, the excitation being progressively increased from negligible power to a power P2 as the speed of the vehicle increases from the lower threshold speed $V_{T1}$ to the upper threshold speed $V_{T2}$, wherein the power P2 is suitable for propelling the vehicle, the excitation being changed in a substantially linear manner when the speed of the vehicle is in a range between the threshold speeds $V_{T1}$, $V_{T2}$;

FIG. 43D is a graph similar to that of FIG. 43C, except that the excitation of the one or more drive coil arrangements is increased in a continuous complex function of the speed of the vehicle;

FIG. 44A is an illustration of an electric roadway including an electric roadway apparatus pursuant to the present invention, the electric roadway employing multiphase excitation with non-inverted and inverted drive signals;

FIG. 44B is an illustration of an alternative electric roadway including an electric roadway apparatus pursuant to the present invention, the electric roadway employing multiphase excitation with non-inverted drive signals only;

FIG. 45A is an illustration of a first embodiment of the electric roadway apparatus of FIG. 44A;

FIG. 45B is an illustration of a second embodiment of the electric roadway apparatus of FIG. 44A;

FIG. 45C is an illustration of a third embodiment of the electric roadway apparatus of FIG. 44B;

FIG. 45D is an illustration of a fourth embodiment of the electric roadway apparatus of FIG. 44A with longitudinal cables along the electric roadway and cable feeders implemented periodically at spatial intervals along the electric roadway;

FIG. 46A is an illustration of a fourth embodiment of the electric roadway apparatus of FIG. 44A, the electric roadway employing multiphase excitation with non-inverted and inverted drive signals;

FIG. 46B is an illustration of a fifth embodiment of the electric roadway apparatus of FIG. 44B, the electric roadway employing multiphase excitation with non-inverted drive signals only;

FIG. 47 is an illustration in cross-section of a cable of the apparatus of FIG. 44A and FIG. 44B installed into a roadway;

FIG. 48A is a schematic circuit diagram of first driver circuit for exciting drive coil arrangements of the apparatus of FIG. 44A and FIG. 44B;

FIG. 48B is a schematic circuit diagram of second driver circuit for exciting drive coil arrangements of the apparatus of FIG. 44A and FIG. 44B;

FIG. 49 is a perspective view of an implementation of the apparatus of FIG. 46A and FIG. 46B;

FIG. 50 is an illustration of selective partial excitation being applied to certain phases as employed in an apparatus pursuant to the present invention for obtaining a more spatially gradual magnetic field profile for reducing effects of stray magnetic field emissions;

FIG. 51 is an illustration of an electric roadway including an electrical roadway apparatus which is provided with a theft prevention system pursuant to the present invention;

FIG. 52A is an illustration of a drive coil arrangement for use in the electrical roadway apparatus of FIG. 51;

FIG. 52B is an illustration of an alternative drive coil arrangement for use in the electrical roadway apparatus of FIG. 51;

FIG. 53A is an illustration of a first excitation circuit for use in the apparatus of FIG. 51, wherein the excitation circuit includes components for theft detection;

FIG. 53B is an illustration of a second excitation circuit for use in the apparatus of FIG. 51, wherein the excitation circuit includes components for theft detection;

FIG. 53C is an illustration of the third excitation circuit for use in the apparatus of FIG. 51, wherein the excitation circuit includes components for theft detection;

FIG. 53D is an illustration of a fourth excitation circuit for use in the apparatus of FIG. 51, wherein the excitation circuit includes components for theft detection;

FIG. 54A and FIG. 54B are examples of resonance characteristics of drive coil arrangements for use in the apparatus of FIG. 51; and FIG. 55A and FIG. 55B are example of operating characteristics of drive coil arrangements for use in the apparatus of FIG. 51.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION OF EMBODIMENTS OF THE INVENTION

Figure 1:
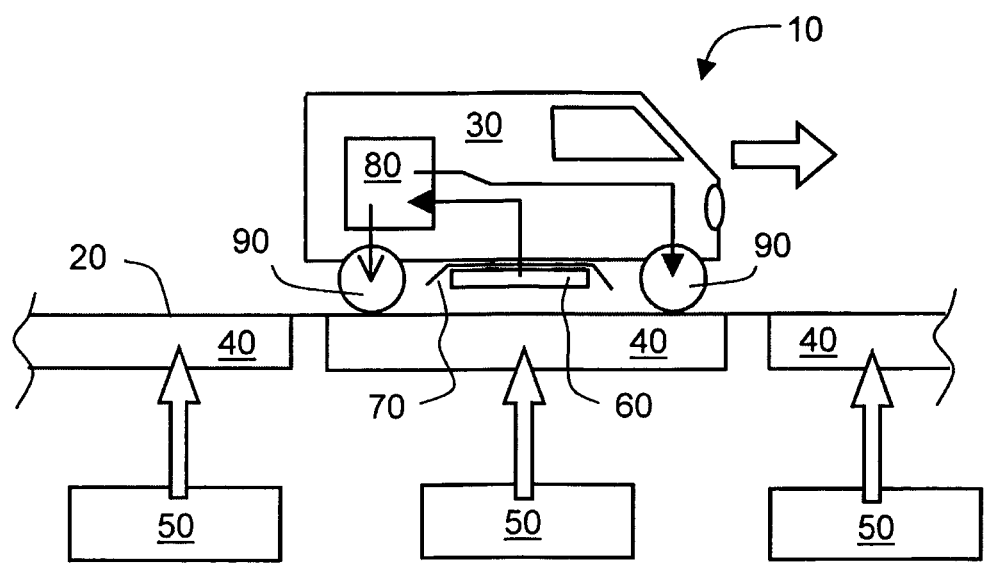
FIG. 1 is a general illustration of an inductive power transfer system for roadways pursuant to the present invention.

Referring to FIG. 1, the present invention is concerned with an inductive power coupling system indicated generally by 10. The system 10 includes a roadway 20 and one or more vehicles 30 which are operable to travel along the roadway 20 using power which is inductively coupled from the roadway 20 to the one or more vehicles 30.

The roadway 20 includes a plurality of drive coil arrangements 40 embedded therein, for example in an end-to-end configuration or at intervals therealong. The drive coil arrangements 40 are coupled to corresponding drive units 50 which are conveniently located along sides of the roadway 20 and connected to an electrical supply network (not shown), for example an national power distribution electrical grid provided with power from Thorium LFTR nuclear reactors, wind turbines, hydroelectric generators, solar generator, geothermal generators and so forth. The drive units 50 are operable to excite their drive coil arrangements 40, for example in a resonant manner, such that the drive con arrangements 40 generate an alternating magnetic field extending spatially from an upper surface of the roadway 20. Conveniently, the drive coil arrangements 40 are installed in the roadway 20 when initially constructed, alternatively retrofitted to the roadway 20 by cutting one or more slots into the roadway for accommodating windings of the drive coil arrangements 40. Empty regions of the one or more slots are beneficially backfilled to be flush with the upper surface of the roadway 20.

Each vehicle 30 is provided with a pickup coil arrangement 60 mounted on an underside of the vehicle 30. The pickup coil arrangement 60 is provided with an associated magnetic shield 70. Optionally, the shield 70 is a unitary component, or is constructed from several components which are connected or otherwise coupled together. Moreover, the pickup coil arrangement 60 is operable to receive alternating magnetic fields generated in operation by a given drive con arrangement 40 over which the vehicle 30 at a given instance of time is spatially located. The magnetic shield 70 is included to prevent alternating magnetic fields generated by the given drive coil arrangement 40 from inducing eddy currents in a general framework of the vehicle 30 which would otherwise result in parasitic power losses, or in worst case be experienced by one or more human occupants of the vehicle 30. Optionally, the magnetic shield 70 is implemented as a planar component including a downwardly formed lip at a peripheral edge of the component as illustrated. Optionally, the magnetic shield 70 is implemented as a planar sheet of material which is folded to form the lip at its peripheral edge. Conveniently, the magnetic shield 70 is fabricated from Aluminium (Al) or similar lightweight electrically-conducting non-ferromagnetic material, for example Copper-Aluminium alloy ("Duralloy", ™). Magnesium alloy, Titanium, Titanium alloy or similar. Optionally, the planar sheet of material is perforated with holes for enabling encapsulating material, for example composite material and/or polyurethane, to bind via the perforated holes from a first major face of the planar sheet to a second major face of the planar sheet. The pickup coil arrangement 60 is coupled to an electronic power conditioning unit 80 of the vehicle 30 which is also connected to one or more drive motors of the vehicle 30 operable to provide motive torque to one or more wheels 90 of the vehicle 30 to propel the vehicle 30 along the roadway 20 in operation. Optionally, the power conditioning unit 80 includes an energy storage element, for example a rechargeable battery, a super-capacitor, a flywheel, a compressed air tank or similar for enabling the vehicle 30 to be propelled when not spatially located over one or more of the drive coil arrangements 40. Optionally, the energy storage element is recharged when the vehicle 30 is capable of receiving by inductive coupling power from one or more of the drive coil arrangements 40. Optionally, the energy storage element is employed to provide instantaneous energy for rapid acceleration of the vehicle 30 to avoid causing power surges to the drive units 50. Optionally, the vehicle 30 includes a modest combustion engine for propelling the vehicle 30 when spatially remote from the roadway 20, namely at a distance from roadway 20 which would otherwise exhaust for traveling purposes energy stored in the energy storage element of the power conditioning unit 80.

The drive coil arrangements 40 are optionally excited at resonance, because this results in relatively large resonant circulating currents within the drive coil arrangements 40 with a correspondingly large alternating resonant magnetic field being generated for coupling to the pickup coil arrangement 60 of the vehicle 30. However, non-resonant inductive power transfer is also within the scope of the present invention. It is beneficial that the roadway 20 is devoid of ferromagnetic components which can magnetically saturate and cause parasitic power losses. Moreover, avoidance of a need for ferromagnetic materials to be installed within the roadway 20 reduces installation cost considerably.

As will be elucidated in greater detail later, the system 10 is distinguished from earlier known configurations by way of one or more enhancements:

(i) the drive units 50 beneficially utilize one or more Silicon Carbide transistors which are capable of blocking in an order of 1 kV potential difference, of conducting ten's of Amperes current and of switching within nanoseconds. Suitable Silicon Carbide transistors for implementing the drive units 50 are manufactured by SemiSouth Inc. although other alternative suppliers exist, for example transistors with 100 mΩ "ON" resistance, together with 1200 volt blocking performance are beneficially employed when implementing the system 10;

(ii) the drive units 50 beneficially each employ one or more E-class type resonant amplifier circuits, preferably one or more balanced E-class type resonant amplifier circuits, which are capable of generating relatively pure sine-wave signals at high frequencies, for example at resonant frequencies in excess of 30 kHz, preferably in excess of 50 kHz, preferably in excess of 100 kHz, and most preferably in excess of 140 kHz. Such higher frequency operation enables power in an order of 20 kW or more to be delivered to the vehicle 30 when in motion along the roadway 20;

(iii) the drive coil arrangements 40 are beneficially provided with corresponding second harmonic cancellation circuits, for example also conveniently housed within the drive units 50, and associated windings spatially overlaid onto the coil arrangements 40 for detecting harmonic components at multiples of the drive frequency $f_0$, namely at $2f_0$, $3f_0$, $4f_0$ . . . , $nf_0$ and for applying opposing signals to annul such harmonic components so that the system 10 generates very low harmonic emissions when in operation, for example for satisfying international standards for low electromagnetic interference, for example IEEE standards. Such suppression is desirable in an event that the roadway 20 is implemented widely around a landscape, wherein the roadway 20 could otherwise represent a major source of electromagnetic interference, for example which could be disruptive to wireless communications infrastructure;

(iv) the drive coil arrangement 40 is beneficially implemented rot a given driven unit 50 as a plurality of coils whose respective principal magnetic axes are mutually spatially displaced in a direction which is orthogonal to an elongate axis of the roadway 20. Optionally, the plurality of coils are energized at resonance with a mutual excitation phase difference so that the vehicle 30 is capable of coupling to the drive coil arrangement 40 in a manner which is less sensitive to a lateral position of the vehicle 30 along the roadway 20, for example for enabling efficient power transfer to the vehicle 30 even when the vehicle 30 performs an overtaking operation; and (v) the pickup coil arrangement 60 is implemented as a plurality of coils which are mutually displaced in a direction which is orthogonal to a direction of travel of the vehicle 30, for enabling the power conditioning unit 80 to select in a dynamic manner between the plurality of coils which coils provide a most efficient power transfer from the drive coil arrangements 40.

One of more of enhancements (i) to (v) are capable of improving power transfer functionality, reducing implementation cost and increasing possible spatial operating clearance between the drive coil arrangement 40 and the pickup coil arrangement 60 which renders the system 10 more practical feasible to implement in comparison to earlier proposed inductive power transfer systems. Embodiments of the system 10 will now be described in greater detail.

Figure 2:
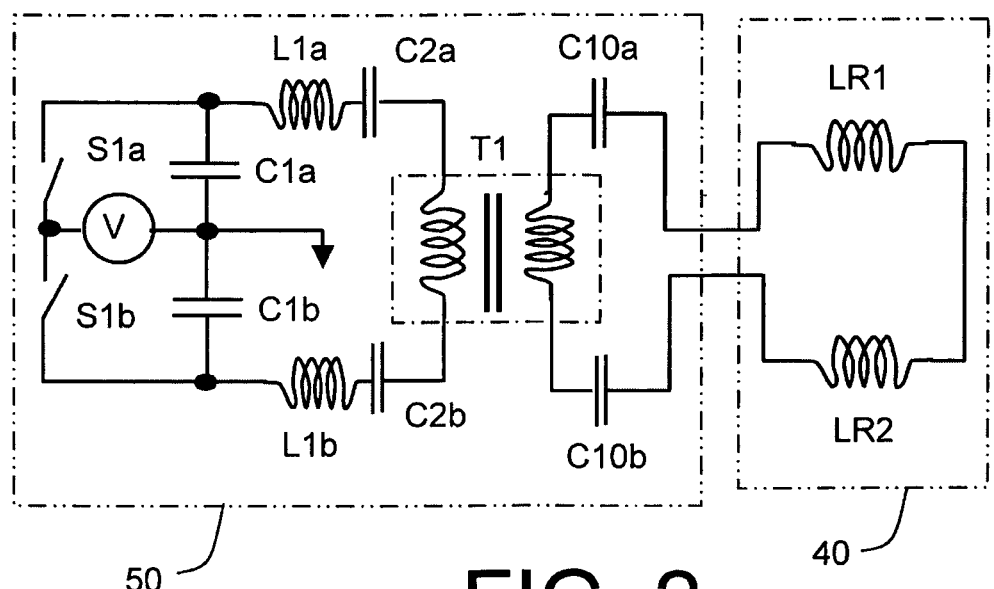
FIG. 2 is an illustration of a drive unit and an associated drive coil arrangement for use when implementing the system of FIG. 1.

Referring next to FIG. 2, an example implementation of the drive unit 50 is illustrated. The drive unit 50 beneficially employs an E-class resonant circuit including a voltage source V derived from an aforementioned electrical supply network, for example a national electrical supply grid. The unit 50 further comprises two switching devices S1a, S1b, for example conveniently implemented using 100 mΩ, 1200 volt Silicon Carbide field-effect-transistors (FET) manufactured by SemiSouth Inc. Source and drain connections of the switching device S1a are coupled to the voltage source V and to a junction of an inductor L1a and a capacitor C1a as illustrated. Similarly, source and drain connections of the switching device S1b are coupled to the voltage source V and to a junction of an inductor L1b and a capacitor C1b as illustrated. The inductor L1a is coupled via a capacitor C2a to a first terminal of a primary winding of a transformer T1. Similarly, the inductor L1b is coupled via a capacitor C2b to a second terminal of the primary winding of the transformer T1. A secondary winding of the transformer T1 is coupled via capacitors C10a, C10b as illustrated to the drive coil arrangement 40 which is represented by two inductors LR1, LR2. Gate electrodes of the switching devices S1a, S1b are coupled to a drive circuit (not shown) which causes the drive unit 50 as illustrated in FIG. 2 to be driven at the natural fundamental resonant frequency $f_0$. Optionally, the drive unit 50 is operable to operate the switching devices S1a, S1b only when the vehicle 30 is spatially overlapping the drive coil arrangement 40. More optionally, the system 10 is implemented so that drive units 50 are selectively energized based upon en expected trajectory of the vehicle 50 as determined from a history of previous drive units 50 which have been activated for providing power inductively to the vehicle 30.

As aforementioned, the drive unit 50 as illustrated in FIG. 2 is a balanced configuration which reduces generation of even harmonics of the, for example resonant, fundamental resonant frequency $f_0$, for harmonics such as $2f_0$, $4f_0$, $6f_0$ and so forth. Beneficially, a balanced E-class amplifier as depicted in FIG. 2 exhibits around −35 dB third harmonic content, namely at a frequency $3f_0$, relative to the fundamental frequency $f_0$. Beneficially, the capacitors C1a, C1b each have a capacitance of approximately 10.8 nF. Moreover, the inductors L1a, L1b each beneficially have an inductance of approximately 90 μH. Furthermore, the capacitors C2a, C2b function as tank resonant capacitors and beneficially each has a capacitance of approximately 31.6 nF. Other values of capacitance and inductance for the capacitors C1, C2 and the inductors L1 can be employed depending upon desired operating frequency $f_0$. The drive unit 50 as illustrated in FIG. 2 is designed for 25Ω single ended load impedance, namely 50Ω balanced load. The transformer T1 is beneficially implemented as a 3:1 step-down transformer from its primary winding to its secondary winding. Connection between the drive unit 50 and its corresponding drive coil arrangement 40 is beneficially implemented using Litz wire, namely a bundle of individually insulated wire strands or individually insulated metal tapes. In operation, the drive unit 50 of FIG. 2 is capable of operating with up to 98% efficiency for converting power input from the voltage source V to a resonant magnetic field generated by the drive coil arrangement 40; when operating in such manner, experimental measurements have shown that third harmonic content at a frequency of $3f_0$ as low as −35 dB is easily achievable. Further suppression of harmonic content in the resonant magnetic field generated by the drive coil arrangement 40 is feasible by including resonant shunts (not shown) across the primary winding and/or the second winding of the transformer T1, wherein the resonant shunts are tuned to harmonics to be reduced, for example at frequencies of $3f_0$, $5f_0$ and so forth. It has been found by experimentation that it is especially beneficial to include a single 9 nF capacitor coupled across the primary winding of the transformer T1, wherein the third harmonic amplitude at a frequency $3f_0$ is thereby reduced to −57 dB, and the ninth harmonic amplitude at a frequency $9f_0$ is thereby reduced to −68 dB as determined from the resonant magnetic field generated by the drive coil arrangement 40. As aforementioned, when implementing the present invention, the frequency $f_0$ is beneficially greater than 30 kHz, preferably greater than 50 kHz, more preferably greater than 100 kHz, and most preferably greater than 140 kHz. Such relatively higher operating frequencies than is conventional enables greater power transfer levels to be achieved whilst utilizing cost-effective and convenient sizes of capacitors and inductors for implementing the drive unit 50.

The drive unit 50 illustrated in FIG. 2 is capable of being further simplified to reduce costs. For example, it is feasible for the class E amplifier of FIG. 2 to exhibit an arbitrary output impedance. Optionally, the transformer T1 is omitted and the road coil inductances LR1, LR2 are then employed to define the resonant frequency $f_0$. For example, the inductances LR1, LR2 from experimental studies are beneficially in an order of a few 10's of μH, and then the capacitors C10a, C10b each need to be adjusted to a value around 80 nF to achieve a well functioning arrangement in a balanced configuration, distal connections of the inductances LR1, LR2 of the drive coil arrangement 40 are beneficially connected to ground potential (Earth) for enhancing operating safety.

Figure 3:
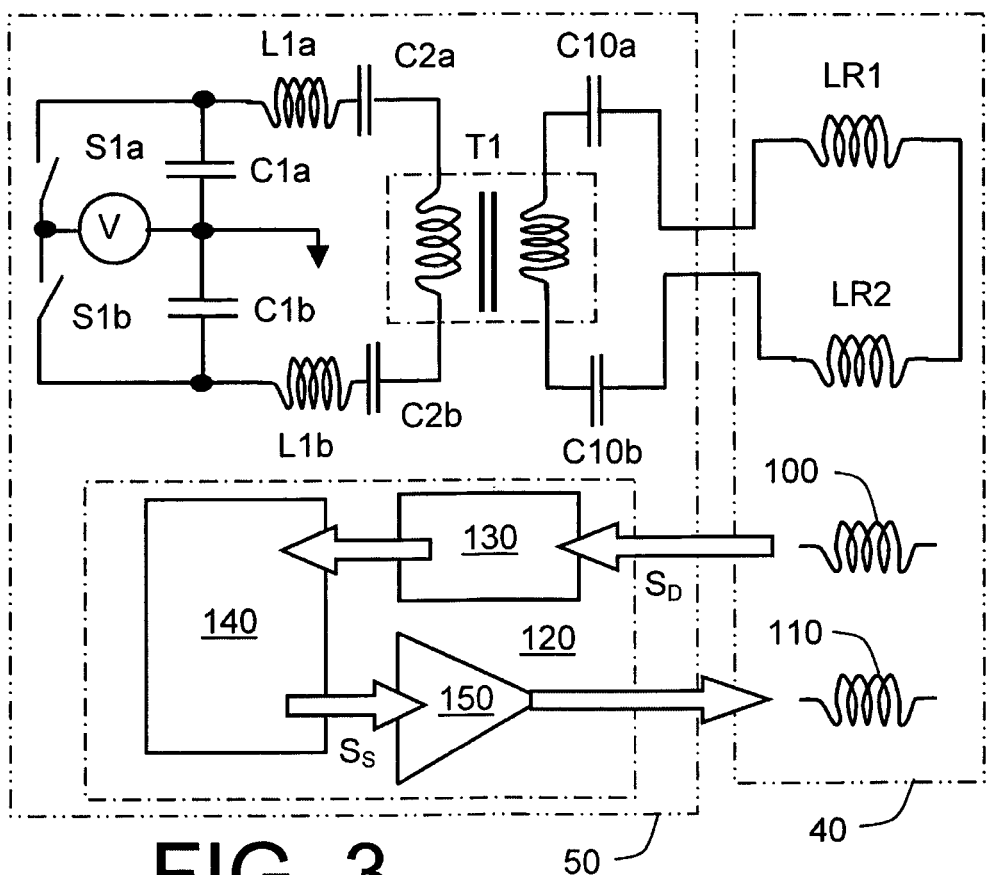
FIG. 3 is an illustration of a drive unit arrangement and an associated drive coil arrangement for use when implementing the system of FIG. 1, wherein there is also included an active harmonic component suppression circuit.

For reducing harmonic content in the extended magnetic field generated by the drive coil arrangement 40, it is optionally feasible to employ an active harmonic suppression arrangement as illustrated in FIG. 3. FIG. 3 differs from FIG. 2 by way of including a detector coil 100 and a driven suppression coil 110, together with a harmonic cancellation circuit 120 beneficially also housed in the drive unit 50. The coils 100, 110 are beneficially disposed to overlay spatially the drive coil arrangement 40. The harmonic cancellation circuit 120 includes a signal processing unit 130 for receiving a detector signal $S_D$ from the detector coil 100, for performing a Fourier analysis of harmonic components present in the detector signal $S_D$. Moreover, the harmonic cancellation circuit 120 further includes a frequency synthesizer 140 for generating one or more pure sinusoidal signals whose frequency and phase can be adjusted relative to the detector signal $S_D$; the one or more pure sinusoidal signals are generated to match in frequency one or more of the harmonic components present in the detector signal $S_D$. Furthermore, the harmonic cancellation circuit 120 includes a linear drive amplifier 150 of modest power, for example a few 10's of Watts, for receiving a synthesized signal $S_S$ from the frequency synthesizer 140 and generating a corresponding amplified signal to drive the suppression coil 110. The signal processing unit 130 is beneficially implemented using a high-speed digital processor operable to execute one or more software products recorded on machine readable data storage media. The signal processing unit 130 is thereby capable of performing a method of harmonic component suppression wherein the signal processing unit 130 is operable to adjust phase and amplitude of the one or more pure sinusoidal signals generated by the frequency synthesizer 140 so that one or more harmonic components in the detector signal $S_D$ are substantially suppressed. Harmonic suppression to less than −80 dB, preferable to less than −100 dB is thereby feasible, namely satisfying even the most stringent electromagnetic interference suppression standards which presently pertain around the World. Suppression of harmonic components is beneficially implemented in an iterative fashion by adjusting phase and amplitude of the one or more sinusoidal signals from the frequency synthesizer 140, commencing from lower harmonic components and ending with higher harmonic components. Such harmonic component suppression is beneficially undertaken on a continuous dynamic basis, wherein adjustment of harmonic component suppression can be implemented within milliseconds as one or more vehicles 30 travel along the roadway 20.

Figure 4:
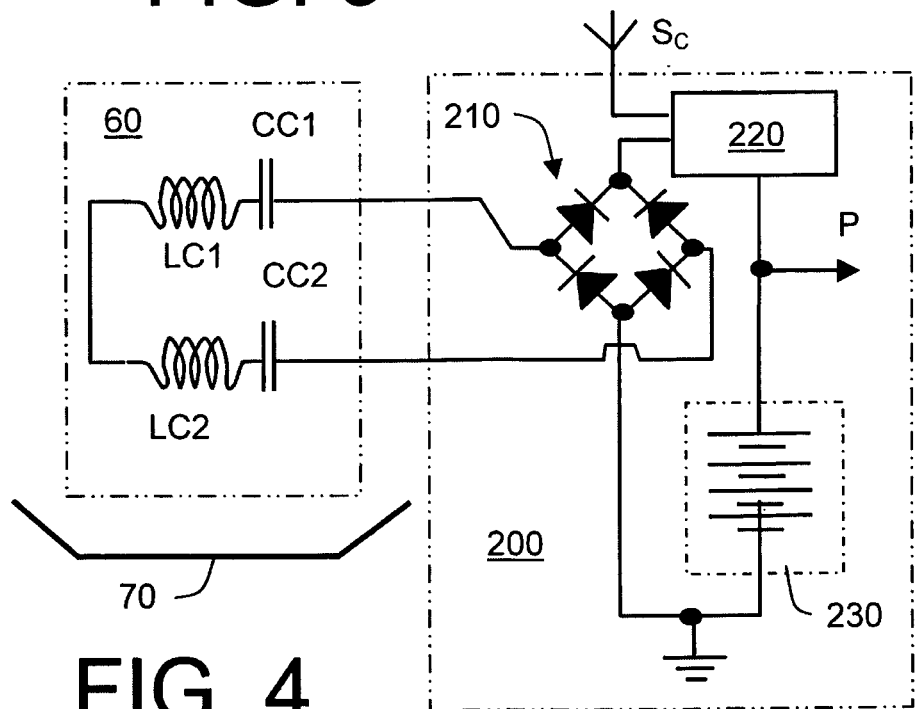
FIG. 4 is an illustration of a pickup coil arrangement and an associated power condition circuit for inclusion on a vehicle operable to function with the system of FIG. 1.

Referring next to FIG. 4, there is shown an implementation of the pickup coil arrangement 60 mounted upon the vehicle 30, together with associated power conditioning components, generally indicated as 200. The pickup toil arrangement 60 includes at least one coil, beneficially fabricated from Litz wire, ribbon cable or similar conductive tape implementation, which is disposed beneath the magnetic shield 70. In operation, resonant magnetic fields generated by the drive coil arrangement 40 induces eddy currents in the magnetic shield 70, thereby reflecting the resonant magnetic field and thereby preventing it coupling power significantly into a general mechanical structure of the vehicle 30. The at least one coil of the pickup coil arrangement 60 is represented by two inductances LC1, LC2 which are coupled in a resonant manner via blocking capacitors CC1, CC2 to a rectifying circuit 210 to generate direct current (d.c.) which is passed via a power control circuit 220, for example implemented as a switch-mode regulator, to a energy storage arrangement 230, for example implemented as a rechargeable battery and/or supercapacitor, for example a 240 Volt rechargeable NiMH or Lithium rechargeable battery as employed in the Prius automobile manufactured by Toyota company; "Prius" is a registered trademark. Power P for propelling the vehicle 30 along the roadway 20 is extracted from the energy storage arrangement 230; for example, the power P is provided via one or more switch-mode power controllers to drive in-hub electric motors of the vehicle 30. Optionally, the power control circuit 220 is operable to receive a power control signal $S_C$ from an external source when the system 10 is momentarily employed to perform response load functionality for provide dynamic stabilization of an electrical supply grid providing power to the drive units 150. The signal $S_C$ is optionally provided via a wireless network anchor near field radio (NFR) communication from a side of the roadway 20. This means that the vehicle 30 preferably uses power from its energy storage arrangement 230 rather than relying on the pickup coil arrangement 60 when the electrical supply grid is momentarily heavily loaded, for example locally loaded, for example on account of many vehicles accelerating simultaneously, for example on change of traffic light colour from red to green, thereby avoiding momentary overload at local substations along the roadway 20 for example.

Figure 5:
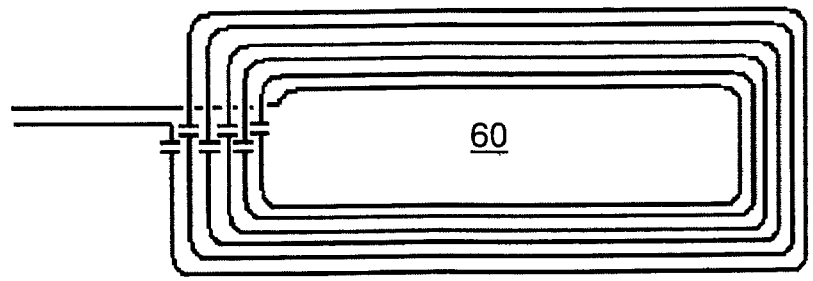
FIG. 5 is an illustration of an implementation of a coil for use in the system of FIG.

In FIG. 4 the inductors LC1, LC2 are beneficially implemented as 120 turns of wire, wherein each turn is provided with an associated resonating capacitor as illustrated in FIG. 5. Inclusion of the capacitors increases safety, spreads dielectric losses between numerous capacitors and results in a high degree of reliability on account of simultaneous failure of multiple capacitors, for example short circuit therethrough, being very unlikely. The rectifying circuit 210 is beneficially implementing using a bridge rectifier, but its rectifying operation can result in a degree of harmonic generation which can be suppressed, for example, using additional suppressing resonant shunt circuits if necessary.

In FIG. 5, the pickup coil arrangement 60 is conveniently implemented as a coil including a plurality of turns, wherein each turn is furnished with en associated resonant capacitor. Such an arrangement provides lower induced voltages in operation, thereby increasing operating safety.

Figure 6:
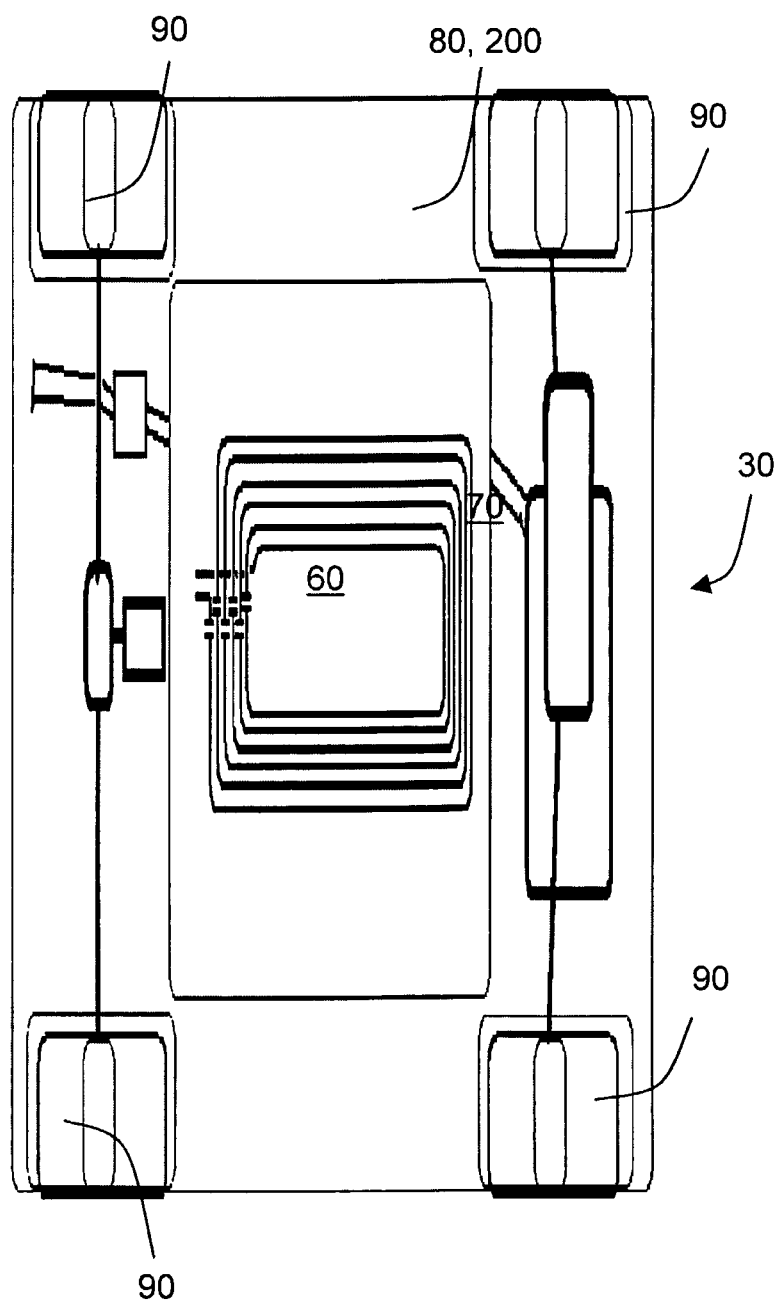
FIG. 6 is an illustration of a vehicle for use with the system in FIG. 1, wherein the vehicle includes a pickup coil arrangement which is operable to recharge an energy storage element, for example a rechargeable battery, of the vehicle.

Referring next to FIG. 6, there is shown an underside view of the vehicle 30 which illustrates a placement of the magnetic shield 70 with its associated pickup cog arrangement 60 implemented as a single multiturn coil, wherein each turn is provided with a corresponding resonant capacitor. The pickup coil arrangement 60 is coupled to recharge energy storage elements, represented by 80, 200, of the vehicle 30. The magnetic shield 70 has a spatial extent on the underside of the vehicle 30 which extends beyond an outer perimeter of the pickup coil arrangement 60, for example by at least a 10% margin, and more preferably by at least a 25% margin, wherein the margin is a linear distance from an effective centre of an underside area of the vehicle 30. In FIG. 6, the effective centre of the vehicle 30 corresponds also substantially to a centre of the pickup coil arrangement 60 as illustrated. Optionally, the pickup coil arrangement 60 has a planar area which is in a range of 50% to 80% of that of the magnetic shield 70.

Figure 7:
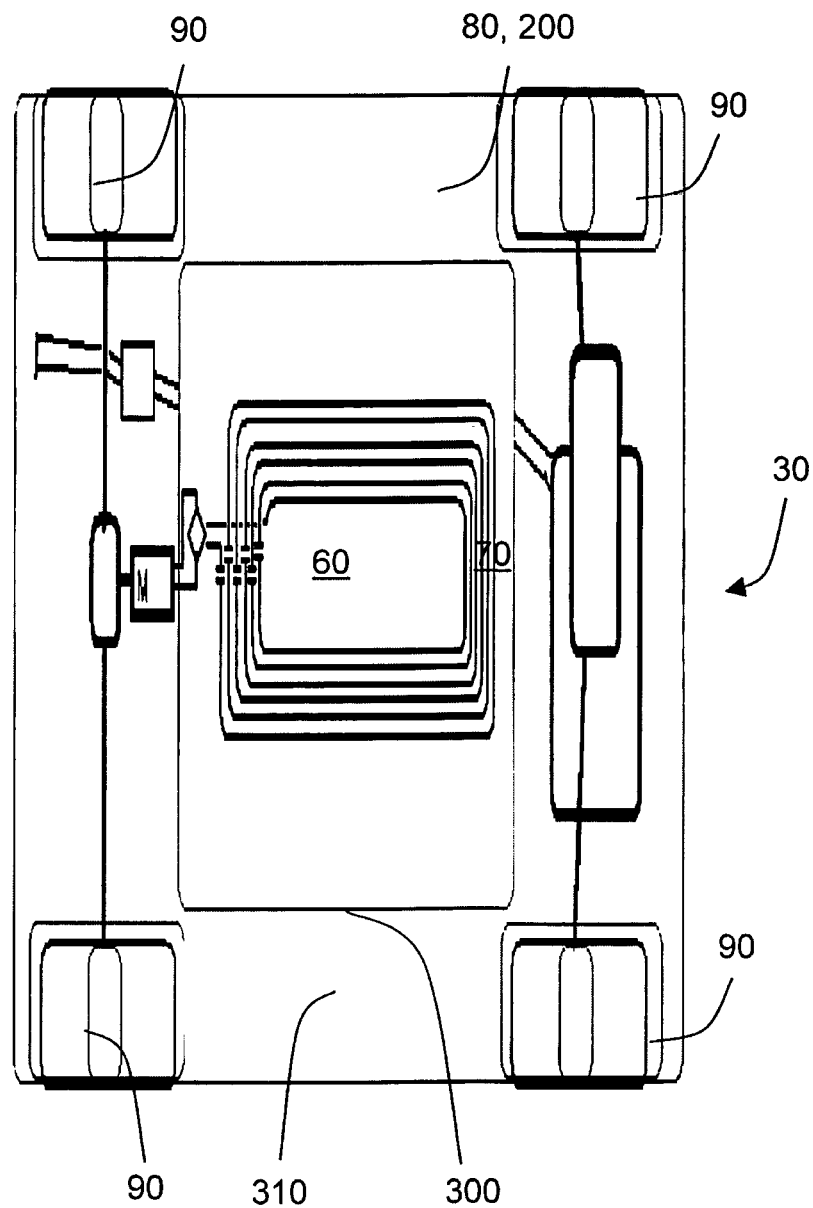
FIG. 7 is an illustration of a vehicle for use with the system in FIG. 1, wherein the vehicle includes a pickup coil arrangement which is operable to provide power to an electric drive train of the vehicle.

In FIG. 7, there is again illustrated an underside view of the vehicle 30, wherein the pickup coil arrangement 60 is implemented as a single multiturn coil, wherein each turn of the coil is provided with a corresponding resonant capacitor. The coil is coupled via a rectifier arrangement to provide power P to an electric motor 300 of the vehicle 30, wherein an output shaft of the motor is coupled via a differential gear 310 to rear wheels 90 of the vehicle 30.

Figure 8:
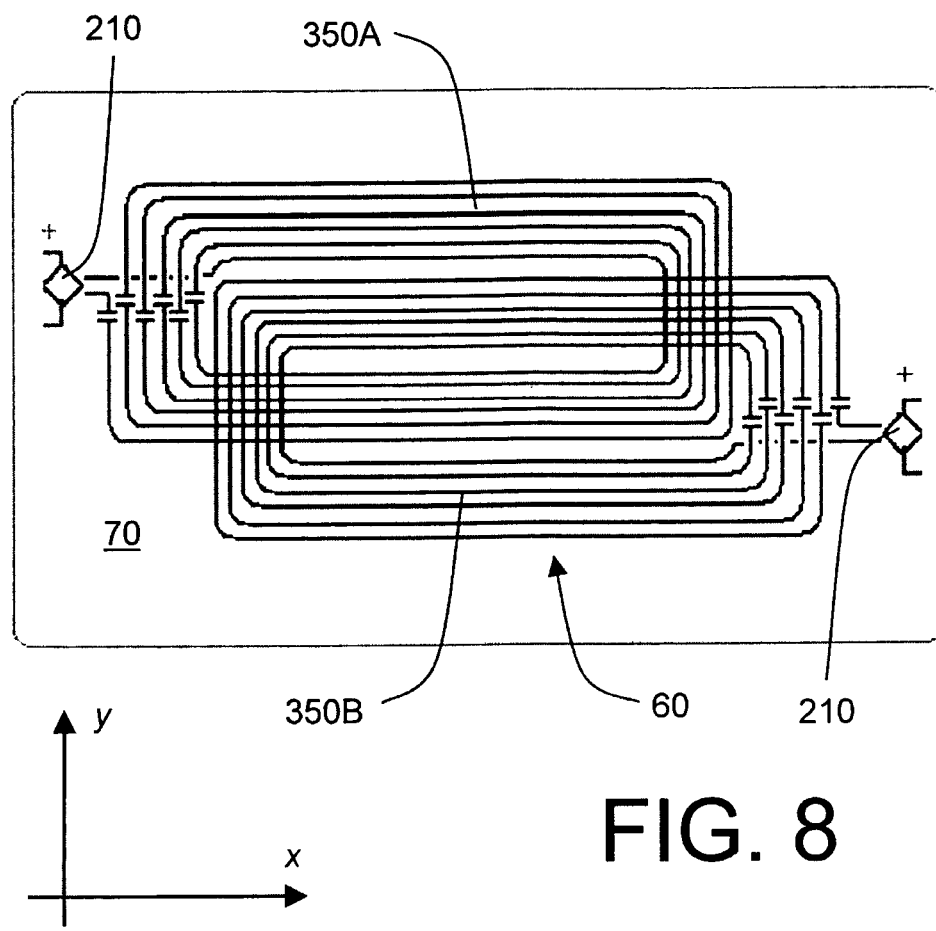
FIG. 8 is an illustration of an example configuration for a pickup coil arrangement of a vehicle for use with the system of FIG. 1.

As elucidated in the foregoing, one or more of the drive coil arrangement 40 and the pickup coil arrangement 60 is each furnished with multiple coils which are mutually spatially displaced and switchably connectable for obtaining most efficient power coupling from the roadway 20 to the vehicle 30. In FIG. 8, there is shown the pickup coil arrangement 60 implemented with two pickup coils 360A, 360B which ere mutually disposed in a displaced manner in both x and y directions so that centre regions of the colts 360A, 360B overlap corresponding winding regions of the coils 360B, 360A respectively as illustrated. Selecting between the coils 360A, 360B dynamically during driving of the vehicle 30 enables the system 10 to cope with varying lateral position of the vehicle 30 relative to the roadway 20 when travelling along the roadway 20, for example when executing various manoeuvres such as overtaking other vehicles along the roadway 20, and performing an exit from the roadway 20.

Figure 9:
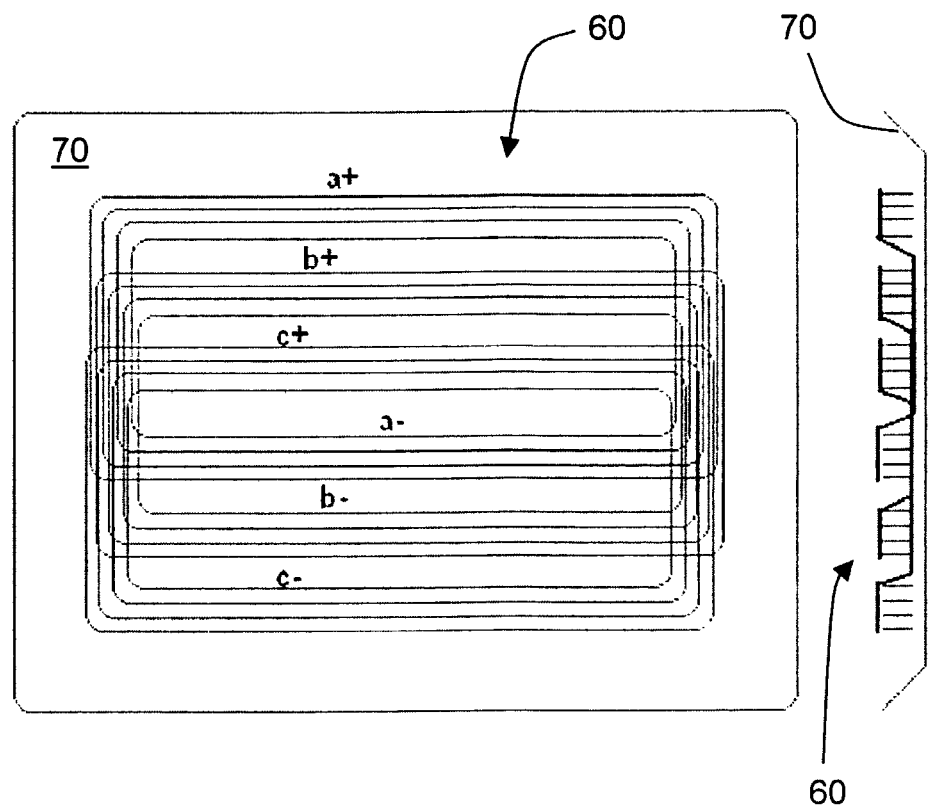
FIG. 9 is an illustration of a further example configuration for a pickup coil arrangement of a vehicle for use with the system of FIG. 1.

Referring to FIG. 9, the pickup coil arrangement 60 of the vehicle 30 is implemented as a set of three partially overlapping coils with associated resonant capacitors (not shown). The coils are denoted by a+, b+ and c+ and disposed in a mutually laterally displaced manner in respect of a y direction as illustrated. Windings of the coil c+ traverse a central region of the coil a+, and vice versa. The coil b+ lies spatially intermediately disposed between the coils a+ and c+ as illustrated. Dynamically switching between the coils 1+, b+ and c+ in operation enables an effective centre of the pickup coil arrangement 60 to be modified in a dynamic manner whilst the vehicle 30 is travelling along the roadway 20, for example for ensuring optical efficient of inductive power coupling to the vehicle 30. Optionally, other number of coils can be included in the pickup coil arrangement 80 than described in the foregoing within the scope of the present invention. Switching between the coils a+, b+ and c+ is beneficially implemented using electromechanical relays and/or solid-state switching devices.

Figure 10:
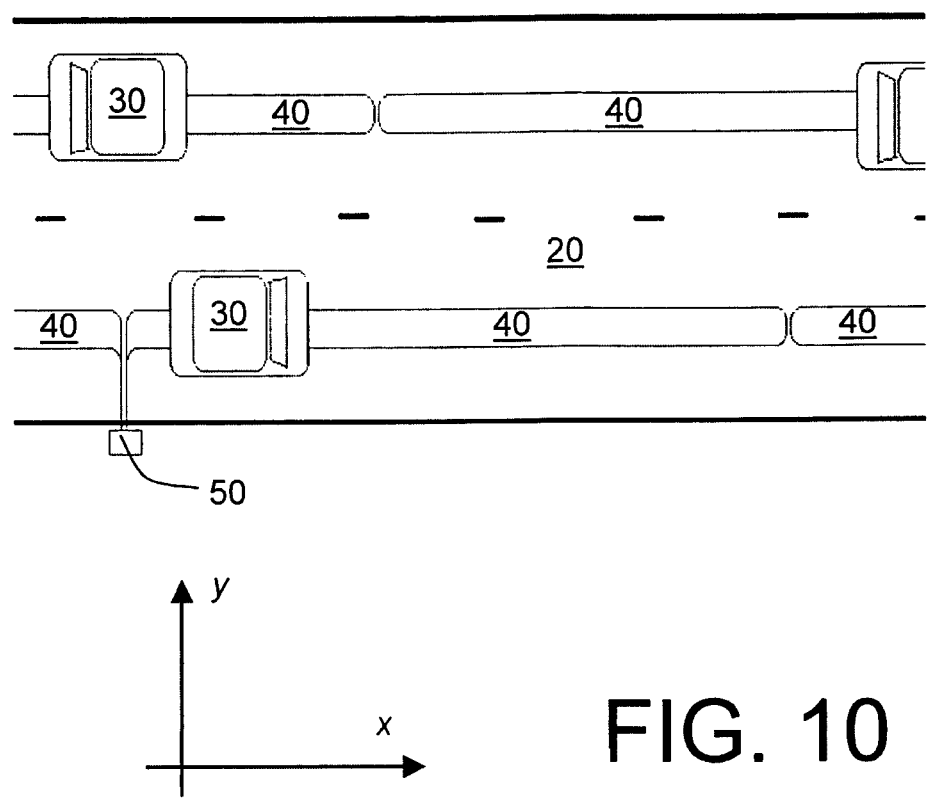
FIG. 10 is a plan view of a roadway in which the system of FIG. 1 is implemented.

In FIG. 10, there is shown a plan view of the roadway 20 including two lanes for bi-direction traffic flow. Each lane is provided with a series of drive coil arrangements 40 arranged end-to-end, coupled to drive units 50 disposed along peripheral edges of the roadway 20. Vehicles 30 are driven substantially along a central region of each of the lanes in a manner substantially aligned to the drive coil arrangements 40. The drive coil arrangements 40 beneficially each has a length-to-width ratio in a range of 1:3 to 1:20, more preferably in a range of 1:4 to 1:15, as determined with width in the y axis direction, and with length in the x axis direction.

Figure 11:
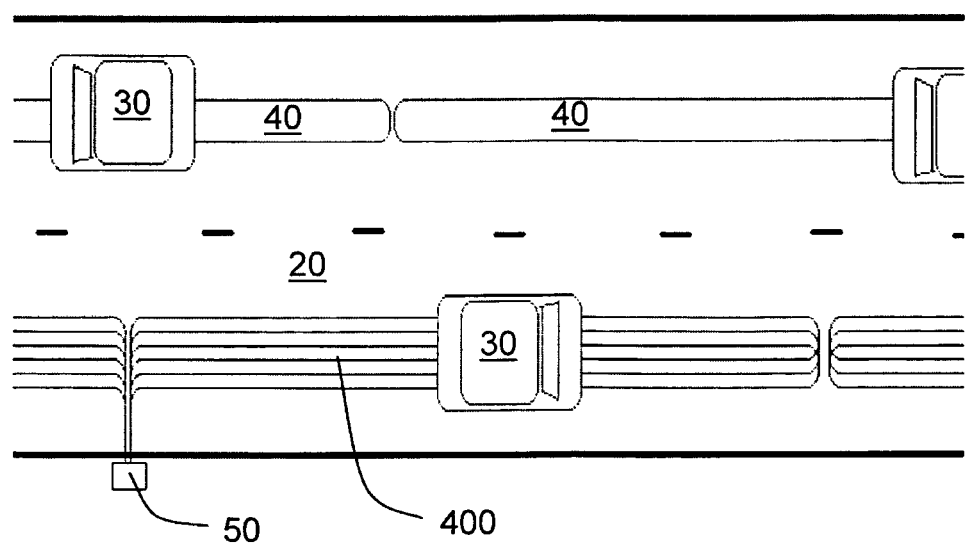
FIG. 11 is a plan view of a roadway in which the system of FIG. 1 is implemented, wherein a drive coil arrangement is implemented as a plurality of mutually laterally displaced sets of coils.

Referring next to FIG. 11, the drive coil arrangement 40 along one of the lanes of the roadway 20 is implemented for each section as a plurality of coils 400 which are disposed in a mutually displaced manner in respect of the y axis as illustrated and coupled to corresponding drive units 50 disposed at intervals along the roadway 20. The system 10 is beneficially provided with an arrangement for determining dynamically an instantaneous lateral position of the vehicle 30 along the lane, and selectively coupling amongst the coils 400 of the drive coil arrangement 40 for ensuring an optical power coupling to the vehicle 30. Such an implementation as depicted in FIG. 11 renders performance of the system 10 less dependent upon the vehicle 30 remaining accurately along a centre of their lane of the roadway 20. Optionally, all lanes of the roadway 20 are implemented with drive coil arrangements 40 which each comprise a plurality of coils disposed mutually in a laterally displaced manner. Optionally, although the coils are shown in the foregoing as simple coils with windings disposed around a central region, more exotic coil configurations are optionally employed when implementing the present invention, for example figure-of-eight coils, "butterfly" formation coils and so forth.

Figure 12:
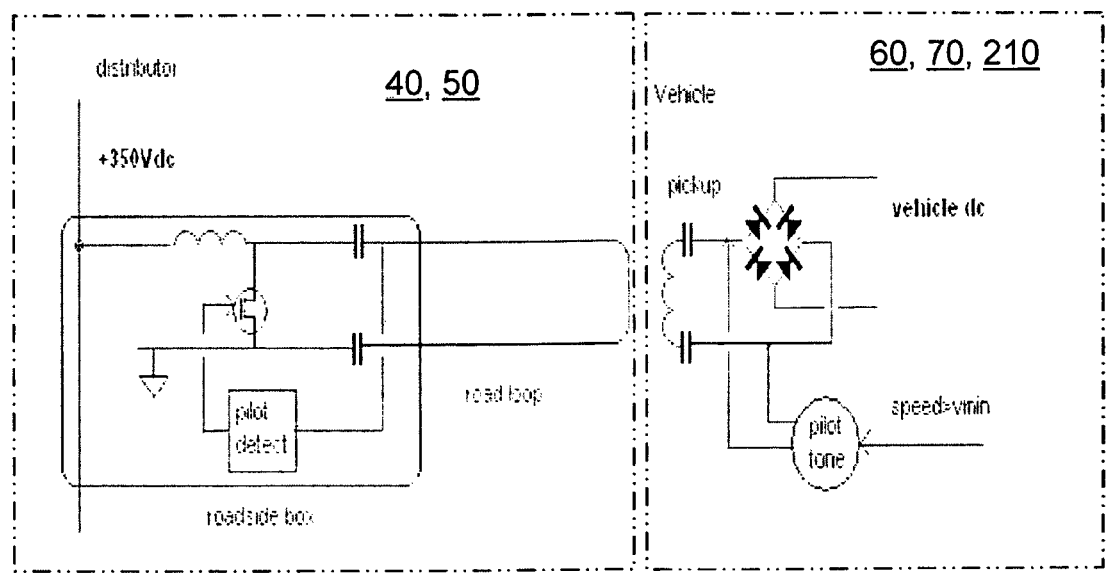
FIG. 12 is an example of a portion of the system in FIG. 1 provided with a pilot tone for controlling selection of specific sets of coils as depicted in FIG. 11.

Referring next to FIG. 12, the system 10 is optionally implemented so that the vehicle 30 includes a pilot signal generator for injecting a pilot signal into the pickup coil arrangement 60 for reception at the drive coil arrangement 40, for subsequent detection at a pilot signal detector for providing a control of a switching device of the drive unit 50 coupled to the drive coil arrangement 40. In operation, the vehicle 30 travels along the roadway 20 and injects its pilot signature into its pickup coil arrangement 60. The pilot signature couples from the pickup coil arrangement 60 to an adjacent drive coil arrangement 40 whereat it is detected and used to activate a switching device of the drive unit 50 coupled to the drive coil arrangement 40 for energizing the drive coil arrangement 40 for providing power to the vehicle 30. Such a manner of operation results in the drive units 50 along the roadway 20 only being activated when vehicles 30 are travelling spatially nearby; this results in enhanced operating energy economy for the system 10. Optionally, the pilot signal is a signal which uniquely identifies its corresponding vehicle 30, so that energy consumed by the vehicle 30 when driving along the roadway 20 can be automatically debited to a bank account of the owner and/or driver of the vehicle 30. It is thereby feasible to implement automatic road tolls depending upon power consumption required to propel vehicles 30 along the roadway 20, for example economically favouring energy efficient vehicles 30. The pilot signal is beneficially conveyed on a tatter signal in a frequency range of kHz to MHz. and preferable in a radio frequency portion of the electromagnetic spectrum, for example in an order of 100's of kHz or several MHz.

Optionally, the roadway 20 is operable to provide motive power to its corresponding vehicle 30 via the drive units 50 and associated drive coil arrangement 40 only when the vehicle 30 is travelling at greater than a threshold speed relative to the drive coil arrangement 40. The threshold speed is beneficially at least 30 km/hour, more preferably at least 40 km/hour, and most preferably at least 50 km/hour.

Figure 13:
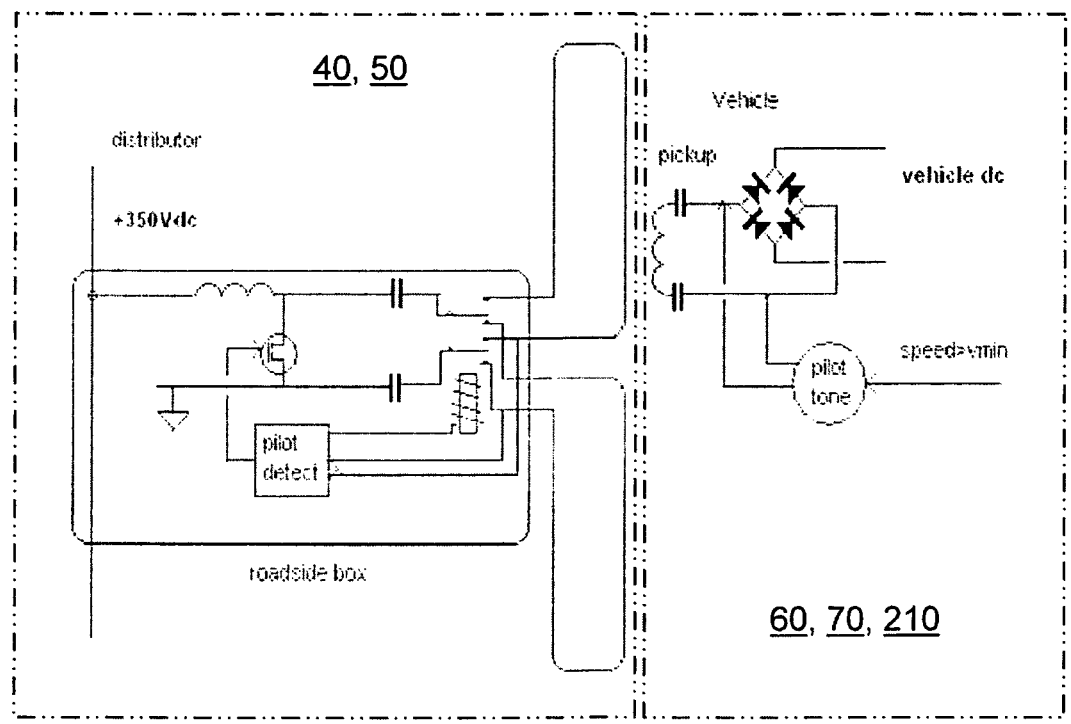
FIG. 13 is an illustration of a practical implementation of a switching circuit for selecting between sets of coils as in FIG. 11.

In FIG. 13, there is illustrated an implementation of the system 10, wherein the pilot signal injected into the pickup coil arrangement 60 is coupled to a drive coil arrangement 60 including a plurality of coils. Each coil of the drive coil arrangement 40 is coupled to a corresponding input of a pilot signal detector. The detector is operable to determine pilot signal strength at its two inputs to determine which of the pilot signals is of greatest amplitude and therefrom select a corresponding coil of the drive with arrangement 40 as well as activating one or more switching devices of the drive unit 50 to excite the selected coil into resonance to provide motive power to the vehicle 30 emitting the pilot signal from its pickup coil arrangement 60. Connection of the corresponding coil of the drive coil arrangement 40 is beneficially achieved by use of an electromagnetic relay as illustrated in FIG. 13, although solid-state switching may alternatively be employed. Although two coils are shown included for providing the drive coil arrangement 40 in FIG. 13, it will be appreciated that more than two such coils can optionally be employed with a correspondingly more complex relay arrangement for switching selectively between the coils.

Figure 14:
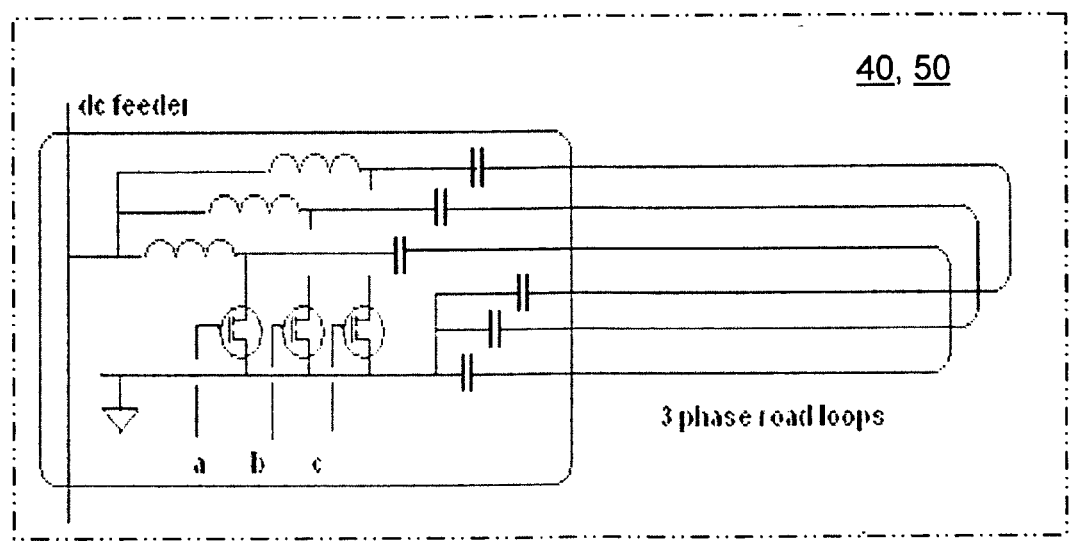
FIG. 14 is an illustration of a drive coil arrangement of the system of FIG. 1, wherein the drive coil arrangement includes three drive coils, and wherein each drive coil is furnished with a corresponding associated resonant drive circuit.

Referring next to FIG. 14, the drive coil arrangement 40 includes three coils which are each coupled to a corresponding resonant drive circuit included within the drive unit 50. Depending upon detected pilot signal amplitude as detected from the three coils, switching devices, for example Silicon Carbide FETs, of the drive unit 50 are selectively activated for driving their associated coils for achieving more efficient power transfer to the vehicle 30. Optionally, a plurality of the switching devices are energized concurrently so that resonant currents flowing in corresponding drive coils are mutually in a phased apart manner, for example in a polyphase manner, so that the drive coil arrangement 40 and its associated drive unit 50 are able to cope with a quick succession of vehicles 30 which are following mutually laterally displaced paths along a lane of the roadway 20, for example in a very busy section of the roadway 20 in rush hour conditions where the vehicles 30 are substantially bumper-to-bumper.

The system 10 is capable of being adapted to provide stationary inductive charging of vehicles 30, for example at parking locations, in garages, in domestic premises, in parking places of shopping malls and so forth. Utilization of the system 10 does not preclude the use of conventional fuel-burning vehicles on the roadway 20. Moreover, the system 10 is susceptible to being adapted to function as a domestic recharging system for electric vehicles, for hybrid combustion engine-electric motor vehicles and so forth.

The drive coil arrangement 40 is beneficially installed within the roadway 20 by cutting one or more slots into the roadway, installing cables forming turns of the coils of the coil arrangement 40 into the one or more cut slots, and then filling up the slots with filling material to retain the cables within the slots. The cables are optionally implemented as Litz wire, separately insulated multicore cable, or as an elongate bundle of thin metallic tape of film. The one or more slots are beneficial cut using rotary saws operated from robotically-controlled equipment for reducing installation cost. Alternatively, the drive coil arrangement 40 is included during initial construction of new roadways. The present invention, by way of its relatively high frequency of resonance employed as aforementioned, is capable of being implemented without a need to install ferromagnetic components in the roadway 20, namely only insulated electrical conductors for carrying resonant currents; such avoidance of ferromagnetic components renders the system 10 potentially considerably less expensive to implement than previously proposed inductive power transfer systems for roadways.

The present invention is especially suitable for use along busy sections of roadways where there is intensive traffic. Moreover, the present invention enables electric vehicles to have substantially unlimited driving range within a road network thereby avoidance distance "angst" which is pertinent for contemporary rechargeable electric vehicles which have limited travelling range per battery recharge, and which are recharged only when in a stationary state at a limited number of recharging locations. Moreover, the present invention is capable of providing an environmental benefit of enabling electric vehicles to be provided with smaller batteries, thereby reducing vehicle weight which reduces roadway surface wear when the vehicles are in operation, as well as rendering the vehicles potentially less expensive to manufacture because vehicles batteries are often a significant cost component in contemporary electric vehicles. The system 10 is capable of being employed to propel automobiles, trucks, busses, electric tricycles, agricultural equipment and similar. Optionally, the system 10 can be employed with compressed air vehicles, for example as proposed by inventor Guy Nègre, MDI Corp. and adopted by Tata Motors, India; in compressed air vehicles, there is employed a compressed air tank as an energy storage element; such an arrangement potentially completely avoids a need to employ rechargeable batteries in vehicles.

Although the system 10 is intended for use along public highways, it can also be used on private premises, for example for mass transit systems in airports, in factory premises, in hospitals, in agriculture wherein recharging of electric tractors and combine harvesters occurs at perimeters of fields whereat the drive coil arrangement 40 is disposed. It will be appreciated that the present invention is capable of being used to achieve a complete electrification of road transport systems. With electrical energy generated from safe clean Thorium LFTR reactors (as originally proposed by Dr Alvin Weinberg at Oak Ridge National Laboratory, USA), renewable energy systems such as wind turbines, solar panels and hydroelectric generators, road transport systems can be rendered Carbon Dioxide free, sustainable and avoid generation of air-borne pollution which contemporarily plagues densely populated urban areas. The present invention is also capable of reducing a risk of anthropogenically-forced climate change which is presently perceived as being one of the most significant future risks to humanity.

The present invention is especially beneficial for countries such as India which has a large population and corresponding need for cost-effective transport infrastructure, as well as large reserves of Thorium to provide safe clean nuclear power for thousands of years into the future. Additionally, Thorium LFTR provides an additional synergistic benefit of being capable of "burning up" existing nuclear waste, for example long half-life Actinides and trans-Uranic elements, to generate relatively harmless short-lived nuclear waste which only needs careful storage for about 300 years before normal handling can be resumed.

The present invention is also capable of addressing issues associated with rechargeable battery production and disposal which would otherwise represent an enormous resource challenge for the introduction of electric vehicles generally into human society were the present invention not adopted into general use.

In conclusion, the present invention is concerned with roadside fittings, roadway components and vehicle fittings. The vehicles are, for example, automobiles of which three types are especially pertinent:
(i) an electric vehicle (EV), for example a contemporary Nissan Leaf, GM Volt or similar; "Leaf" and "Volt" in this context are trademarks;
(ii) an electric hybrid vehicle (EHV), for example a contemporary Toyota Prius; "Prius" in this context is a trademark of Toyota; and
(iii) an internal combustion vehicle (IC) with one or more electric motors coupled to wheels of the vehicle which are not driven by an internal combustion engine of the vehicle.

The aforesaid system 10 provides a main mode of operation to provide a substantially continuous supply of moderate power, for example 10 kW to 20 kW for a lightweight vehicle 30, 50 kW for a truck or bus 30, directly to at least one electric motor 90 of the vehicle 30, or via an energy storage device of the vehicle 30, for example a rechargeable battery.

The present invention is intended primarily for use on highways, for example trunk roads in the United Kingdom, and interstate and urban highways in the USA. Such an implementation has a benefit in that a small portion of route mintage of roadway adapted pursuant to the present invention is capable of providing inductive power transfer to a disproportionately large portion of total road traffic; for example, in England, a highway agency trunk includes about 8000 km of roadway and supports substantially 33% of all traffic in England and newly 66% of road freight traffic. The present invention is also capable of providing benefits in terms of safety, for example road infrastructure being energized when a suitably equipped vehicle moving above a given minimum threshold speed, for example 50 km/hour.

When the drive coil arrangements 40 are installed in the roadway 20, the drive coil arrangements 40 are beneficially implemented as substantially 20-metre long sections, powered from roadside drive unit 50 disposed at intervals of 40 metres along the roadway 20. Optionally, drive loops embedded in the roadway 20 for implementing the drive coil arrangement 40 are implemented using one or more turns of 10 mm$^2$ cross-section copper cable, fabricated from 24×0.4 mm$^2$ cross-section individually insulated conductors twisted together. Beneficially, the cable is surrounded by an insulating layer having a potential breakdown rating of at least 1 kV, and thereabound a tough heat resistant external jacket to an overall outer diameter of 9.5 mm. In use, the loop is energized with 40 Amperes circulating current at a frequency of 128 kHz, for example in response to a pilot signal being received from a vehicle 30 in a proximity of the at least one loop.

The drive unit 50 is beneficially implemented as a roadside box, and optionally includes a pilot signal detection circuit, end also optionally a relay arrangement to select which drive coil arrangement 40 is to be energized. Power for operating the drive units 50 is beneficially derived from a low-voltage d.c. feed at a potential of substantially 350 Volts. Optionally, this d.c. feed is provided at 500 metre intervals along the roadway 20 from a substation included at 1 km intervals along the roadway 20. Each substation is beneficially provided with power from an overhead high tension, for example MegaVolt, transmission line. Beneficially, the substation includes a transformer and an AC-DC converter/power factor correction unit.

Beneficially, the drive unit 50 is operable to provide 20 kW power into a 5 Ohm balanced load at 128 kHz represented by the drive coil arrangement 40. A matching network including a series 22 nF capacitor, for example implemented as two 44 nF capacitors for preserving the common mode balance) is beneficially employed. For reducing loop voltages associated with the drive coil arrangements 40 in the roadway 20, the capacitor can be implemented as more than two capacitors, for example wherein the capacitors are disposed spatially around the one or more loops of the drive coil arrangement 40.

The pickup coil arrangement 60 is beneficially implemented as a planar multiturn coil as described in the foregoing, for example fabricated from ribbon cable. Beneficially, widths between centres of windings of the coil in each direction is 0.5 metres to match the drive coil arrangement 40. The pickup coil arrangement 60 is beneficially matched with a series resonant capacitor into a bridge rectifier, whose d.c. output is either connected to a d.c. bus of the vehicle 30, for example for electric or hybrid vehicles, or directly via a switch or motor controller to an electric motor for providing motive torque for the vehicle 30 when the system 10 is employed directly with an internal combustion vehicle. Optionally, a series resonant capacitor is included in series with substantially each turn 100, or small number of turns 100, to providing reduced operating voltages within the pickup coil arrangement 40 for increasing operating safety, saving cost of insulation, and also reducing coil losses resulting from interwinding capacitances. Beneficially, the capacitors are implemented as low-cost and low-loss NPO ceramic capacitors. One or more coils for the pickup coil arrangement 80 are fabricated from 30 turns of 2 mm×2 mm wire, 2 metre long turns 100, with 0.62 metres outer width and 0.38 metres inner width; the pickup coil arrangement 60 is thus susceptible to being implemented with an overall Copper weight of 2.5 kg. Optionally, each resonant capacitor 110 associated with turns 100 of the pickup coil arrangement 60 are 34 nF, implemented by coupling together in parallel five 6.8 nF 630 Volt NPO ceramic capacitors. Beneficially, the pickup coil arrangement 60 is spatially disposed at a gap in a range of 50 mm to 150 mm from the shield 70, to allow for intense magnetic fields to return via the gap to the roadway 20. Beneficially, the shield 70 is fabricated from Aluminium sheet having a thickness in a range of 0.1 mm to 1 mm, for preferably substantially 0.3 mm thick. Optionally, the shield 70 is implemented as a composite materials component including Aluminium sheet. Optionally, the sheet is perforated with holes for enabling composite material or polyurethane to bond more reliably onto the sheet from both planar faces thereof for long-term robustness. The shield 70 beneficially conforms to underwork of the vehicle 30. Optionally, a polymeric structural foam is employed to maintain the pickup coil arrangement 60 at a distance of the gap from the shield 70 in a mutually parallel configuration as illustrated in the accompanying diagrams. As aforementioned, the shield 70 spatially extends well beyond the pickup coil arrangement 70 for reducing losses arising in a steel structure of the vehicle 30, as well as ensuring that an interior volume of the vehicle 30 operable to accommodate humans complies with ICNRP guidelines. An operating clearance between a lower surface of the pickup coil arrangement 60 and an upper surface of the roadway 20 in a range of 75 mm to 100 mm is readily achievable in practice.

Optionally, a three-phase drive form the drive unit 50 is used to energize the drive coil arrangement 40 of the roadway 20, namely for enabling accommodation of larger variations in lateral positioning of the vehicle 30 along the roadway 20.

Optionally, two-phase or even three-phase coil configuration are employed for implementing the pickup coil arrangement 60. Each phase is then provided with a corresponding bridge rectifier fro providing power to a d.c. bus of the vehicle 30. Such implementation of the pickup coil arrangement 60 is also capable of rendering operation of the system 10 less influenced by lateral position of the vehicle 30 along the roadway 20.

Although embodiments of the invention are described as operating in a resonant manner, it will be appreciated that the present invention is capable of being operated in a non-resonant manner. In such a situation, the coils are arranged to exhibit a relatively low Q-factor approaching unity and/or are operated at a frequency away from their fundamental resonance.

Figure 15:
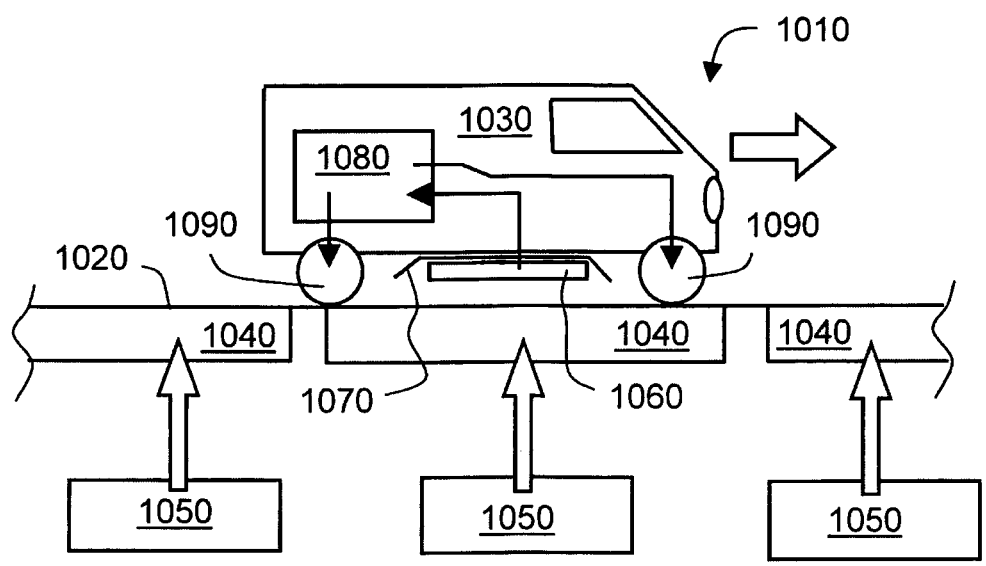
FIG. 15 is an illustration of an electric roadway system for providing power by inductive magnetic coupling to one or more vehicles travelling along a roadway.
Figure 16:
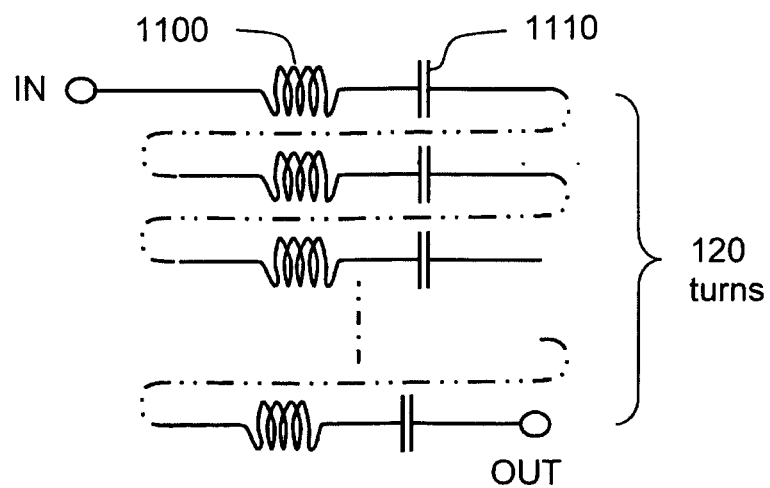
FIG. 16 is an illustration of a pickup coil arrangement of a vehicle for use in the system of FIG. 15.

Referring next to FIG. 15, there is shown an electric roadway system indicated generally by 1010. The system 1010 includes a roadway 1020 along which one or more vehicles 1030 are operable to travel. Moreover, the roadway 1020 includes at intervals therealong a plurality of drive coil arrangements 1040 coupled to associated drive units 1050. The drive units 1050 are operable to excite their associated drive coil arrangements 1040 to generate alternating magnetic fields which spatially extend above an upper surface of the roadway 1020 and are received at the one or more vehicles 1030.

Each vehicle includes a pickup coil arrangement 1060 mounted to an underside of the vehicle 1030 with an associated shield 1070 included above the pickup coil arrangement 1060 to prevent the alternating magnetic field generated in operation by the drive coil arrangement 1040 impinging within an interior volume of the vehicle 1030 wherein one or more human occupants are seated in operation. Alternating magnetic fields coupled to the pickup coil arrangement 1060 result in induced potentials and corresponding induced currents in the pickup coil arrangement 1060, namely power being coupled to the pickup coil arrangement 1060. The power is fed from the pickup coil arrangement 1060 to a power control unit 1080 which directs at least a portion of the power to one or more electric propulsion motors associated with one or more wheels 1090 of the vehicle 1030. The vehicle 1030 optionally includes a combustion system (not shown) for generating motive power for the vehicle 1030, wherein an exhaust pipe of the combustion system is mounted to an underside of the vehicle 1030 in a conventional manner, just above an upper plane of the shield 1070. The vehicle 1030 is implemented, for example, as an electric-petrol hybrid vehicle, either in parallel hybrid or series hybrid configuration.

Referring next to FIG. 18, the pickup coil arrangement 1060 beneficially includes a plurality of turns 1100 connected in series with corresponding capacitors 1110. Optionally, the pickup coil arrangement 1060 includes in a range of 20 to 400 turns, and more preferably in an order of 120 turns. Although a series connection of the windings 1400 is provided in FIG. 18, it will be appreciated that the windings 1100 and their capacitors 1110 can alternatively be coupled together in parallel in groups, and the groups are then coupled in series.

Figure 17:
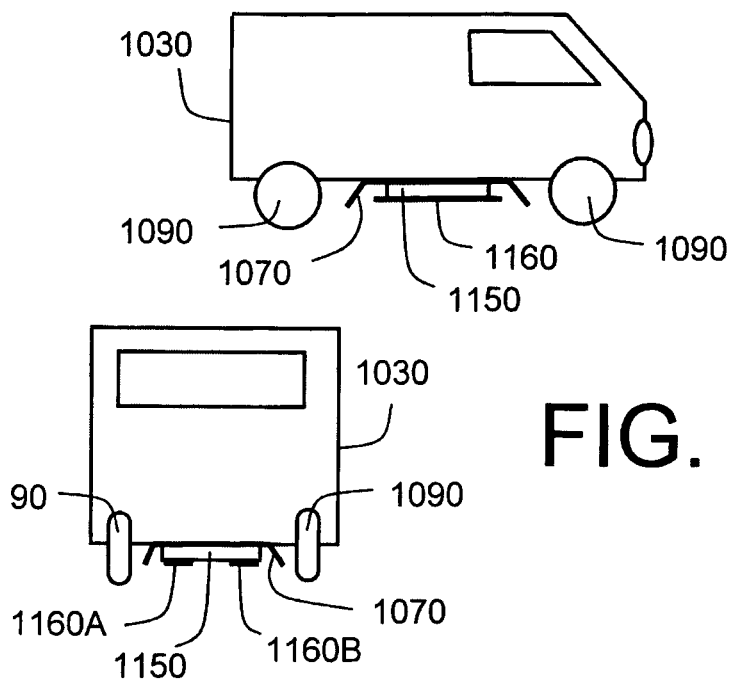
FIG. 17 is an illustration of a vehicle for use with the system of FIG. 15, wherein a pickup coil arrangement is mounted to an underside of the vehicle for receiving alternating magnetic fields generated by drive coil arrangements included in the roadway.

In FIG. 17, the vehicle 1030 is illustrated in further detail, wherein the pickup coil arrangement 1060 has its windings 1100 arranged in two elongate bundles 1160A, 1160B which are disposed in a spatially space-apart manner in respect of a lower surface of the shield 1070. The shield 1070 is manufactured from highly electrically conducting material, for example from pressed Aluminium sheet having a thickness in a range of 025 mm to 5 mm. Other metals, and metal alloys, for example Duralloy, Titanium, Zinc, Copper, can be used for fabricating the shield 1070. Optionally, the shield 1070 is implemented as a composite part, so that its metal parts are encapsulated and thereby protected from corrosion. The two elongate bundles 1160A, 1160B are mechanically supported by a supporting arrangement 1150 which is compliant to accommodate movement of one or more of the bundles 1160A, 1160B when struck by roadway debris for example. Optionally, the supporting arrangement 1150 includes one or more actuators for raising one or more of the bundles 1160A 1160B in an event that sensors of the vehicle 1030 detect one or more debris approaching the vehicle 1030 when in operation. The support arrangement 1150 is devoid of ferromagnetic components and is preferably manufactured substantially from electrically-insulating polymeric materials, for example expanded PVC foam materials or similar.

Referring next to FIG. 18, a plan view of the pickup coil arrangement 1060 is shown. The bundles 1160A, 1160B are optionally elongate in a direction of travel of the vehicle 1030 although other orientations of the bundles 1160A, 1160B are also feasible to employ. Optionally, the bundles 1160A, 1160B are mutually coupled together via disconnectable connectors 1230A, 1230B and an associated cable link 1240 at a first end of the bundles 1160A 1160B, and via disconnectable connectors 1260A, 1260B and an associated capacitor box 1200 for the one or more capacitors 1110 at a second end of the bundles 1160A, 1160B. The bundles 1160A, 1160B are supported onto the shield 1070 by way of the supporting arrangement 1150 (not shown in FIG. 18). The shield 1070 is a generally planar component including a downwardly-directed outer peripheral lip 1310 and at least one substantially central hole 1300, substantially mid-way between the bundles 1160A, 1160B, for example as illustrated, with its associated downwardly-directed inner peripheral lip 1320. Optionally, the at least one substantially central hole 1300 has corners which are rounded to reduce a risk of stress concentration arising at the corners when the shield 1070 is employed in operation on the vehicle 1030. The shield 1070 is beneficially fabricated from metal sheet, for example Aluminium sheet, although composite materials including metal sheet or wire mesh can be employed. Optionally, the at least one central hole 1300 is also provided with a downwardly-directed inner peripheral lip 1320. The at least one central hole 1300 enables access to other items underneath the vehicle 1030, for example an exhaust system, without there being a need to demount the pickup coil arrangement 1060 and its associated shield 1070.

Optionally, the bundles 1160A, 1160B are coupled together as a unitary component devoid of the connectors 1230A, 1230B, 1260A, 1260B. Optionally, the bundles 1160A, 1160B and their associated one or more capacitors 1110 are operable to function as a resonant circuit having a fundamental resonant frequency in a range of 20 kHz to 140 kHz, and having a Q-factor in a range of 10 to 1000. Optionally, the at least one hole 1300 has an area corresponding to at least 5% of a total area of the shield 1070, more preferably at least 10% of the total area of the shield 1070, and most preferably at least 25% of the total area of the shield 1070. The shield 1070 in its plane extends further than the bundles 1160A, 1160B as illustrated in cross-section in FIG. 19.

Figure 19:
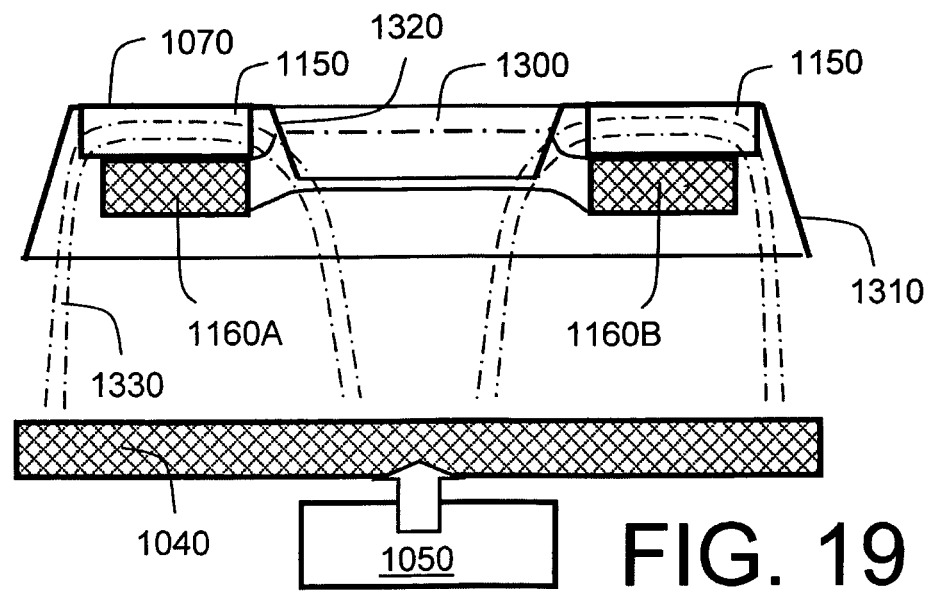
FIG. 19 is an illustration of the pickup coil arrangement of FIG. 18 in side cross-sectional view.

In FIG. 19, magnetic field lines are denoted by 1330 and extend from the drive coil arrangement 1040 of the roadway 1020, past the lips 1310, 1320 and around a rear of the bundles 1160A, 1160B in a region in which the supporting arrangement 1150 is disposed. Optionally, one or more of the lips 1310, 1320 are implemented at a non-orthogonal angle in respect of a plane of the shield 1070, for example as illustrated, for assisting to guide magnetic flux; the lips 1310, 1320 beneficially subtend in a range of 60° to 90° relative to a general plane of the shield 1070. The supporting arrangement 1150 is beneficially devoid of electrically conducting materials. Optionally, the supporting arrangement 1150 is implemented from expanded PVC foam or similar elastic plastics material with closed pores, to avoid moisture ingress therein. Moreover, the supporting arrangement 1150 is beneficially devoid of ferromagnetic components which are susceptible to saturating magnetically in operation and therefore giving rise to parasitic energy loss, namely localized inductive heating. The shield 1070 functions as a Faraday screen, and use of Aluminium is especially beneficial on account of its diamagnetic characteristics, high electrical conductivity, low cost, low density (i.e. light weight) and ease with which it can be formed during manufacture to provide one or more of the lips 1310, 1320. The lips 1310, 1320 optionally have a depth substantially corresponding to a thickness of the supporting arrangement 1150. During manufacture, the shield 1070 is fabricated by press-forming, explosion forming or similar. Apertures in the shield 1070, for example the at least one hole 1300, are formed by punching operations, laser cutting or mechanical cutting. The shield 1070 is optionally fabricated from pre-laminated materials including a combination of metallic layers and polymeric material layers which are then cut and contoured to form the at least one hole 1300, and optionally one or more of the lips 1310, 1320.

The at least one hole 1300 allows immediate access to other components of the vehicle 1030 via the underside of the vehicle 1030, for example exhaust system components, suspension system components and so forth. Optionally, the at least one hole 1300 is provided with a removable cover, for example a removable plastics material cover, for protecting the underside of the vehicle 1030 but allowing access for maintenance purposes.

Optionally, the bundles 1160A, 1160A are fabricated from Litz wire, individually isolated mufti-core cables, individually insulated tape and/or ribbon cable. The capacitors 1110 are beneficially ceramic capacitors exhibiting low dielectric loss at an operating frequency of around 100 kHz. Moreover, the pickup coil arrangement 1060 and its associated shield 1070 are beneficially provided as an OEM production assembly or alternatively an assembly that can be retrofitted to existing vehicles, for example existing electric vehicles for increasing their range. Moreover, a plurality of the pickup coil arrangement 1060 and associated shield 1070 can be employed on large vehicles, for example buses and delivery trucks, for example where power transfer of 100 kW or more are required. Optionally, the pickup coil arrangement 1060 and its associated shield 1070 with at least one hole 1300 is implemented to have a plane area in an order of 1 metre×2 metres, and is beneficially mounted to vehicles 1030 so that an elongate direction of the pickup coil arrangement 1060 is substantially aligned along a direction of normal forward travel of the vehicles 1030. The pickup coil arrangement 1060 and its shield 1070 can be implemented in miniature form for charging low-powered electric vehicles, for example electric tricycles, electric bicycles, invalid scooters and such like.

When the vehicle 1030 is implemented as an internal combustion vehicle, for example a parallel hybrid electric-combustion vehicle, the at least one hole 1300 can lie over and along a length of an exhaust system of the vehicle 1030, thereby enabling required cooling of the exhaust system to be achieved, whilst also avoiding overheating of the pickup coil arrangement 1060 and an underside of the vehicle 1030. Referring to FIG. 20, an exhaust pipe 1400 of the exhaust system is routed via the at least one hole 1300, for example for cooling and access purposes. In an inset diagram in FIG. 20, there is shown a spatial distribution of a magnitude of eddy currents induced in the shield during operation of the pickup arrangement 1060.

Most significant eddy current magnitudes arise in immediate proximity to the bundles 1160A, 1160B, namely denoted by 1460, whereas spatial regions 1460 laterally further removed from the bundles 1160A, 1160B have less eddy currents induced therein in operation. Regions denoted by 1470 have relatively little eddy current flow therein when in operation. It will be appreciated therefrom that including the one or more holes 1300 saves weight, saves manufacturing material, provides improved cooling, and provides increased access without degrading safely in any significant way.

Referring next to FIG. 21, there is shown an electrical roadway system indicated generally by 2010. The present invention is concerned with an electrical power coupling apparatus denoted by 2060, 2070 for use in conjunction with electric vehicles 2030 which are operable to receive their electrical power from electric roadways 20 via coil arrangements 2040 embedded in the electric roadways 2020; the coil arrangements 2040 are beneficially operated in non-resonant mode, alternatively resonant mode, or a combination thereof. The electrical power coupling apparatus 2060, 2070 is constructed so that it is robust and safe in use, is straightforward to install and/or repair, is inexpensive and is light-weight. Moreover, the electrical power coupling apparatus 2060, 2070 is optionally compliantly mounted to the electric vehicle 2030 and/or actuated in respect of the vehicle 2030 for avoiding damage from debris on the roadway 2020. The electrical power coupling apparatus 2060, 2070 is beneficially mounted to an underside of the vehicle 2030 as illustrated and includes an electrically conductive shield 2070, for example fabricated from Aluminium sheet metal or similar conductive material, and a pickup coil 2060 with associated capacitors. The pickup coil 2060 is optionally operated at resonance, although it is optionally also operated off-resonance. The shield 2070 largely prevents magnetic fields from the resonant coil arrangement 2040 inducing eddy currents within a metallic framework of the vehicles 2030.

In operation, the pickup coil 2060 receives magnetic fields from the coil arrangements 2040 of the roadway 2020 and converts potentials induced in the pickup coil 2060 via a power conditioning unit 2080 into motive power to apply torque via electric motors to wheels 2090 of the vehicle 2030; optimally, the motors are hub-mounted switched-reluctance motors or induction motors. Optionally, the pickup coal 2060 is operated at resonance for improving power coupling efficiency. The system 2010 is of benefit in that it enables electric vehicles 2030 to be propelled along the roadway 2020 at elevated speeds, for example 120 km/hour, without the vehicles 2030 needing to be provided with large heavy onboard batteries for energy storage purposes. Avoidance of such on-board batteries renders the vehicles 2030 less expensive to manufacture, able to travel an unlimited range within the roadway 2020, and safer because a total kinetic energy of the vehicles 2030 is reduced because they are not required to have aforesaid heavy high-capacity batteries on-board. The roadway 2020 is beneficially provided with the resonant drive coil arrangement 2040 devoid of ferromagnetic material and coupled to associated drive units 2050; optionally, the drive coil arrangements 2040 are implemented via cables installed within slots cut into an upper surface of the roadway 2020, and retained in position by filling the slots with asphalt or similar after the cables are installed. The system 2010 is especially beneficial for use on busy routes, for example ring-roads around cities and motorways, wherein the cost of installing the drive coil arrangements 2040 and their associated drive units 2050, is cheaper than duplicating large heavy rechargeable batteries in each of the vehicles 2030. By such an approach, the vehicles 2030 themselves can be rendered largely maintenance free, namely do not require their batteries to be replaced after circa 1000 full discharge and recharge cycles which pertains for contemporary lithium and sealed Lead Acid (SLA) vehicle batteries.

Referring next to FIG. 22, there are illustrated details of the pickup coil 2060. Each coil 2060 beneficially includes in a range of 30 to 400 turns 2100, more preferably in a range of 60 to 200 turns 2100, and most preferably substantially 120 turns 2100. Each turn 2100 is beneficially coupled via a series capacitor 2110 for ensuring an even potential gradient within the pickup coil 2060. The capacitors 2100 are beneficially low-loss ceramic and/or polymer dielectric capacitors. The pickup coil 2060 is beneficially implemented to exhibit a fundamental resonant frequency in a range of 20 kHz, to 200 kHz, more preferably in a range of 60 kHz to 140 kHz. The turns 2100 are beneficially wound to define a centre region for receiving magnetic flux and having an area in a range of 1 m² to 5 m², depending upon size and performance required for the vehicle 2030.

In FIG. 23, a general illustration of the vehicle 2030 is provided. From an underside of the vehicle 2030 downwards, the electrical power coupling apparatus 2060, 2070 comprises the shield 2070, a mounting arrangement 2150 and then windings 2160 of the pickup coil 2060. The shield 2070 is beneficially provided with a downwardly orientated peripheral ftp as illustrated for shielding an interior of the vehicle 2030 most effectively from magnetic fields projected from the roadway 2020. Optionally, the electrical power coupling apparatus 2060, 2070 is operated in a resonant mode. The electrical power coupling apparatus 2060, 2070 generally occupies an underside area of the vehicle between wheels 2090 of the vehicle 2030. Moreover, the mounting arrangement 2150 serves to provide a spatial separation between the shield 2070 and the windings 2160 of the pickup coil 2060. In a lower portion of FIG. 23, it will be apparent that the windings 2160 are implemented in two planar elongate bundles denoted the 2160A, 2160B, wherein elongate axes of the bundles 2160A, 2160B are generally substantially parallel to a forward direction of travel of the vehicle 2030.

Referring next to FIG. 24, an embodiment of the pickup coil 2060 is illustrated in plan view, for example looking upwards from an upper surface of the roadway 2020 towards an underside of the vehicle 2030. The pickup coil 2060 includes two aforesaid elongate bundles 2160A, 2160B disposed with their elongate axes in a substantially parallel configuration as illustrated. Each bundle 2160A, 2160B includes a plurality of turns 2100 as aforementioned and terminated in couplers; the bundle 2160A has couplers 2230A, 2260A via flying leads 2210, and the bundle 2160B has couplers 2230B, 2260B via flying leads 2220. The couplers 2230A, 2230B are coupled together via a cable link 2240. Moreover, the couplers 2260A, 2260B are coupled together via leads 2270 to a capacitor bank 2200 for implementing the capacitors 2110 of FIG. 22. Optionally, to reduce a number of different components to be manufactured when implementing the pickup coil 2060, the bundles 2160A, 2160B are beneficially mutually identical and mounted to the vehicle 2030 in a mutually 180° rotated disposition as illustrated. The turns 2100 of the bundles 2160A, 2160B are beneficially manufactured using ribbon cable, Litz wire wherein individual conductors are insulated, metallic tape wherein each layer of tape is individually insulated or similar. The wire or tape is beneficially one or more of: Copper, Aluminium, Silver plated Copper, Zinc, Tin, or similar highly electrically conductive material. Beneficially, the wires are potted in a polymeric material to protect the turns 2100 from corrosion, for example salt spread on the roadway in wintertime; beneficially, the polymeric material is polyurethane which is substantially chemically inert and can withstand millions of mechanical flexures without experiencing work-hardening degradation. The connectors 2230A, 2230B, 2260A, 2260B enable the pickup coil 2060 to be repaired by replacing a damaged bundle 160 without needing to replace the entire pickup coil 2060; this saves material costs, labour costs and reduces environmental impact of the vehicle 2030. Optionally, the capacitor bank 2200 is mounted to an underside structure of the vehicle 2030 for cooling purposes to prevent dielectric losses within the capacitors 2110. Although the pickup coil 2060 is illustrated as being implemented from two bundles 2160A. 2160B, it will be appreciated that more than two bundles are optionally employed for implementing the windings 2100.

For optimal power transfer, it is desirable that the pickup coil 2060 is relatively close to the drive coil arrangements 2040 of the roadway 2020. However, as illustrated in FIG. 25, situations can arise where the vehicle 2030 encounters debris 2310 or similar on the upper surface of the roadway 2020 which could potentially cause impact damage to the pickup coil 2060. For reducing a risk of impact damage when the vehicle 2030 is in operation, the bundles 2160 of the pickup coil 2060 are mounted upon a mounting arrangement denoted by 2150, namely in a spaced-apart configuration from the shield 2070. The mounting arrangement 2150 also provides in operation a path for intense magnetic fields coupling to the pickup coil 2060, and is beneficially implemented using non-conducting non-ferromagnetic materials, for example substantially plastics materials. Optionally, the bundles 2160A, 2160B are disposed at a slightly inclined angle relative to the upper surface of the roadway 2020, wherein a front end of the bundles 2160A, 2160B near a front of the vehicle 2030 are slightly further from the road surface than a rear end of the bundles 2160A, 2160B from the road surface, and the mounting arrangement 2150 is compliant, such that the bundles 2160A, 2160B are elastically deflected upwardly when struck by the debris 2310, in a manner of a ski as employed in winter sports. Optionally, the bundles 2160A, 2160B have their elongate axes disposed at an angle in a range of 0° to 5° relative to a plane of the road surface, more preferably in a range of 1° to 3° relative to a plane of the road surface. Optionally, the mounting arrangement 2150 is actuated for lowering the bundles 2160A, 2160B in a controlled manner, with a quick-acting release mechanism for retracting the bundles 2160A, 2160B from a lower position denoted by 2160D to an upper position denoted by 2160R. Optionally, the bundles 2160A, 2160B are implemented so that they are gradually upwardly curved towards a front end of the vehicle 2030 when mounted upon the vehicle 2030 for rendering the bundles 2160A, 2160B less susceptible to suffer damage from impact of the debris 2310. Optionally, the vehicle 2030 is provided with one or more sensors 2300 disposed at or near the front of the vehicle 2030 for detecting the debris 2310 and causing the mounting arrangement 2150 to retract the bundles 2160A, 2160B rapidly from the lower position 2160D to the higher position 2160R to prevent impact damage occurring in respect of the debris 2310. The one or more sensors 2300 are beneficially implemented as one or more of: microwave sensors such as Doppler radar, optical sensors such as scanned laser beams and associated detectors, mechanical contact sensors such as sprung downwardly-directed levers, ultrasonic sensors end similar. For example, the mounting arrangement 2150 includes associated therewith an electric motor coupled via a magnetic clutch to a lowering mechanism for lowering the pickup coil 2060 to the lower position 2160D against a force of a returning spring; when the one or more sensor 2300 detect in operation a presence of the debris 2310, the magnetic clutch is promptly disengaged cause the pickup coil 2060 to be rapidly flipped to the position 2160R, thereby resulting in the pickup coil 2060 not impacting the debris 2310. After the debris 2310 have passed, the pickup coil 2060 is then lowered again to the lower position 2160D to resume efficient inductive power coupling to propel the vehicle 2030.

Optionally, the shield 2070 and the pickup coil 2060 are implemented as a unit which can be retrofitted to vehicles 2030. Optionally, the shield 2070 and the pickup coil 2060 are implemented as a unit which can be replaced as an integral item for repair or maintenance. Optionally, for repair, when only one of the bundles 2160A, 2160B is damaged, it is feasible to unplug the damaged bundle 2160A, 2160B and replace it with a corresponding replacement bundle.

The electrical power coupling apparatus 2060, 2070 in association with its power conditioning unit 2080 is capable of being employed in vehicles 2030 having motor power in a range of 2 kW (for example electric scooters and trikes, electric golf buggies and electric delivery vehicles), to 100 kW (for example, for freight trucks, for buses, for tanker trucks and so forth) or even greater. Such use requires that a magnetic field receiving area of the pickup coil 2060 and its shield 2070 are chosen accordingly. Optionally, a large vehicle 2030 such as a truck is provided with a plurality of electrical power coupling apparatus 2060, 2070 such that malfunction of any given electrical power coupling apparatus 2060, 2070 does not immobilize the large electric vehicle 2030, but merely reduces its total available motive power. Moreover, the large vehicle 2030 optionally includes an electrical storage battery and/or fuel cell arrangement for enabling the vehicle 2030 to travel when remote from the roadway 2020. Furthermore, the vehicle 2030 includes a combustion engine, for example a piston engine and/or gas turbine, for propelling the large vehicle 2030 when remote from the roadway 2020. When the vehicle 2030 is travelling along the electric roadway 2020, the vehicle 2030 employs one or more of its pickup colts 2060 for receiving electric power from the roadway 2020, thereby avoiding a need to employ combustible fuels for providing motive force.

The vehicle 2030 beneficially includes a pilot signal generator which generates a signal for receipt at the drive coil arrangements 2040 and/or their associated drive units 2050. Receipt of the pilot signal when the vehicle 2030 approaches a given drive coil arrangement 2040 when travelling enables the drive coil arrangements 2040 to be energized selectively, thereby conserving power and rendering the system 2010 more energy efficient. Optionally, the pilot signal includes an indication of a speed of the vehicle 2030, such that the drive coil arrangements 2040 are not energized when the vehicle 2030 is travelling below a defined minimum threshold speed, for example as determined from a speedometer of the vehicle 2030 and/or from its GPS navigation system.

The present invention enables the World to cope with challenges of "peak oil" and potential anthropogenically-forced climate change. Energy for energizing the drive units 2050 is optionally generated from Thorium LFTR nuclear reactors, wherein the World has readily accessible reserves of Thorium sufficient to power the World at contemporary rates of energy use from fossil fuels for a period in excess of a hundred thousand years. Such Thorium LFTR's are also capable of transmuting, and thereby rendering relative safe, contemporary stockpiles of dangerous nuclear waste, for example long half-life Actinide (trans-Uranic) nuclear waste. The present invention thus is capable of contributing to a sustainable and environmentally clean future for the World.

The present invention is also capable of being used for rapid wireless battery-charging apparatus, for example in domestic garages, automobile parks, shopping malls, laybys and similar.

In conclusion, the pickup coil 2060 is a planar multi-turn coil, optionally implemented as a plurality of cable bundles which are individually mutually detachable to purposes of repair or maintenance. The pickup coil 2060 is beneficially optionally implemented such its width between centres of the windings in each direction is an order of 0.5 metres to match road loops of the drive coil arrangement 2040. The windings of the pickup coil 2060 is matched with a series capacitor into a bridge rectifier which provides d.c. power to recharge the vehicle 2030 and/or to propel the vehicle 2030. The series capacitor is optionally distributed between each turn, although a given capacitor shared between a plurality of turns, or each turn having a plurality of capacitors are also feasible configurations for the pickup coil 2060; such an arrangement is keeping of a magnitude of voltages developed in the pickup coil 2060 in operation, thereby increasing operating safety. Cost savings and weight of installation, and reducing coil losses as a result of interwinding capacitances can be ameliorated by employing such configurations for the pickup coil 2060. Beneficially, low-cost NPO ceramic capacitors are employed for implementing the pickup coil 2060. Optionally, the pickup coil 2060 is implemented to include 30 turns of 2 mm² cross-section, namely nineteen conductors of 0.4 mm diameter, with 0.62 metres lateral outer width D1 and with 0.38 metres lateral inner width D2 in respect of the bundles in a direction orthogonal to a forward direction of travel of the vehicle 2030 as illustrated in FIG. 26. Beneficially, the windings are implemented using ribbon cable such that each turn effectively encloses a mutually similar central magnetic flux area. When employed in a resonant mode, the turns of the pickup coil 2060 are each beneficially tuned using a 34 nF capacitor, for example conveniently implemented using rive 6.8 nF capacitors coupled mutually in parallel. However, it will be appreciated that the turns of the pickup coil 2060 are optionally coupled together in a parallel-series arrangement as illustrated in FIG. 27, for example six groups 2350 of five parallel endings 2100 with associated series capacitors 2110. It is important that the total e.m.f. generated in operation across each series chain of inductor L and capacitor C, namely the winding 2100 and its capacitor 2110, is substantially the same; this can be achieved by making the turns 2100 to have a mutually similar area and shape, and staggering the turns 2100 across the coil arrangement 2000 rather than spiral winding the turns 2100.

Magnetic flux present in operation a central region of the pickup coil 2060 is deflected by eddy currents induced in the shield 2070 to pass in a region, denoted by G in FIG. 25, between the pick coil 2060 and the shield 2070, namely the region being at least in part occupied by the aforementioned support arrangement 2150. When the region G is too deep in a vertical direction, this adds excessively to a size of the vehicle 2030. Conversely, when the region G is too shallow in the vertical direction, inefficient return of flux to the roadway 2020 will occur. There is thus a substantially optimal height of the region G, for example in a range of 75 mm to 125 mm, end more preferably in an order of 100 mm. Optionally, the region C occupied at least in part of the support arrangement 2160 is filled with structural foam, for example manufactured from polymeric plastics materials, for example expanded polyvinyl chloride (PVC) foam which is also beneficially closed-pore and fire retardant. Optionally, the shield 2070 is fabricated from substantially 0.3 mm thick Aluminum sheet, optionally perforated, and encapsulated in composite polymer material. The shield 2070 enables the vehicle 2030 to amply to ICNRP guidelines in respect of human occupants of the vehicle 2030 and their exposure to alternating magnetic fields.

Optionally, the pickup coil 2060 is implemented as a plurality of coil sets which can be selectively coupled to a one or more bridge rectifiers, for example via switching relays, to enable the vehicle 2030 in operation to cope with non-centring along the roadway 2020, for example when executing an overtaking manoeuvre.

Referring to FIG. 28, there is shown an electric roadway system indicated generally by 3010. The system 3010 includes a roadway 3020 along which one or more vehicles 3030 are operable to travel. Moreover, the roadway 3020 includes at intervals therealong a plurality of drive coil arrangements 3040 coupled to associated drive units 3050. The drive units 3050 are operable to excite their associated drive coil arrangements 3040 to generate alternating magnetic fields which spatially extend above an upper surface of the roadway 3020 and are received at the one or mare vehicles 3030.

Each vehicle includes a pickup coil arrangement 3060 mounted to an underside of the vehicle 3030 with an associated shield 3100 included above the pickup coil arrangement 3060 to prevent the alternating magnetic field generated in operation by the drive coil arrangement 3040 impinging within en interior volume of the vehicle 3030 wherein one or more human occupants are seated when the vehicle 3030 is in operation. Alternating magnetic fields coupled to the pickup coil arrangement 3060 result in induced potentials and corresponding induced currents in the pickup coil arrangement 3060, namely power being coupled to the pickup coil arrangement 3060. The power is fed from the pickup coil arrangement 3060 to a power control unit 3110 which directs at least a portion of the power to one or more electric propulsion motors associated with one or more wheels 3120 of the vehicle 3030. The vehicle 3030 optionally includes a combustion system (not shown) for generating motive power for the vehicle 3030, wherein an exhaust pipe of the combustion system is mounted to an underside of the vehicle 3030 in a conventional manner, just above an upper plane of the shield 3100. The vehicle 3030 is implemented, for example, as an electric-petrol hybrid vehicle, either in parallel hybrid or series hybrid configuration.

The pickup coil arrangement 3060 is mounted in respect of the shield 3100 via a trapezoidal pivoting-arm arrangement including a plurality of pivotable members 3080, for example two on a left-side of the vehicle 3030 and two on a right-side of the vehicle 3030 as illustrated. Optionally, other numbers of pivotable members 3080 can be employed, for example one pivotable member 3080 centrally at a front of the pickup coil arrangement 3060, and two side pivotable members 3080 towards a rear of the pickup coil arrangement 3060. The pivotable members 3080 are secured via pivotable joints 3070, and are operable to enable the pickup coil arrangement 3040 to swing backwards and upwards when struck by roadway debris or similar. Optionally, the pivotable members 3080 have only a single degree of freedom of motion, namely rotational motion. Alternatively, the pivotable members 3080 have a plurality of degrees of freedom of motion, namely rotational motion and translational motion, for example as arises is one or more of the members 3080 are implemented using chains or cable. At a rear end of the pickup coil arrangement 3060 are included one or more freely-rotatable idle wheels or rollers 3090, for example freely-rotatable light-weight carbon-fibre wheels including inflated tyres thereon. Such an implementation of a mount for the pickup coil arrangement 3060 enables the pickup coil arrangement 3060 to be maintained safely close to an upper surface of the roadway 3020 in operation, for achieving highly efficient inductive power transfer, for example resonant inductive power transfer, whist protecting the pickup coil arrangement 3060 from impact damage by enabling it to move backwards and upwards, namely in a swinging manner, to retract when struck by debris and/or the one or more idle wheels 3090 engage onto such debris as illustrated in FIG. 31. The debris can be, for example, snow, gravel, miscellaneous automotive parts which have fallen onto the roadway 3020, and surface roughness caused by pot holes and similar present in an upper surface of the roadway 3020. Beneficially, the plurality of pivotable members 3080 are fabricated from robust insulating plastics materials, for example epoxt-reinforced fibreglass, the electrical windings of the pickup coil arrangement 3060 are supported onto a robust frame implemented in insulating plastics material which hangs from the pivotable members 3080 which are optionally restricted in angular movement to assume a backward swept orientation as illustrated in FIG. 28 and FIG. 31. The aforesaid robust frame is beneficially of planar form, optionally with a hole in a central region thereof for enabling rapid access to central underside portion of the vehicle 3030 and for rendering the frame lighter in weight and requiring less material for its manufacture.

Referring next to FIG. 29, the pickup coil arrangement 3060 is optionally implemented as a non-resonant pickup coil in its simplest implementation. Alternatively, the pickup coil arrangement 3060 is implemented as a resonant circuit, for example as a plurality of series resonant circuits, wherein each series resonant circuit comprises an inductor 3150 and a capacitor 3160. Optionally, the plurality of series resonant circuits are themselves arranged in series. Alternatively, the plurality of resonant circuits are arranged into a plurality of groups, wherein the series resonant circuits are mutually coupled in parallel within each group, and the plurality of groups are coupled in series. Such series resonant circuits are capable of providing an especially efficient implementation of the pickup coil arrangement. Beneficially, the pickup coil arrangement 3060 includes in a range of 50 to 200 turns, more preferably substantially 120 turns. The turns are beneficially implemented using a ribbon-cable form of cables to ensure accurate matching of resonant frequency of the plurality of series resonant circuits.

Referring next to FIG. 30, there is illustrated two side views of a given vehicle 3030 wherein the shield 3100 is attached in a fixed manner to an underside of the given vehicle 3030 having a plurality of wheels 3120. The pickup coil arrangement 3060 on its supporting frame is mounted in a backwardly swinging manner via a plurality of pivotal members 3080 and via associated pivot joints 3070 to the underside of the given vehicle 3030. At a rear of the supporting frame is included one or more idle wheels 3090 as aforementioned. When one or more debris 3200 are encountered when driving the vehicle 3030, the one or more idle wheels 3090 are raised as illustrated causing the supporting frame to move with its plane remaining substantially parallel to the underside of the vehicle 3030 and also remaining substantially parallel to an upper surface of the roadway 3020. Optionally, a front edge of the supporting frame is provided with an upwardly-directed lip (not shown in FIG. 30) for assisting the supporting frame to swing backwards when debris teller than a plane of the supporting frame are likely to be encountered along the roadway 3020. Optionally, the supporting frame is raised using an actuator by way of a backward swinging motion when the given vehicle 3030 is required to execute a reversing movement, for example when parking, to avoid any risk of damaging the supporting frame on road surface debris or potholes. Optionally, the supporting frame is provided with at least one oil damper to prevent any tendency for the supporting frame to flap in response to air turbulence occurring under the given vehicle 3030 when travelling at elevated speeds along the roadway 3020; a hole present in a central region of the supporting frame of the pickup coil arrangement 3060 is beneficially optionally included to assist the supporting frame to remaining stable in position when subject to considerable turbulence underneath the vehicle 3030 when travelling at high speeds, for example 140 km/hour.

At a bottom of FIG. 30, there is shown a rear view of the given vehicle 3030 wherein a row of freely rotatable idle wheels or rollers 3090 are included at a rear of the supporting frame. An advantage with the plurality of idle wheels or rollers 3090 is that wear is spread across the wheels or rollers 3090 and failure of a given wheel or roller 3090, for example jamming due to occluding material or puncture of its tyre, does not prevent operation of the pickup coil arrangement 3060. A failed or puncture wheel or roller 3090 will be abraded away so that it cannot hinder operation of the vehicle 3030, whereas a remainder of the wheels or rollers 3090 which are still functioning will continue to support the supporting frame at a required distance from the upper surface of the roadway 3020. Beneficially, there are in a range of 2 to 10 supporting wheels or rollers 3090, more preferably in a range of 3 to 7 supporting wheels or rollers 3090.

Referring to FIG. 32, there is illustrated in detail an example implementation of the pickup coil arrangement 3060, together with its associated shield 3100, as seen from the upper surface of the roadway 3020 looking upwards. In FIG. 33, there is a corresponding view of the pickup coil arrangement 3060 and its associated shield in cross-section, looking along an elongate axis of the vehicle 3030. The shield 3100 is beneficially fabricated from Aluminium sheet having a thickness in a range of 0.2 mm to 2 mm, more preferably in a range of 0.25 mm to 1 mm. Moreover, the shield 3100 includes a central hole 3350 for allowing cooling and access to an underside of the vehicle 3030. The shield is bent to provide a peripheral downward lip 3370 at a periphery of the hole 3350. Moreover, the shield 3100 at its outer periphery is downwardly bent to provide a peripheral lip 3360. The lips 3370, 3360 assist to reduce magnetic field penetration into the vehicle 3030 wherein one or more personnel are present when the vehicle 3030 is in operation. The pickup coil arrangement 3060 includes a supporting frame as aforementioned onto which the row of wheels or rollers 3090 are mounted at a rear end of the supporting frame. Moreover, the inductors 3150 of the pickup coil arrangement 3060 are implemented as turns of wire which are arranged around the hole 3350 and a corresponding hole in the supporting frame as illustrated. Furthermore, the turns of wire are optionally disposed as two bundles 3250A, 3250B with connectors 3280A, 3280B and associated coupling wires 3270, 3280 at a front end of the supporting frame. Additionally, the bundles 3250A, 3250B are coupled via their leads 3270, 3280 and connectors 3290A, 3290B respectively to a capacitor box wherein the capacitors 3160 are housed. The plurality of members 3080 are pivotally mounted via pivotal joints 3070 to the supporting frame and via the shield 3100 to a rigid portion of the underside of the vehicle 3030, for example to a suitable location on its chassis. Implementation of the two bundles 3250A, 3250B with connectors 3280A, 3280B and associated coupling wires 3270, 3280 is beneficial in that damage to the one or more of the bundles 3250A, 3250B can be repaired by replacing one or more of the bundles 3250A, 3250B, for example as standard replacement parts. Optionally, a front end of the supporting frame is provided with an upwardly-turned lip to render the supporting frame more robust to impact from road debris.

In FIG. 33, it will be appreciated that magnetic field lines 3400 coupling energy from the roadway 3020 to the pickup coil arrangement 3060 are intense, especially in a region between the bundles 3250A, 3250B and the shield 3100 as illustrated. It is desirable that the supporting frame, the pivotal joints 3070 and the members 3080 are fabricated from non-conducting non-ferromagnetic materials, for example from fibre-reinforced polymeric plastics materials. Optionally, idle wheels or rollers 3090 are additionally, or alternatively, included at other positions in respect of the supporting frame for the pickup coil arrangement 3060, for example at a front or middle portion thereof.

The present invention enables simple electric vehicles to be produced which are susceptible to unlimited travelling distance, which are compact and well adapted to dense urban areas. It is estimated that, within the next 30 years, a majority of Earth's human population will be living in densely populated urban areas where it will be essential to reduce air pollution, reduce noise, provided transport based upon renewable energy resources and also provide compact vehicles which are easy to park and manoeuvre. The present invention is capable, at least in part, of simultaneously addressing all these potential future human population and environmental issues.

Safe

In overview, electrical roadway apparatus pursuant to the present invention are intended to be implemented along sections of roadways, in automobile parking areas and even domestically, for coupling electrical power in an inductive manner to electric road vehicles and/or electric hybrid road vehicles and similar. For example, the electrical roadway apparatus is intended to be widely employed win a road network in a post-Carbon society wherein electrical power is generated from one or more of:

(a) renewable energy sources, for example wind turbines, wave power generators, solar panels, geothermal generators and tidal energy sources, and
(b) Thorium LFTR safe clean nuclear fission reactors, such reactors being capable of also safely disposing of contemporary dangerous nuclear waste by way of transmutation processes.

Beneficially, the electrical roadway apparatus pursuant to the present invention is inexpensive to manufacture and install, and is extremely safe in operation on account of various implementation features which will be described in greater detail later.

In FIG. 34, there is shown an electrical roadway system indicated generally by 4010. The system 4010 includes an electrical roadway 4020 along which a plurality of drive coil arrangements 4040 have been installed, for example into slots cut into an upper asphalt surface of the electrical roadway 4020. The drive coil arrangements 4040 are driven by corresponding one or more drive units 4050. The electrical roadway system 4010 is operable to provide inductive power coupling to one or more vehicles 4030 upon the roadway 4020, wherein each vehicle 4030 includes a corresponding pickup coil arrangement 4060 with an associated shield 4070 thereabove, and wherein the pickup coil arrangement 4060 and the shield 4070 are mounted to an underside of the vehicle 4030 as illustrated. The pickup coil arrangement 4060 is connected to a power control unit 4080 of the vehicle 4030 which is operable to direct inductively coupled power received at the pickup coil arrangement 4060 selectively to drive motors to propel the vehicle 4030 and/or to an energy storage element of the vehicle 4030, for example to a rechargeable battery of the vehicle 4030. The vehicle 4030 is optionally a compressed-air vehicle, for example as proposed by inventor Guy Nègre of Motor Developments international (MDI), an electric vehicle, a hybrid vehicle including an electrical drive train and an oxidation drive train either in a parallel-hybrid or series-hybrid configuration. The oxidation drive train can be, for example, a cylinder-piston combustion engine and/or a oxidative fuel cell arrangement.

When the system 4010 is in operation, the drive units 4050 are only energized when a vehicle 4030 is spatially vertically over their respective drive coil arrangements 4040. In other words, the drive units 4050 do not energize their associated drive coil arrangements 4040 unless one or more vehicles 4030 are present substantially vertically above the drive coil arrangements 4040. Energization of the drive coil arrangements 4040 is optionally executed on receiving one or more identification signals, also known as "pilot signals", from the one or more vehicles 4030 substantially vertically over the drive coil arrangements 4040. Alternatively, or additionally, energization of the drive coil arrangements 4040 is optionally executed on one or more sensors associated with the drive coil arrangements 4040 detecting a presence of one or more vehicles 4030 in proximity of the drive coil arrangements 4040. Such selective energization of the drive coil arrangements 4040 is beneficial for energy conservation, as well as increasing safety of the system 4010 by reducing a risk of unintended exposure of personnel to magnetic fields generated in operation by the drive coil arrangements 4040. Optionally, energization of the drive coil arrangements 4040 is based upon a monitored trajectory of a given vehicle 4030 so that the drive coil arrangements 4040 are energized in a correct sequence and time to provide power inductively to the given vehicle 4030. The drive coil arrangements 4040 can be implemented in various mamma in the roadway 4020. Moreover, the drive coil arrangements 4040 are optionally energized in a resonant mode of operation. Alternatively, or additionally, the drive coil arrangements 4040 are operated in a non-resonant mode of operation.

Referring to FIG. 35, an example drive coil arrangement 4040 is implemented as a plurality of pairs of capacitors 4110 and inductors 4100 coupled in series; each capacitor 4110 has a capacitance C and each inductor 4100 has an inductance L. Such an implementation of the drive coil arrangement 4040 exhibits a lowest series impedance at a fundamental resonant frequency $f_0$ of the capacitors 4110 and inductors 4100 as defined by Equation 1 (Eq. 1):

$$f_0 = \frac{1}{2\pi\sqrt{LC}} \qquad \text{Eq. 1}$$

Implementing the drive coil arrangement 4040 as a plurality of series resonant circuits 13 advantageous to reduce voltage amplitudes and associated cable insulation dielectric losses, in comparison to implementing the drive coil arrangement 4040 as a single capacitor and a single inductor coupled in settee.

Referring next to FIG. 36, an example drive coil arrangement 4040 is implemented as a plurality of groups 4160 of series resonant circuits 4150 coupled in parallel, the groups 4160 being coupled in series as illustrated. In FIG. 36, there are in series resonant circuits 4150 in each group 4160, and n groups 4160 are coupled together in series and driven from their respective drive unit 4050 across terminals A-A. There are thus n×m series resonant circuits 4150 present in the drive coil arrangement 4040 of FIG. 36. Parameters n and in, together with suitable values for the capacitance C, the inductance L and the resonant frequency $f_0$ can be chosen to customize characteristics of the drive coil arrangement 4040 to match characteristics of its associated drive unit 4030, for example excitation voltage and current output capabilities of the associated drive unit 4050.

In FIG. 37, a schematic implementation of a portion of a drive unit 4050 associated with a drive arrangement 4040 is provided. The drive coil arrangement 4040 is represented by a capacitor C2 and an inductor L3, although the drive coil arrangement 4040 can be, for example, implemented in practice as illustrated in FIG. 35 or FIG. 36. The drive unit 4050 includes an electronic switching unit 4200 and a matching transformer 4210. Moreover, the switching arrangement 4200 is provided with electrical power at a supply voltage V1 with input power being monitored via a sensor M1, for example implemented as a current meter or power meter. The Matching transformer 4210 includes a primary winding L1 and a secondary winding L2; optionally, the transformer 4210 is a ferrite-cored transformer that is capable of coupling considerable power therethrough, for example 10's of kW of power. Alternatively, the transformer 4210 is implemented as an at least partially air-cored transformer. The electronic switching circuit 4200 includes a capacitor C1 coupled across the winding L1 and beneficially arranged in operation to exhibit a parallel resonant frequency corresponding substantially to that of the drive coil arrangement 4040. Moreover, the electronic switching circuit 4200 includes two solid-state switching devices SW1, SW2 which are momentarily switched alternately into a conducting state when in operation at substantially the parallel resonant frequency of the capacitor C1 and winding L1. When a vehicle 4030 is not in proximity of the drive coil arrangement 4040, the solid-state switching devices SW1, SW2 are maintained in a non-conducting state to conserve power. The solid-state switching devices SW1, SW2 are beneficially implemented as bipolar transistors, Darlington transistors, MOSFETs, FETs, Silicon Carbide transistors, triacs, SCRs, or similar, depending upon desired frequency of operation and amount of power to be coupled to vehicles 4030 via the drive coil arrangement 4040.

The winding L2 is beneficially centre-tapped and coupled at its ends to the drive circuit arrangement 4040 as illustrated. The centre-tap of the winding L2 is coupled via a test voltage source V2 and a leakage current detector M2 to asphalt or concrete 4220 of the roadway 4020 in close proximity to the drive coil arrangement 4040. The test voltage source V2 is capable of generating a relatively high potential difference, for example several hundred or thousand volts, but restricted to a low current, for example a few microamperes. Normally, the test voltage source V2 is adjusted substantially to zero volts. Periodically, the test voltage source V2 is increased up to a test threshold potential $V_L$ to measure leakage current through insulation of cables of the drive coil arrangement 4040 to determine whether or not the insulation has been compromised, for example through weathering, damage, wear or manufacturing defect. Optionally, the test voltage source V2 is adjusted up to the test threshold potential $V_L$ and the leakage current, as measured by the leakage current detector M2, then determined; in an event that the leakage current exceeds a defined leakage current threshold $I_T$, the drive coil arrangement 4040 is deemed to be defective; in an event that the leakage current is less than the defined leakage current threshold $I_T$, the drive coil arrangement 4040 is deemed to be in an acceptable condition of repair. Optionally, the test voltage source V2 is adjusted until breakdown occurs in insulation of the cable of the drive coil arrangement 4040, when the leakage current increases rapidly, for example as illustrated in FIG. 42B, and the value of the test voltage V2 required to cause breakdown is monitored and recorded on a periodic basis; in an event that the breakdown voltage changes unexpectedly or reduces appreciably, the drive coil arrangement 4040 is deemed to be defective; in an event that the breakdown voltage remains substantially constant when the tests are performed periodically, the drive coil arrangement 4040 is deemed to be in an acceptable condition of repair. Such leakage testing can be performed automatically from the drive unit 4050, for example at night time when a likelihood of personnel being in close proximity to the drive coil arrangement 4040 is relatively small. In FIG. 35 and FIG. 36, the capacitors 4110 are beneficially provided with associated high-value bypass resistances (for example with resistances of several hundred kΩ or even MΩ) coupled in parallel therewith, so that the test voltage source V2 is capable of testing cable insulation of a whole of the drive coil arrangement 4040.

Other highly efficient manners of implementing the drive unit 4050 are also feasible. For example, referring to FIG. 38, there is shown the drive unit 4050 incorporating the aforesaid transformer 4210 with its primary and secondary windings L1, L2 respectively; the transformer 4210 is beneficially implemented as a ferrite transformer or an at least partially air-cored transformer. The primary winding L1 is coupled, as shown in FIG. 38, to an electronic switching circuit 4300 implemented as an E-type amplifier. The E-type amplifier is coupled to the aforementioned supply voltage V1 and associated sensor M1. The E-type amplifier includes a supply inductor L5 whose first end is coupled to the supply V1 and whose second end is coupled to a first terminal of a solid-state switching device SW3 in parallel with a first terminal of a capacitor C5; a second terminal of the switching device SW3 and a second terminal of the capacitor C5 are coupled to the supply voltage V1 as illustrated. The first terminal of the switching device SW3 and the first terminal of the capacitor C5 are coupled via an inductor L6 and via a capacitor C6 to excite the primary winding L1 of the transformer 4210. Optionally, the switching device SW3 is a Silicon Carbide transistor which is capable of switching within nanoseconds, blocking voltages in excess of 9 kV and conducting many 10's of Amperes current. Optionally, the switching device SW3 is implemented as a stack of switching devices arranged in parallel to increase their combined current switching capabilities and/or in series to increase their combined voltage blocking capabilities. Suitable circuit values include, for example: L5=5 mH, C6=10 nF, L9=90 µH, C6=36 nF.

The winding L2 is beneficially centre-tapped and coupled at its ends to the drive circuit arrangement 4040 as illustrated; optionally, relays are also included but are not shown in the diagram, for example for disconnecting the drive coil arrangement 4040 in fault conditions. The centre-tap of the winding L2 is coupled via a test voltage source V2 and a leakage current detector M2 to asphalt or concrete 4220 of the roadway 4020 in close proximity to the drive coil arrangement 4040. The test voltage source V2 is capable of generating a relatively high potential difference, for example several hundred or thousand volts, but restricted to a low current for example a few microamperes. Normally, the test voltage source V2 is adjusted substantially to zero volts. Periodically, the test voltage source V2 is increased up to a test threshold potential $V_L$ to measure leakage current through insulation of cables of the drive coil arrangement 4040 to determine whether or not the insulation has been compromised, for example through weathering, damage, wear or manufacturing defect. Optionally, the test voltage source V2 is adjusted up to the test threshold potential $V_L$ and the leakage current, as measured by the leakage current detector M2, then determined; in an event that the leakage current exceeds a defined leakage current threshold $I_T$, the drive coil arrangement 4040 is deemed to be defective; in an event that the leakage current is less than the defined leakage current threshold $I_T$, the drive coil arrangement 4040 is deemed to be in an acceptable condition of repair. Optionally, the test voltage source V2 is adjusted until breakdown occurs in insulation of the cable of the drive coil arrangement 4040, when the leakage current increases rapidly, for example as illustrated in FIG. 42B, and the value of the test voltage source V2 required to cause breakdown is monitored and recorded on a periodic basis; in an event that the breakdown voltage changes unexpectedly or reduces appreciably, the drive coil arrangement 4040 is deemed to be defective; in an event that the breakdown voltage remains substantially constant when the tests are performed periodically, the drive coil arrangement 4040 is deemed to be in an acceptable condition of repair. Such leakage testing can be performed automatically from the drive unit 4050, for example at night time where a likelihood of personnel being in close proximity to the drive coil arrangement 4040 is relatively small. As aforementioned, in FIG. 35 and FIG. 36, the capacitors 4110 are beneficially provided with associated high-value bypass resistances (for example with resistances of several hundred KΩ or MΩ) coupled in parallel therewith, so that the test voltage source V2 is capable of testing cable insulation of a whole of the drive coil arrangement 4040.

It will be appreciated from the foregoing that both the drive coil arrangements 4040 and the drive units 4050 are susceptible to being implemented in various different manners, depending upon operating characteristics and performance required.

Moreover, when considering the system 4010, the drive coil arrangements 4040 and their drive units 4050 are susceptible to being configured in various different manners along the roadway 4020. Referring to FIG. 39, an example implementation of a portion of the system 4010 is indicated by 4400. There is provided power transmission lines or cables 4410 along the roadway 4020, for example three-phase 50 Hz medium voltage power transmission lines. At intervals along the roadway 4020, for example every 500 metres or each 1 km along the roadway 4020, there are included step-down transformers and oscillator units 4420 coupled to the power transmission lines or cables 4410 for generating excitation signals to an output bus 4430 suitable for driving drive coil arrangements 4040, for example in a frequency range of 30 kHz to 300 kHz, more preferably in a frequency range of 50 kHz to 140 kHz. The step-down transformer and oscillator units 4420 beneficially include drive circuits akin to those illustrated in FIG. 37 and/or FIG. 38. At intervals along the output bus 4430, there are included coupling relay units 4440 for coupling the output bus 4430 to their associated drive coil arrangement 4040 in an event that a vehicle 4030 is vertically above the associated drive coil arrangement 4040. The system 4010 as implemented in FIG. 39 is of advantage in that the drive coil arrangements 4040 and the coupling relay units 4440 can be relatively simple inexpensive components, and more costly electronic switching devices are provided in the step-down transformer and oscillator units 4420. Moreover, when performing leakage tests to determine a state of insulation of cables of the drive coil arrangements 4040, the coupling relay units 4440 can be selectively switched so that individual drive coil arrangements 4040 can be tested. For example, all the drive coil arrangements 4040 coupled to a given step-down transformers and oscillator unit 4420 can be tested simultaneously in parallel for leakage; in an event that a leakage is detected indicative of a fault, the drive coil arrangement 4040 can then be tested individual to determine which specifically are defective. In an event that one or more of the drive coil arrangements 4040 are found to be defective, their associated coupling relay units 4440 can be disabled to isolate the drive coil arrangements 4040, thereby enable those drive coil arrangements 4040 which are in satisfactory functioning condition to continue to be used for providing inductively coupled power to the vehicles 4030. In other words, defects in one or more of the drive coil arrangements 4040 result in a gradual reduction in performance of the system 4010 but does not hinder completely the system 4010 from operating; the vehicles 4030 can potentially cope with a lack of power coupling from occasional defective drive coil arrangements 4040, especially when the vehicles 4030 include therein energy storage elements, for example rechargeable batteries, to provide short-term motive power. Optionally, each coupling relay unit 4440 serves two drive coil arrangements 4040 as illustrated, to reduce a need for so many coupling relay units 4440 to be installed along the roadway 4020. In other words, the drive units 4050 are beneficially coupled substantially at elongate ends of adjacent pairs of drive coil arrangements 4040. Optionally, the output bus 4430 conveys multiphase drive signals for the drive coil arrangements 4040, and a plurality of the drive coil arrangements 4040 are mutually overlaid in laterally displaced manner at any given position along the roadway 4020; such an arrangement enables greater magnitudes of power to be coupled, for example in excess of 100 kW for large trucks and buses.

In FIG. 40, there is shown an alternative manner of implementing a portion of the system 4010, the portion being indicated generally by 4500. There is provided a high-voltage power transmission line 4510 along the roadway 4020. The transmission fine 4510 is optionally arranged to convey three-phase electricity at a frequency of 50 Hz to 60 Hz at high voltage, for example 10's or 100's of kiloVolts (kV). At intervals along the roadway 4020, for example at periodic distances of substantially 20 km, a step-down transformer 4540 transforms power from the high-voltage transmission line 4510 to a medium voltage bus 4520 from which power is tapped at a mains frequency in a range of 50 Hz to 60 Hz, and fed to drive units denoted by 4340, which include a step-down transformer and an electronic dive circuit, for example in a manner akin to FIG. 37 or FIG. 38, for generating an output drive signal which is coupled in operation to drive one or more associated, drive coil arrangements 4040 when a vehicle 4030 is present substantially vertically over the drive coil arrangement 4040. Each drive unit 4540 is equipped to measure leakage of cable insulation of its associated drive coil arrangement 4040 as elucidated in the foregoing for purposes of fault detection. Beneficially, each drive unit 4540 serves two drive coil arrangements 4040 as illustrated, to reduce a number of drive units 4540 that need to be installed along the roadway 4020. In other words, each drive unit 4540 is coupled to elongate ends of two mutually adjacent drive coil arrangements 4040 along the roadway 4020. An advantage in the system 4010 implemented as depicted in FIG. 40 is that the drive units 4540 can be mutually similar mass-produced modular units, wherein economies of scale in manufacturing the drive units 4540 is capable of rendering the system 4010 less expensive to install and maintain. In a similar manner to the system 4010 as implemented in FIG. 39, failure of a given drive unit 4540 and/or its at least one drive coil arrangement 4040 does not disable other such drive units 4540 along the roadway 4020 from functioning, such that the system 4010 is thereby rendered robust in relation to failure of its component parts and its performance degrades gradually as occasional drive units 4540 develop faults and are rendering out-of-service.

In the system 4010 as implemented in FIG. 39 or FIG. 40, a situation can arise wherein the vehicle 4030 straddles two adjacent drive coil arrangements 4040. For ensuring continuity of inductive power coupling to the vehicle 4030. It is desirable that phase and frequency of drive signals to spatially adjacent drive coil arrangements 4040 are mutually similar, so that the vehicle 4030 does not experience any momentary loss of inductively coupled power as the vehicle 4030 travels from a given drive coil arrangement 4040 to a drive coil arrangement 4040 spatially adjacent to the given drive coil arrangement 4040. Such frequency and phase synchronization can be achieved by mutually synchronizing adjacent drive units 4540, or mutually adjacent step-down transformer and oscillator units 4420. In addition, it is useful to turn on the next coil when the vehicle pickup starts to have any coverage with it, whilst leaving the previous coil on until the vehicle coil has left it, thus having both coils on for the overlap period of around 0.1 second, depending on the vehicle speed and length of the pickup coil.

Referring next to FIG. 41A, there is shown a resonance characteristic of the drive coil arrangement 4040 as depicted in FIG. 35 and FIG. 36. An abscissa axis 4600 denotes increasing frequency from left to right. Moreover, an ordinate axis 4610 denotes a magnitude of current flowing within the drive coil arrangement 4040 for a given drive signal from its corresponding drive unit 4050. The drive coil arrangement 4040 exhibits a resonant angular frequency $\omega_0$, wherein $\omega_0 = 2\pi f_0$, with −3 dB points defining a bandwidth $B_w$, from which a Q-factor can be computed from Equation 2 (Eq. 2):

$$Q = \frac{\omega_0}{B_w} \qquad \text{Eq. 2}$$

The Q-factor is optionally determined in the system 4010 for a given drive coil arrangement 4040 by operating its corresponding drive unit 4050 to determine the −3 dB points as depicted in FIG. 41A and their corresponding frequencies $\omega_l$ and $\omega_u$, in addition to the fundamental resonant frequency $\omega_0$ and its associated 0 dB amplitude. An alternative approach to determine Q-factor is depicted in FIG. 41B, wherein an abscissa axis 4600 denotes passing time from left to right, and wherein an ordinate axis 4650 represents a current instantaneously circulating in the drive coil arrangement 4040; when drive from the drive unit 4050 to its corresponding drive coil arrangement 40 is terminated, the current circulating in the drive coil arrangement 4040 decays with an exponentially decaying envelope denoted by 4660 from which the Q-factor of the drive coil arrangement 4040 can be computed in computing hardware of the system 4010.

Beneficially, the system 4010 is operable to monitor changes in measured Q-factor of its drive coil arrangements 4040; for example when devoid of vehicles 4030 thereover, for identifying potential problems of damage, corrosion or imminent failure of the drive coil arrangements 4040. Sudden damage such as asphalt cracking, earthquake, landslide, accident, corrosion which could influence operation of the drive coil arrangements 4040 are detectable as changes in Q-factor over time, for example months or even years. Apart from testing for leakage currents as depicted in FIG. 37 and FIG. 38 to check integrity of cable insulation, testing of Q-factor is capable of detecting increases in cable resistance caused by damage or corrosion. Beneficially, when periodically executing a measurement of Q-factor, account is taken of road conditions, for example road temperature which could be indicative of whether or not the roadway 4020 is coveted in ice and/or snow which could influence a Q-factor of a given drive coil arrangement 4040. In an event that a sudden unexpected fall in Q-factor is detected for the given drive coil arrangement 4040, the system 4010 beneficially elects not to energize the given coil arrangement 4040, assuming it to be faulty and thereby by such election increasing operating safety of the system 4010.

Referring to FIG. 42A, there is shown a graph including an abscissa axis 4700 denoting passing time from left to right, and an ordinate axis 4710 denoting increasing Q-factor of a given drive coil arrangement 4040 increasing from bottom to top. A curve 4720 denotes a change of Q-factor of a given drive coil arrangement 4040 which is functioning reliably, whereas a curve 4730 denotes a change of Q-factor of a given drive coil arrangement 4040 whose cable is subject to gradual corrosion causing its one or more conductor progressively to exhibit a higher series resistance. The system 4010 is beneficially operable to measure historical changes in the Q-factors of its drive coil arrangements 4040 and thereby detecting problems with potentially defective drive coil arrangements 4040 before they can represent any form of safety hazard to the system 4010.

Referring to FIG. 42B, when the circuits in FIG. 37 and FIG. 38 are operable to detect leakage current, a defect drive coil arrangement 4040 will exhibit a temporally abrupt increase in leakage current when the insulator of the cable of the drive coil arrangement 4040 is compromised. In FIG. 42B, en abscissa axis denotes a passage of time from left to right, whereas an ordinate axis 4750 denotes increasing leakage current from bottom to top. A curve 4760 denotes leakage current measurements performed by the system 4010 at periodic intervals on a given drive coil arrangement 4040. At substantially a time denoted by a line 4770, the insulation of the cable of the drive coil arrangement 4040 is compromised resulting in a sharp rise in leakage current denoted by 4780. The system 4010 is operable to disconnect and not energize a given drive coil arrangement 4040 which has developed insulation leakage defects, thereby increasing operating safety of the system 4010.

For increasing safety further, the system 4010 is operable such that one or more vehicles 4030 travelling along the roadway 4020 are provided with inductively coupled power from one or more of the drive coil arrangements 4040 only when the one or more vehicles 4030 are travelling along the roadway 4020 at a speed above a threshold speed $V_T$, namely an activation speed, for example in a range of 10 km/h to 80 km/h, more preferably in a rang of 20 km/h to 50 km/h, more preferably substantially 30 km. Optionally, the threshold speed $V_T$ is made a function of ambient weather conditions, for example precipitates and/or a surface temperature of the roadway 4020. A speed of the one or more vehicles 4030 can be determined from one or more of (a) a pilot signal provided from each vehicle 4030 to the system 4010 for requesting power to be provided to the vehicle 4030, wherein the pilot signal includes data indicative of a speed of the vehicle 4030 as determined from an odometer included in the vehicle 4030, and/or from a GPS and/or GPRS position monitoring apparatus included on the vehicle 4030 from which the speed of the vehicle 4030 can be computed using computing hardware;

(b) one or more speed sensors, for example Doppler microwave radar sensors, included along the roadway 4020 and coupled to the drive units 4050; and (c) trajectory monitoring of each vehicle 4030 undertaken by the system 4010 in response to a sequence of drive units 4050 that have detected a presence of the vehicle 4030, for example from a pilot signal issued from the vehicle 4030.

Such operation of the system 4010 in respect of the activation speed ensures that the drive units 4050 are not energized in an event of an accident, a stationary queue of traffic, extraneous conductive objects falling onto the roadway 4020 and so forth.

Excitation to the one or more drive coil arrangements 4040 is optionally varied as illustrated in FIG. 43A in FIG. 43A, an abscissa axis 4800 denotes a travelling speed of a given vehicle 4030 with speed increasing from left to right, and an ordinate axis 4810 denotes excitation power provided to a drive coil arrangement 4040 providing power to the given vehicle 4030. When the given vehicle 4030 is travelling along the roadway 4020 at a speed less than a threshold speed denoted by $V_T$, for example substantially 50 km/h, negligible excitation is provided to the drive coil arrangement 4040 as denoted by 4820. When the travelling speed of the given vehicle 4030 exceeds the threshold speed $V_T$, the drive unit 4050 associated with the drive coil arrangement 4040 increases the excitation in a step-manner to a power P suitable for propelling the given vehicle 4030.

However, the system 4010 is optionally operated to provide a more complex control of excitation to the one or more drive coil arrangements 4040 as a function of a speed of travel of a given vehicle 4030 along the roadway 4020. For example, in FIG. 43B, an abscissa loft 4800 denotes a travelling speed of a given vehicle 4030 with speed increasing from left to right, and an ordinate axis 4810 denotes excitation power provided to a drive coil arrangement 4040 providing power to the given vehicle 4030 increasing from bottom to top. When the given vehicle 4030 is travelling along the roadway 4020 at a speed less than a lower threshold speed denoted by $V_{T1}$, for example substantially 20 km/h, negligible excitation is provided to the drive coil arrangement 40. When the travelling speed of the given vehicle 4030 is intermediate between the lower threshold speed $V_{T1}$ and an upper threshold speed $V_{T2}$, the drive unit 4050 associated with the dive coil arrangement 4040 increases the excitation in a step-manner to an intermediate power P1, as demoted by 4850, suitable for propelling the given vehicle 4030 at a reduced speed along the roadway 4020. Moreover, when the travelling speed of the given vehicle 4030 exceeds the upper threshold speed $V_{T2}$, the drive unit 4050 associated with the drive coil arrangement 4040 increases the excitation in a step-manner to a high power P2, as denoted by 4840, suitable for propelling the given vehicle 4030 at a high speed along the roadway 4020. Such control of excitation can be achieved by varying switch on time of electronic switching devices in FIG. 37 and FIG. 38 from associated electronic control circuits.

Referring to FIG. 43C, the system 4010 is optionally operable to increase excitation to one or more drive coil arrangements 4040 providing power to a given vehicle 4030 in a substantially linear manner as a function of increasing vehicle speed between the lower threshold speed $V_{T1}$ and the upper threshold speed $V_{T2}$, as denoted by 4870, and providing a substantially constant excitation of P2 to the one or more drive coil arrangements 4040 when the vehicle speed exceeds the upper speed threshold $V_{T2}$ as illustrated, as denoted by 4860.

Referring to FIG. 43D, the system 4010 is optionally operable to increase excitation to one or more drive coil arrangements 4040 providing power to a given vehicle 4030 in a substantially continuous manner as a function of increasing vehicle speed between the lower threshold speed $V_{T1}$ and the upper threshold speed $V_{T2}$, as denoted by 4890, and providing a substantially constant excitation of P2 to the one or more drive coil arrangements 4040 when the vehicle speed exceeds the upper speed threshold $V_{T2}$ as illustrated, as denoted by 4880.

In relation to FIG. 43A to FIG. 43D, it is optionally possible for the system 4010 to provide a low excitation power, for example in a range of 0% to 5% of kill power P2, to a drive coil arrangements 4040 in an event that a given vehicle 4030 is stationary over the drive coil arrangement 4040 namely stationary but simultaneously emitting the pilot signal. For example, when the given vehicle 4030 is stationary in a queue of traffic and vertical over the drive coil arrangement 4040 in winter time, when it is desirable that the given vehicle 4030 provides interior heating to its driver without severely discharging its onboard batteries, and thus benefits from a reduced power supply from the drive coil arrangement 4040. In such queue conditions, there is a risk that drivers leave their vehicles 4030 in frustration end walk upon the roadway 4020 and could risk being exposed to magnetic fields generated by the drive coil arrangements 4040; such reduced excitation of the drive coil arrangements 4040 in queue conditions avoids personnel injury whilst also ensuring heating to vehicles 4030 in the queue. Such functionality is beneficially implemented in specific weather conditions, for example in winter when snow precipitation is imminent, but the functionality is disable in warm summer conditions.

Inclusion of the aforesaid shield 4070 on an underside of the vehicle 4030, utilization of an activation speed ($V_T$), temporally periodically monitoring of leakage currents in the drive coil arrangement 4040, temporally periodically monitoring of drive coil arrangement 4040 Q-factor, selectively energizing the drive coil arrangements 4040 only when one or more vehicles 4030 are substantially vertically above them are all features which assist to ensure that the system 4010 is very safe in operation, and that risk of personnel injury is potentially reduced to a negligible magnitude. Such high safety of the system 4010 should be compared with contemporary roadways along which conventional vehicles carrying significant quantities of highly flammable gasoline fuel onboard represent a considerable hazard in an event of a road accident; many people have lost their lives in conventional road accidents when combustible fuels ignite. Optionally, the system 4010 is optionally arranged to summon help automatically in an event of one or more drive units 4050 being hindered from energies their associated drive coil arrangements 4040 in a manner characteristic of an accident or similar event occurring along the roadway 4020. The present invention is thus capable of representing a very considerable improvement in roadway safety. Moreover, avoidance of heavy batteries in the vehicles 4030 renders the vehicles 4030 lighter in weight and thus having less $\frac{1}{2}\,mV^2$ kinetic energy when in motion, thereby considerably reducing accident impact energy and thereby reducing a risk of personal injury.

Although embodiments of the present invention are described in the foregoing in respect of resonant inductive power transfer, it win be appreciated that the present invention is also pertinent for non-resonant inductive power transfer systems.

Optionally, the pilot signal emitted by the vehicle 4030 includes an identification of operating characteristics of the vehicle 4030, for example a degree of motive power required by the vehicle 4030 and/or a state of discharge of energy storage elements in the vehicle 4030; when the drive unit 4050 receives the pilot signal from the vehicle 4030, the drive unit 4050 then energizes its drive coil arrangement at a power level which is a function of the operating characteristics. Thus, the system 4010 is operable to deliver appreciable amounts of power to heavyweight trucks and buses, for example requiring 100 kW or more motive power, wherein such heavyweight trucks and buses are beneficially provided with substantial shields 4070 for shielding against powerful magnetic fields generated by the drive coil arrangement 4040 required to convey such appreciable amounts of power, whereas lightweight electric vehicles are provided with more modest amounts of power, for example requiring 5 kW or less, wherein such lightweight electric vehicles have more modest shields 4070 providing imperfect shielding, for example for electric bicycles, electric bikes, electric motorcycles and sub-compact automobiles. Such selective power delivery as a function of vehicle operating characteristics is potentially providing energy utilization economy as well as increasing operating safety of the system 4010.

Electrical roadway apparatus pursuant to the present invention is intended to be widely employed within a road network in a post-Carbon society wherein electrical power is generated from one or more of
(a) renewable energy sources, for example wind turbines, wave power generators, solar panels, geothermal generators and tidal energy sources; and
(b) Thorium LFTR safe clean nuclear fission reactors, such reactors being capable of also safely disposing of contemporary dangerous nuclear waste by way of transmutation processes, thereby such nuclear waste substantially environmentally harmless.

Beneficially, the electrical roadway apparatus pursuant to the present invention is inexpensive to manufacture and install, and is extremely safe in operation on account of various implementation features which will be described in greater detail later.

In FIG. 44A, there is shown an electrical roadway system indicated generally by 5010. The system 5010 includes an electrical roadway 5020 along which one or more drive coil arrangements 5040 have been installed, for example by way of installing cables 5045 into slots cut into an upper asphalt surface of the electrical roadway 5020, wherein the slots have associated elongate axes which are beneficially substantially orthogonal to an elongate axis of the roadway 5020 itself, namely the slots we cut substantially transversely across the roadway 5020; optionally, slots for the cables 5045 are also cut in a direction along the elongate axis of the roadway 5020 itself in certain embodiments of the present invention. The one or more drive coil arrangements 5040 are driven by corresponding one or more modular drive units 5050 which are disposed end-to-end in a chain along a side region of the electrical roadway 5020 and/or a central reservation of the electrical roadway 5020. The electrical roadway system 5010 is operable to provide inductive power coupling to one or more vehicles 5030 upon the roadway 5020, wherein each vehicle 5030 includes a corresponding pickup coil arrangement 5060 with an associated shield 5070 thereabove, and wherein the pickup coil arrangement 5060 and the shield 5070 are mounted to an underside of the vehicle 5030 as illustrated. The pickup coil arrangement 5060 is connected to a power control unit 5080 of the vehicle 5030 which is operable to direct inductively coupled power received at the pickup coil arrangement 5060 selectively to one or more drive motors to propel the vehicle 30 and/or to an energy storage element of the vehicle 5030, for example to a rechargeable battery of the vehicle 5030. As illustrated in FIG. 44, the one or more modular drive units 5050 optionally include multiphase outputs. In a first example, the multiphase outputs are implemented as three sinusoidal phases $\phi_A$, $\phi_B$, $\phi_C$ which are mutually angularly disposed at intervals of 120° therebetween. In FIG. 44A, non-inverted and inverted multiphase outputs are optionally employed to excite the drive coil arrangements 5040. Alternatively, as illustrated in FIG. 44B, only non-inverted multiphase outputs are optionally employed to excite the drive coil arrangements 5040. In a second example, the multiphase outputs are optionally implemented as sinusoidal phases with intervals of 90° therebetween. Single phase operation for the one or more modular drive units 5050 is also feasible. Beneficially, when multiphase outputs are employed, the phases are spatially overlapped along the roadway 5020 as will be described in greater detail later.

Optionally, the vehicle 5030 is a compressed-air vehicle, for example as proposed by inventor Guy Nègre of Motor Developments international (MDI), an electric vehicle, a hybrid vehicle including an electrical drive train and an oxidation drive train either in a parallel-hybrid or series-hybrid configuration. The oxidation drive train can be, for example, a cylinder-piston combustion engine and/or an oxidative fuel cell arrangement. The oxidative fuel arrangement is optionally provided with Hydrogen gas generated from Hydrogen adsorption from Boro-hydrate materials, and/or with Hydrogen gas provided from oxidative chemical reactions.

When exciting the drive coil arrangements 5040 disposed in an asphalt layer of the roadway 5020 when one or more vehicles 5030 are present power is transferred from the drive coil arrangements 5040 via a plurality of mechanisms:
(a) inductive power coupling to the pickup coil arrangements 5060 of the one or more vehicles 5030;
(b) resistive power losses in cables 5045 employed to implement the drive coil arrangements 5040;
(c) dielectric power losses in insulating material in cables 5045 employed to implement the drive coil arrangements 5040;
(d) dielectric power losses and eddy current power losses in the asphalt layer of the roadway 5020 spatially adjacent to the cables 5045;
(e) dielectric power losses in an any series resonant capacitors included in series with windings of the drive coil arrangements as implemented using the cables 5045.

It is desirable that the mechanism (a) is a dominant path for power transfer from the drive coil arrangements 5040. The mechanism (b) is reduced by implementing the cables 5045 as Litz wire, as bundles of individually-insulated metallic conductive tapes or individually insulated conducting wires disposed in a spaced apart manner within a dielectric insulating polymeric medium; optionally, the polymeric medium is polyethylene, polypropylene or similar electrically insulating plastics material. The mechanisms (c) and (d) are reduced by ensuring that the dielectric material surrounding the cables 5045 is of low dielectric loss and as volumetrically extensive as possible whilst also enabling installation within slots cut into an upper surface of the roadway 5020. The mechanism (d) is reduced by employing suitable capacitors, for example low-loss ceramic capacitors.

When the system 5010 is required to transfer large amounts of power to heavy vehicles, for example to buses and/or trucks requiring 100 kW power or more, it is desirable that the system 5010 is operable to couple power via the mechanism (a) contemporarily continuously to the one or more vehicles 5030 as they travel along the roadway 5020. For example, hauling a load of several tonnes up a steep incline potentially requires tens of kiloWatts (kW) of motive power when vehicle speeds of around 20 metres/second, namely circa 75 km/hour, are to be achieved. Such continuous coupling is achieved by employing multiphase excitation of the drive coil arrangements 5040, wherein spatially adjacent phases have corresponding coil areas which are spatially partially overlapping.

Referring next to FIG. 45A, there is shown an illustration of the roadway 5020 in plan view, wherein the roadway 5020 has two contraflow lanes with a central reservation 5100 therebetween. The drive units 5050 are provided with connectors and associated cables 5105 for coupling them end-to-end as illustrated to form a chain of interconnected drive units 5050 along a peripheral edge of the roadway 5020 as illustrated. Moreover, the drive units 5050 have connector-attachable outlets denoted $+\phi_A$, $+\phi_B$, $+\phi_C$, $-\phi_A$, $-\phi_B$, $-\phi_C$, corresponding to phases A, B, C which are sinusoidal and at 120° mutually phase spacing; "+" and "−" a are employed to denote non-inverted and inverted signals respectively. Thus, $+\phi_A$ and $-\phi_A$ are mutually antiphase signals, $+\phi_B$ and $-\phi_B$ are mutually antiphase signals, and similarly $+\phi_C$ and $-\phi_C$ are mutually antiphase signals. This results in signal voltage amplitude at a portion of the cables 5045 in a vicinity of the central reservation 5100 being relatively low, thereby resulting in very low dielectric loss thereat, namely reducing aforesaid mechanism (c) as negligible as possible and increasing operating safety. The phases A, B, C define associated coil centre regions in a plane of the roadway 5020, wherein the coil centre regions of the phases are mutually partially overlapping end follow the given vehicle 5030 as it travels along the roadway 5020 in operation. An advantage in operation is that power can be continuously provided to a given vehicle 5030 as it travels along the roadway 5020. Beneficially, the cables 5045 traverse the roadway 5020 between the peripheral edge, whereat the drive units 5050 are located, and the central reservation 5100. A spacing D between adjacent cables 5045 is beneficially in a range of 20 cm to 1 metre, and more preferably in a range of 30 cm to 60 cm, and most preferably substantially 0.4 metres. In an alternative implementation of the roadway 5020 in FIG. 45A, the phases are mutually in quadrature, namely spaced apart in phase by 90°. Other phase spacings are also optionally possible pursuant to the present invention. In a yet alternative implementation, the drive units 5050 are included at the central reservation 5100 and the cables 5045 then merely loop around at a peripheral edge of the roadway 5020. Optionally, the drive units 5050 are operable to detect a presence of a given vehicle 5030 over their respective drive coils formed by the cables 5045, and only energize their cables 5045, namely their drive coil arrangements 5040, when the given vehicle 5030 is in a spatial position over the drive coils to receive inductively-coupled power therefrom; when the given vehicle 5030 is not present, the drive units 5050 do not excite their associated cables 5045 in order to conserve energy and increase operating safety of the roadway 5020. The drive units 5050 are beneficially operable to detect the given vehicle 5030 by receiving a pilot signal emitted from the given vehicle 5030 and/or by detecting movement and position of the given vehicle 5030 by way of sensors included in the drive units 5050. Optionally, the drive units 5050 also provide lighting, driver visual warning signals, mobile telephone communication infrastructure, and road heating functionality in winter time for matting ice, frost and snow. Optionally, in FIG. 45A, both lanes of the roadway 5020 are provided with associated peripheral driver units 5050 and associated cables 5045 so that vehicles 30 can be inductively powered in both travelling directions along the roadway 5020.

Optionally, as illustrated in FIG. 45B, the cables 5045 are coupled to an Earth bar 5110 along the central reservation 5100 which is connected to Earth potential for increasing safety and providing a simpler configuration of parts to install. In FIG. 45B, multiphase excitation is employed with non-inverted and inverted drive signals being applied in operation to the cables 5045. Optionally, as illustrated in FIG. 45C, the cables 5045 are coupled to the Earth bar 5110 along the central reservation 5100 which is connected to Earth potential for increasing safety and providing a simpler configuration to parts to install. In FIG. 45C, multiphase excitation is employed with only non-inverted drive signals being applied in operation to the cables 5045.

An alternative arrangement for the drive coil arrangements 5040 as illustrated in FIG. 45D includes a plurality of phases disposed transversely across the roadway 5020, in contradistinction to FIG. 45A to FIG. 45C which includes a plurality of phases disposed longitudinally along the roadway 5020. In FIG. 45D, the drive units 5030 can be spaced relatively widely apart, and transverse cable bunches 5048B disposed at a bottom of relatively deep transverse slots cut into the roadway 5020, with longitudinal cables 5048A disposed at a bottom of relatively shallow longitudinal slots cut into the roadway 5020, with coupling units 5048C, for example cable-piercing couplers and relays, disposed at locations where the transverse slots and the longitudinal slots intersect as illustrated. The transverse cable bunches 5048B include multiphase drive signals which are coupled to their respective longitudinal cables 5048B at appropriate coupling units 5048C.

The drive units 5050 are beneficially manufactured as modular units, for example with robust reinforced concrete enclosures, for example conduit-type reinforced concrete enclosures. Moreover, the drive units 5050 are beneficially provided with connectors for enabling the drive units 5050 to be coupled end-to-end in a chain along the roadway 5020, and connections for the cables 5045 are beneficially implemented via connectors and/or screw clamps. Such a manner of implementation enables the drive units 5050 to be implemented as mass produced modules which can be manufactured in factory premises and then transported by truck to a desired location along the roadway 5020 and then lifted into position by using an associated truck crane. When in situ along the roadway 5020, the drive units 5050 can then be coupled together and their respective cables 5045 attached. Beneficially, transverse slots are cut across at least a portion of the roadway 5020 and their associated cables 5045 are installed into the slots before the drive unit 5050 modules are lifted into position and then coupled together and to their respective cables 5045. In an event of one or more of the drive units 5050 developing a serious fault, the one or more faulty drive unit 5050 modules can be lifted away and one or more replacement drive unit 5050 modules installed, for example by using the aforesaid truck equipped with an associated truck crane.

Certain types of roadway 5020, for example rural road networks, do not have a central reservation and are used less frequently by vehicles 5030 in comparison to major trunk roads and motorways. In such rural road networks, it is desirable to implement the system 5010 in a very cost-effective manner. Referring to FIG. 46A, the drive units 5050 are beneficially installed along one peripheral edge of the roadway 20 and slots for receiving the cables 5045 are cut across substantially an entire width of the roadway 5020 as illustrated. The cables 5045 are coupled to a general Earth bar 5110 at one peripheral edge of the roadway 5020, namely remote from the peripheral whereat the drive units 5050 are installed. In rural locations, the drive units 5050 can also, optionally, be used synergistically for supporting advanced environmental-friendly farming practices wherein electric combine harvesters and tractors are employed to plough, seed and harvest from fields adjacent to the roadway 5020; the combine harvesters and tractors are, for example, provided with a rechargeable energy source therein and recharge each time they make an excursion back to the drive units 5050. Whereas FIG. 48A provides an illustration of multi-phase excitation using non-inverted and inverted drive signals, FIG. 46B provides an illustration of multi-phase excitation using only non-inverted drive signals.

Installation of the cables 5045 will now be described in greater detail with reference to FIG. 47. Prior to installing the drive unit 5050 modules along the central reservation and/or along one or more peripheral sides of the roadway 5020, a diamond-tipper cutting wheel is actuated, for example using a vehicle equipped with a transverse gantry cal onto which a carriage bearing the cutting wheel and associated drive motor together with cutting fluid such as water, is employed to cut a substantially transverse slot 5170 in a layer of asphalt 5160 at a surface of the roadway 5020. The slot 5170 beneficially has a top width W, a depth T and a rake angle of θ, namely achieved by traversing the cutting wheel at a tilted angle +θ when cutting in a first direction across the roadway 5020, for example from left to right across the roadway 5020, and then by traversing the cutting wheel at a tilted angle −θ when cutting in a second direction across the roadway 5020, for example from right to left across the roadway 5020. Optionally, the angle θ is in a range of 1° to 10°, and more preferably in a range of 2° to 5°. The slot 5170 has a lower base width which is greater then the width W for ensuring a more reliable retention of an elastomeric polymeric filling material 5180 employed to secure a polymeric tube 5190 of insulating material, for example radiation-hardened polyethylene or polypropylene for example, into which a multicore cable 5210 is inserted. The multicore cable 5210 is beneficially fabricated from Litz wire, a bundle of individually-insulated conductive tapes, a hollow round metal tube concentrically surrounded by a layer of polymeric insulating material, or conductors disposed in a space-apart manner within a polymeric insulating material. Beneficially, the polymeric tube 5190 and its associated cable 5210 are pre-assembled, for example in factory premises, and sealing material injected at ends of the tube 5190 to prevent moisture ingress into an air cavity formed between the cable 210 and an inside surface of the tube 5190. Optionally, resistive heating cables 5220 are included within the slot 5170 for de-icing purposes in winter time, and for keeping moisture ingress away from the cable 5210.

During installation, as indicated generally by 5150, the following method is beneficially employed, wherein the method includes:

(a) one or more slots 5170 are cut into an upper surface of the layer of asphalt 5160 of a roadway 5020 as aforementioned using a diamond-tipped cutting wheel;
(b) the drive unit 5050 modules and lengths of the pipe 5190 are prepared with the cable 5210 preinstalled within the lengths and extending therebeyond and terminated in connectors, with the ends of the lengths of the pipe 5190 being sealed with sealant against their associated cable 5210;
(c) the drive unit 5050 modules and the lengths of pipe 5190 with their associated cable 5210 installed therein are transported on a truck to the roadway 5020 whereat the slots 5170 have been pre-cut;
(d) a crane mounted upon the truck is employed to lift the drive unit 5050 modules into position along the roadway 5020;
(e) the drive unit 5050 modules are then connected together using suitable cables and connectors in an end-to-end chain manner;
(f) the lengths of pipe 5190 with their associated cable 5210, and optionally also the resistive heating cables 5220, are laid into their respective slots 5170;
(g) the elastomeric polymeric filling material 5180 is then applied to the slots 5170 to secure their associated lengths of pipes 5190, and optionally also the resistive heating cables 5220 into position within the slots 5170 as illustrated in FIG. 47;
(h) the cables 5210 are then connected via their associated connectors to their corresponding drive unit 5050 modules; and
(i) the drive unit 5050 modules are then connected spatially periodically to an electrical supply network, and software executing upon computing hardware included within the drive unit 5050 modules which is operable to control operation of the modules to supply power to vehicles 5030 travelling along the roadway 5020 is suitably configured to render the system 5010 operational.

Several of the steps (a) to (i) of the method can be largely automated, for example by suitably adapting road construction vehicles. Moreover, the drive unit 5050 modules and the lengths of pipe 5190 can be pre-prepared in factory premises where automation can be employed to reduce manufacturing costs of the modules. Economies of scale in manufacture are thereby possible, and it is also possible to reduce a need for personnel to work in situ upon at the roadway 5020. Optionally, stone or pebble ballast can be added after step (h) to the modules to protect them from vandalism and damage, although such a implementation would require the ballast to be moved for access in an event that one or more of the modules needs to be serviced or replaced.

The system 5010 as described in the foregoing, for example in respect of the drive units 5050 and their associated drive coil arrangements 5040, has been conceived to allow rapid and cost-effective conversion of a contemporary road network to operate in a low-Carbon manner. In an event of oil supplies becoming severely depleted, for example as a consequence of "peak oil" (see M. King Hubbard; also "Olduvai Theory", Dr Richard Duncan), or for geopolitical reasons, the present invention allows, for example in emergency situations, for conversion of a road system to derive its motive power not from burning fossil fuels, but rather from clean electricity, for example generated from renewable energy sources, for example wind turbines and geothermal, and/or from clean safe Thorium LFTR, nuclear reactors which enable contemporary stockpiles of dangerous nuclear waste to be transmuted and rendered environmental harmless whilst synergistically also generating power for operating the system 5010.

Implementation of the drive units 5050 will now be described with reference to FIG. 48A and FIG. 48B. In FIG. 48A, each drive unit 5030 optionally includes a drive circuit as illustrated for each pair of its phases +φ, −φ, for example the phases +$\phi_A$, −$\phi_A$. The circuit includes a resonant-tank switching arrangement 3340 including two solid-state switching devices SW1, SW2, for example implemented using Silicon Carbide transistors, coupled to a tank circuit including a resonant capacitor C1 and an inductor L1 forming a primary winding of a transformer 5310. The transformer 5310 is optionally a ferrite-cored transformer and/or an at least partially air-cored transformer. The inductor L1 is centre-tapped and coupled to a power source V1 with its associated power monitoring sensor M1. The transformer 5310 includes a secondary winding in a form of an inductor L2 which is coupled through two capacitors C2, C3 to an associated cable 5045 of the associated drive coil arrangement 5040. Optionally, the circuit in FIG. 48A is arranged to function in a resonant manner, although it is capable of being operated also off-resonance or in a non-resonant manner. When implemented as illustrated in FIG. 46A and FIG. 46B, a central point of the cable 5045 is coupled to the aforesaid general Earth bar 5110. Star-connections and/or Delta-connections of mutt pi drive signals are beneficially employed when implementing the present invention.

For enhancing safety, the resistive element cable 5220 is formed as a loop and only disposed around a portion of a loop as illustrated formed by the cable 5045 defining an inductance L3. The resistive element cable 5220 is supplied with substantially d.c. current from a substantially d.c. supply (not shown) of the drive unit 5050 to heat up the layer or asphalt 5160 in a vicinity of the slot 5170 for de-icing purposes in winter time, thereby reducing a use of road salt, wherein such salt is environmentally damaging and costly to spread each year, and also to drive moisture ingress away from the pipe 5190 and its associated cable 5210 to ensure a long and reliable service life after installation. Optionally, a leakage current test arrangement is implemented by including a low-current test voltage source V2, a leakage current sensor M2 coupled between a centre-tap of the secondary winding L2 and an electrical connection embedded within the layer of asphalt 5160; high-value bleed resistances are beneficially included in parallel across one or more of the capacitors C2, C3. Leakage current monitoring is beneficially implemented temporally periodically during operation of the system 5010 for detecting any early degradation of the cables 5045. Thereby increasing operating safety and reliability.

Referring next to FIG. 48B, there is shown a circuit generally similar to that of FIG. 48A, except that an E-type amplifier is employed instead to implement the resonant circuit 5300. The E-type amplifier includes an inductor L5 coupled at its first terminal to the power source V1 and at its second terminal to a junction of a first terminal of a solid-state switching device SW3, for example implemented using one or more Silicon Carbide transistors, to a first terminal of a capacitor C5 and to a first terminal of en inductor L6 as illustrated. A second terminal of the switching device SW3 and a second terminal of the capacitor C5 are coupled to the power source V1 as illustrated. A second terminal of the inductor L6 is coupled via a capacitor C6 to the primary winding L1 of the transformer 5310. The E-type amplifier employed for the resonant circuit 5300 is capable of working highly efficiently over a wider range of frequencies and with high operating efficiency.

In FIG. 49, there is provided an illustration in perspective view of the system 5010 as depicted in plan view in FIG. 46A and FIG. 46B. Such an arrangement is especially beneficial and cost effective to employ on less heavily utilized roadways, for example in more rural locations on account of the ease with which it can be implemented and maintained at relatively modest cost. The present invention thus enables rapid and cost-effective transformation of a road network functioning on fossil fuel propulsion of vehicles to a low-Carbon road network deriving its motive power from renewable energy resources, for example wind turbines and safe clean Thorium LFTR nuclear power which synergistically also provides concurrent safe transmutation and disposal of present World stockpiles of dangerous nuclear waste.

In respect of the drive units 5050, in operation, there is optionally employed a travelling block of a plurality of excited cables 5045 as a vehicle 5030 moves along the roadway 5020, wherein an outer pair of the cables 5045 associated with the travelling block are energized from a same given phase and at a lower drive current amplitude in comparison to an inner pair of the cables 5045 energized from the same phase, for example an inverted version thereof. Such a manner of excitation of the cables 5045 provides a more constant dipole area for the different phases employed to implement the system 5010, potentially reducing emissions from the roadway 5020 which could risk causing electromagnetic interference.

In overview, electrical roadway apparatus operable to provide inductive power transfer to vehicles are capable of being implemented along sections of roadways, in automobile parking areas and even domestically, for cowling electrical power in an inductive manner to electric road vehicles and/or electric hybrid road vehicles and similar. For example, the electrical roadway apparatus are intended to be widely employed within a road network in a post-Carbon society wherein electrical power is generated from one or more of:
(a) renewable energy sources, for example wind turbines, wave power generators, solar panels, geothermal generators and tidal power generators, and
(b) Liquid Fluoride Thorium Reactor (LFTR), namely safe clean nuclear fission reactors, such reactors being capable of also safely disposing of contemporary dangerous nuclear waste by way of transmutation processes.

Beneficially, the electrical roadway apparatus are relatively inexpensive to manufacture and install, and are extremely safe in operation on amount of various implementation features which will be described in greater detail later. However, in austere economic climates, there is a temptation for unauthorized parties to steal one or more components parts of the electrical roadway apparatus, for example for scrap metal value, for vandalism, or other motive.

In FIG. 51, there is shown a schematic illustration of an electrical roadway system indicated generally by 6010. The system 6010 includes an electrical roadway 6020 along which a plurality of drive coil arrangements 6040 have been installed, for example into wilts cut into an upper asphalt surface of the electrical roadway 6020. The drive coil arrangements 6040 are driven by corresponding one or more drive units 6050. The electrical roadway system 6010 is operable to provide inductive power coupling to one or more vehicles 6030 upon the roadway 6020, wherein each vehicle 6030 includes a corresponding pickup coil arrangement 6060 with an associated shield 6070 thereabove, and wherein the pickup coil arrangement 6060 and the shield 6070 are mounted to an underside of the vehicle 6030 as illustrated. The pickup coil arrangement 6060 is connected to a power control unit 6080 of the vehicle 6030 which is operable to direct inductively coupled power received at the pickup coil arrangement 6060 selectively to one or more drive motors to propel the vehicle 6030 and/or to an energy storage element of the vehicle 6030, for example to a rechargeable battery of the vehicle 6030. The vehicle 6030 is optionally a compressed-air vehicle, for example as proposed by inventor Guy Nègre of Motor Developments international (MDI), an electric vehicle, a hybrid vehicle including an electrical drive train and an oxidation drive train either in a parallel-hybrid or series-hybrid configuration. The oxidation drive train can be, for example, a cylinder-piston combustion engine, a gas-turbine engine and/or an oxidative fuel cell arrangement.

When the system 6010 is in operation, the drive units 6050 are only energized when a vehicle 6030 is spatially vertically over their respective drive coil arrangements 6040. In other words, the drive units 6050 do not energize their associated drive coil arrangements 6040 unless one or more vehicles 6030 are present substantially vertically above the drive coil arrangements 6040. Energization of the drive coil arrangements 6040 is optionally executed on receiving one or more identification signals, also known as "pilot signals", for example implemented using near-field wireless communication such as BlueTooth ("BlueTooth" is a registered trade mark), from the one or more vehicles 6030 substantially vertically over the drive coil arrangements 6040. Alternatively, or additionally, energization of the drive coil arrangements 6040 is optionally executed on one or more sensors associated with the drive coil arrangements 6040 detecting a presence of one or more vehicles 6030 in spatial proximity of the drive coil arrangements 6040. Such selective energization of the drive coil arrangements 6040 is beneficial for energy conservation, as well as for increasing safety of the system 6010 by reducing a risk of unintended exposure of personnel to magnetic fields generated in operation by the drive coil arrangements 6040. Optionally, energization of the drive coil arrangements 6040 is based, at least in part, upon a monitored trajectory of a given vehicle 6030 so that the drive coil arrangements 6040 are energized in a correct sequence and time to provide power inductively to the given vehicle 6030. The drive coil arrangements 6040 can be implemented in various manners in the roadway 6020. Moreover, the drive coil arrangements 6040 are optionally energized in a resonant mode of operation.

Alternatively, or additionally, the drive coil arrangements 6040 are operated in a non-resonant mode of operation.

The drive units 6050 include one or more sensors which monitor operation of the drive coil arrangements 6040, for example by performing periodic tests of resonant characteristics and/or resistance characteristics of the drive coil arrangements 6040 when they are not being energized to provide power to one or more vehicles 6030. In an event of a sudden change in characteristic of one or more drive coil arrangements 6040, for example open circuit, change in inductance end/or resistance, change in Q-factor, in a manner characteristic of the one or more drive coil arrangements 6040 being disturbed, vandalized or removed, the drive units 6050 are operable to communicate a warning signal to a security facility 6100; the security facility 6100 is provided with an associated information database 6110 in which data describing the one or more drive units 6050 and their associated drive coil arrangements 6040. In response to receiving the warning signal, the security facility 6100 first checks against its database 6110 whether or not the drive units 6050 have been previously recorded as being faulty, for example by roadway maintenance personnel. In an event that a warning signal is received at the security facility 6100 and the database 6110 indicates that the drive units 6050 should be functional, the security system 6100 thereby deduces that the drive units 6030 are being tampered with or vandalized and promptly summons personnel to travel to the drive units 6050 as swiftly as possible to prevent any theft from occurring sod/or arresting parties attempting to undertake vandalism or theft. Optionally, the security facility 6100 is associated with highway police. Beneficially, the security facility 6100 is provided via the warning signals with identities of drive units 6050 being affected and their geographical location. Optionally, the warning signal is communicated via wireless communication infrastructure to the security facility 6100, for example via a wireless telephone network or wireless internet-based communication network.

Referring to FIG. 52A, an example drive coil arrangement 6040 is implemented as a plurality of pairs of capacitors 6160 and inductors 6150 coupled in series; each capacitor 6160 has a capacitance C and each inductor 6150 has an inductance L. Such an implementation of the drive coil arrangement 6040 exhibits a lowest series impedance at a fundamental resonant frequency $f_0$ of the capacitors 6160 and inductors 6150 as defiled by Equation 3 (Eq. 3):

$$f_0 = \frac{1}{2\pi\sqrt{LC}} \qquad \text{Eq. 3}$$

Implementing the drive coil arrangement 6040 as a plurality of series resonant circuits is advantageous to reduce voltage amplitudes and associated cable insulation dielectric losses, in comparison to implementing the drive coil arrangement 6040 as a single capacitor and a single inductor coupled in series.

Referring to FIG. 52B, an example drive coil arrangement 6040 is implemented as a plurality of groups 6180 of series resonant circuits 6170 coupled in parallel, the groups 6180 being coupled in series as illustrated. In FIG. 52B, there are m series resonant circuits 6170 in each group 6180, and n groups 6180 are coupled together in series and driven from their respective drive unit 6050 across terminals A-A. There are thus n×m series resonant circuits 6170 present in the drive coil arrangement 6040 of FIG. 52B. Parameters n and m, together with suitable values for the capacitance C, the inductance L and the resonant frequency $f_0$ can be chosen to customize characteristics of the drive coil arrangement 6040 to match characteristics of its associated drive unit 6050, for example excitation voltage and current output capabilities of the associated drive unit 6050. Unauthorized tampering with the drive coil arrangement 6040 can potentially affect one or more of the series resonant circuits 6170 and is detected by aforementioned sensors at the one or more drive units 6050. Optionally, the capacitors C of the resonant circuits 6170 are bypassed in parallel by high-value resistances which have negligible influence to resonant Q-factor of the resonant circuits 6170.

In FIG. 53A, a schematic implementation of a portion of a drive unit 6050 associated with a drive arrangement 6040 is provided. The drive coil arrangement 6040 is represented by a capacitor C2 and an inductor L3, although the drive coil arrangement 6040 can be, for example, implemented in practice as illustrated in FIG. 52A or FIG. 52B. The drive unit 6050 includes an electronic switching unit 6200 and a matching transformer 6210. Moreover, the switching arrangement 6200 is provided with electrical power at a supply voltage V1 with input power being monitored via a sensor M1, for example implemented using a current meter or power meter. The matching transformer 6210 includes a primary winding L1 and a secondary winding optionally, the transformer 6210 is a ferrite-cored transformer that is capable of coupling considerable power therethrough, for example 10's of kW of power. Alternatively, the transformer 6210 is implemented as en at least partially air-cored transformer. The electronic switching circuit 6200 includes a capacitor C1 coupled across the winding L1 and beneficially arranged in operation to exhibit a parallel resonant frequency corresponding substantially to that of the drive coil arrangement 6040. Moreover, the electronic switching circuit 6200 includes two solid-state switching devices SW1, SW2 which are momentarily switched alternately into a conducting state when in operation at substantially the parallel resonant frequency of the capacitor C1 and winding L1. When a vehicle 6030 is not in spatial proximity of the drive coil arrangement 6040, the solid-state switching devices SW1, SW2 are maintained in a non-conducting state to conserve power. The std-state switching devices SW1, SW2 are beneficially implemented as bipolar transistors, Darlington transistors, MOSFETs, FETs, Silicon Carbide transistors, lilacs, SCRs, or similar, depending upon desired frequency of operation and amount of power to be coupled to vehicles 6030 upon the roadway 6020 via the drive coil arrangement 6040.

The winding L2 is beneficially centre-tapped and coupled at its ends to the drive circuit arrangement 6040 as illustrated. In FIG. 52A and FIG. 52B, the capacitors 6110 are beneficially provided with associated high-value bypass resistances (for example with resistances of several hundred kΩ or even MΩ) coupled in parallel therewith. Other highly efficient manners of implementing the drive unit 6050 are also feasible. For example, referring to FIG. 53B, there is shown the drive unit 6050 incorporating the aforesaid transformer 6210 with its primary and secondary windings L1, L2 respectively; the transformer 6210 is beneficially implemented as a ferrite transformer or an at least partially air-cored transformer. The primary winding L1 is coupled, as shown in FIG. 53B, to an electronic switching circuit 6300 implemented as an E-type amplifier. The E-type amplifier is coupled to the aforementioned supply voltage V1 and associated sensor M1. The E-type amplifier includes a supply inductor L5 whose first end is coupled to the supply V1 and whose second end is coupled to a first terminal of a solid-state switching device SW3 in parallel with a first terminal of a capacitor C5; a second terminal of the switching device SW3 and a second terminal of the capacitor C5 are coupled to the supply voltage V1 as illustrated. The first terminal of the switching device SW3 and the first terminal of the capacitor C5 are coupled via an inductor L6 and via a capacitor C8 to excite the primary winding L1 of the transformer 6210. Optionally, the switching device SW3 is a Silicon Carbide transistor which is capable of switching within nanoseconds, blocking voltages in excess of 1 kV and conducting many 10's of Amperes current. Optionally, the switching device SW3 is implemented as a stack of switching devices arranged in parallel to increase their combined current switching capabilities and/or to series to increase their combined voltage blocking capabilities. Suitable circuit values include, for example: L5=5 mH, C5=10 nF, L9=90 μH, C6=36 nF.

In FIG. 53A and FIG. 53B, there is included an antitheft arrangement 6230 coupled after the capacitors C2, C3 to cables embedded in the asphalt 6220 of the roadway 6020 for implementing the drive coil arrangement 6040. The antitheft arrangement 230 includes a low-pass filter, a voltage meter M2 and a current source I2. In operation, the antitheft arrangement 6230 imposes a small-amplitude tow-frequency and/or d.c. antitheft signal onto the cables of the drive coil arrangement 6040, and the voltage meter M2 monitors a low-frequency signal developed across the cables of the drive coil arrangement 6040. For example, the drive coil arrangement 6040 is excited by the electronic switching circuit 6300, via the transformer 6210, at a frequency in an order of 30 kHz or more, and more preferably in excess of 100 kHz, whereas the antitheft arrangement 6230 imposes an antitheft signal onto the cables of the drive coil arrangement 6040 at a frequency of 10 kHz or leas, more preferably 1 kHz or less. In an event of theft occurring by way of the cables being ripped out of the roadway 6020, the low-frequency signal developed across the cables of the drive coil arrangement 6040 as monitored by the voltage meter changes temporally suddenly in amplitude; the antitheft arrangement 6230 includes computing hardware executing software products recorded on machine-readable data storage media, wherein the computing hardware is operable to identify a theft event from the sudden temporal changes and to communicate via one or more communication networks, for example via a wireless telephony network, to raise an alarm that a theft event may be occurring. The warning signal is received at security facility 6100 which checks on its database 6110 whether or not there are any earner reports of earlier malfunction at the given drive unit 6050. In an event that the given drive unit 6050 has no earlier record or indication of likelihood of malfunction, the security facility 6100 concludes that a genuine theft event is occurring and then sends as promptly as possible security personnel, for example police, to arrest thieves responsible for the theft, for example by way of erecting road blocks, making chase or similar.

In FIG. 53C and FIG. 53D, the antitheft arrangement 6230 as aforementioned is coupled to a conductor 6320 which runs spatially concurrently with one or more conductors 6310 employed to implement the drive coil arrangement 6040. Disruption of the one or more conductors 6310 during a theft event, for example ripping the drive coil arrangement 6040 by force from the asphalt 6220, also disrupts the conductor 6320 which is detected by the antitheft arrangement 6230. Beneficially, the conductor 6320 is integral with a region of cable insulation 6350 which also includes the one or more conductors 6310 as illustrated. Optionally, the conductor 6320 is at a central region of the cable insulation 6350 on account of it conveying a relatively small current, whereas the conductors 6310 are required to convey considerable current such that skin-depth effects in the one or more conductors 6310 is an issue. Optionally, a cable formed by the conductors 6310, 6320 and the cable insulation 6350 is housed within a protective outer pipe or tube 6330 with an air void 6340 therebetween; the outer pipe or tube 6330 is beneficially fabricated from polyethylene and/or polypropylene. Optionally, the cable formed by the conductors 6310, 6320 and the cable insulation 6350 is a standard multicore cable which is pre-assembled into standard continuously-moulded pipe or tubes prior to installation into the asphalt 6220 of the roadway 6020.

Discrimination between the drive units 6050 and their associated drive coil arrangements 6040 failing due to malfunction, and failing due to vandalism or theft will be next described in more detail.

Referring next to FIG. 54A, there is shown a resonance characteristic of the drive coil arrangement 6040 as depicted in FIG. 53A and FIG. 53B. An abscissa aids 6600 denotes increasing frequency from left to right. Moreover, an ordinate axis 6610 denotes a magnitude of current flowing within the drive coil arrangement 6040 for a given drive signal from its corresponding drive unit 6050. The drive coil arrangement 6040 exhibits a resonant angular frequency $\omega_0$, wherein $\omega_0=2\pi f_0$, with −3 dB points defining a bandwidth $B_w$, from which a Q-factor can be computed from Equation 4 (Eq. 4):

$$Q = \frac{\omega_0}{B_w} \qquad \text{Eq. 4}$$

The Q-factor is optionally determined in the system 6010 for a given drive coil arrangement 6040 by operating its corresponding drive unit 6050 to determine the −3 dB points as depicted in FIG. 54A and their corresponding frequencies $\omega_l$ and $\omega_u$, in addition to the fundamental resonant frequency $\omega_0$ and its associated 0 dB amplitude. An alternative approach to determine Q-factor is depicted in FIG. 54B, wherein an abscissa aids 6600 denotes passing time from left to right, and wherein an ordinate axis 6650 represents a current instantaneously circulating in the drive coil arrangement 6040; when drive from the drive unit 6050 to its corresponding drive coil arrangement 6040 is terminated, the current circulating in the drive coil arrangement 40 decays with an exponentially decaying envelope denoted by 6660 from which the Q-factor of the drive coil arrangement 6040 can be computed in computing hardware of the system 6010.

Beneficially, the system 6010 is operable to monitor changes in measured Q-factor of its drive coil arrangements 6040, for example when devoid of vehicles 6030 thereover, for identifying potential problems of damage, corrosion or imminent failure of the drive coil arrangements 6040. Sudden damage such as asphalt cracking, earthquake, landslide, accident, corrosion which could influence operation of the drive coil arrangements 6040 are detectable as changes in Q-factor over time, for example months or even years. Apart from testing for leakage currents to check integrity of cable insulation, testing of Q-factor is capable of detecting increases in cable resistance caused by damage or corrosion. Beneficially, when periodically executing a measurement of Q-factor, account is taken of road conditions, for example road temperature which could be indicative of whether or not the roadway 6020 is covered in ice and/or snow which could influence a Q-factor of a given drive coil arrangement 6040. In an event that a sudden unexpected fail in Q-factor is detected for the given drive coil arrangement 6040, the system 6010 beneficially elects not to energize the given coil arrangement 6040, assuming it to be subject to a theft event which is communicated to the security facility 6100 as aforementioned. "Sudden fall" is to be construed to mean within a few minutes, optionally within a few ten's of seconds.

Referring to FIG. 55A, there is shown a graph including an abscissa axis 6700 denoting passing of time from left to right, and an ordinate axis 6710 denoting increasing Q-factor of a given drive coil arrangement 6040 increasing from bottom to top. A curve 6720 denotes a change of Q-factor of a given drive coil arrangement 6040 which is functioning reliably, whereas a curve 6730 denotes a change of Q-factor of a given drive coil arrangement 6040 whose cable is subject to gradual corrosion causing its one or more conductor progressively to exhibit a higher series resistance. The system 6010 is beneficially operable to measure historical changes in the Q-factors of its drive coil arrangements 6040 and thereby detecting problems with potentially defective drive coil arrangements 6040 before they can represent any form of safety hazard to the system 6010. As denoted by a curve 6740, a theft event as measured by the antitheft arrangement 6230 results in a temporally abrupt, namely sudden, reduction in Q-factor which is notified to the security facility 6100 as aforementioned, "Temporally abrupt" is to be construed to mean within a few minutes, optionally within a few ten's of seconds.

Referring to FIG. 55B, when the circuits in FIG. 53A and FIG. 53B are operable to detect leakage current, a defect drive coil arrangement 6040 will exhibit a temporally relatively rapid increase in leakage current when the insulator of the cable of the drive coil arrangement 6040 is compromised. In FIG. 55B, an abscissa axis denotes a passage of time from left to right, whereas an ordinate axis 6750 denotes increasing leakage current from bottom to top. A curve 6760 denotes leakage current measurements performed by the system 6010 at periodic intervals on a given drive coil arrangement 6040. At substantially a time denoted by a line 6770, the insulation of the cable of the drive coil arrangement 6040 is compromised resulting in a rapid increase in leakage current denoted by 6780. The system 6010 is operable to disconnect and not energize a given drive toll arrangement 6040 which has developed insulation leakage defects, thereby increasing operating safety of the system 6010. A theft event resulting in cables of the drive coil arrangement 6040 being hastily removed from the asphalt 6220 of the roadway 6020 and causing insulation to be damaged results in a temporally abrupt increase in leakage current as denoted by a curve 6790. As denoted by a curve 6790, a theft event as measured by the antitheft arrangement 6230 results in a temporally abrupt increase is leakage which is notified to the security facility 6100 as aforementioned. Moreover, theft of a drive coil arrangement 6040 from the asphalt 6220 of the roadway 6020 also causes a sudden change in Q-factor which is a characteristic monitored by the antitheft arrangement 6230 as aforementioned for detecting potential theft.

Although embodiments of the present invention are described in the foregoing in respect of resonant inductive power transfer, it will be appreciated that the present invention is also pertinent for non-resonant inductive power transfer systems.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

The invention claimed is:

1. A wireless vehicle recharging apparatus for providing recharging power to an energy storage element of a vehicle, the apparatus comprising at least one drive unit arrangement coupled to at least one drive coil arrangement disposed for generating a magnetic field extending from the at least one drive coil arrangement, and includes a corresponding vehicle-mounted pickup coil arrangement coupled to a power conditioning circuit arrangement for receiving the extending magnetic field for providing power to recharge the energy storage element, and wherein:
 (i) the at least one drive unit arrangement is operable to excite the at least one drive coil arrangement at a fundamental frequency ($f_0$); and
 (ii) the at least one drive coil arrangement has non-ferromagnetic and non-conducting components providing a path for the extending magnetic field coupling to the pickup coil.

2. A wireless vehicle recharging apparatus as claimed in claim 1, wherein the at least one drive unit arrangement is operable to employ a balanced class-E amplifier arrangement for exciting the at least one drive coil arrangement at the fundamental frequency ($f_0$).

3. A wireless vehicle recharging apparatus as claimed in claim 1, wherein the vehicle includes a magnetic shield arrangement disposed spatially adjacent to the pickup coil arrangement with a gap there between, such that the pickup coil arrangement is disposed between the magnetic shield arrangement and the drive coil arrangement when the apparatus is in operation.

4. A wireless vehicle recharging apparatus as claimed in claim 1, wherein the pickup coil arrangement of the vehicle is provided with a plurality of coils, and the power conditioning circuit arrangement is operable to select in a dynamic manner amongst the plurality of coils for achieving a most efficient inductive power coupling to the at least one vehicle.

5. A wireless vehicle recharging apparatus as claimed in claim 1, wherein the vehicle is operable to derive its motive power from compressed air driving an air motor to provide torque to wheels of the vehicle, and the energy stored element is implemented as a combination of an air compressor and at least one high-pressure compressed air tank for received compressed air from the air compressor.

6. A vehicle power coupling apparatus for a vehicle, the apparatus comprising a pickup coil arrangement for receiving inductively coupled power, wherein the pickup coil arrangement is supported by a plurality of pivotally-attached members to the vehicle, such that the pickup coil arrangement is operable to swing backwards on its plurality of pivotally-attached members in response to the pickup coil arrangement being affected by a presence of unevenness and/or debris present upon and/or at an upper surface of a roadway along which the vehicle is operable to travel.

7. A vehicle power coupling apparatus as claimed in claim 6, wherein the pickup coil arrangement is mounted via a supporting frame to the plurality of pivotally-attached members, and wherein the supporting frame is operable to swing via the members such that a principal plane of the supporting frame remains substantially parallel to the upper surface of the roadway.

8. A vehicle power coupling apparatus as claimed in claim 6, wherein the pickup coil arrangement is mounted via a supporting frame to the plurality of pivotally-attached members, and wherein the supporting frame is operable to swing via the members such that a principal plane of the supporting frame remains substantially parallel to the upper surface of the roadway and wherein at least one idle wheel or roller is included at the supporting frame for maintaining a substantially constant separation distance between the pickup coil arrangement and the upper surface of the roadway.

9. A vehicle power coupling apparatus as claimed in claim 6, wherein the supporting frame is provided with a dampening arrangement to reduce a tendency of the support frame to oscillate mechanically when subject to air turbulence in operation underneath the vehicle.

10. A vehicle power coupling apparatus as claimed in claim 6, wherein the supporting frame is provided with an actuator arrangement for raising the support frame when the vehicle is to be driven in a reverse direction.

11. A wireless vehicle recharging apparatus for providing recharging power to an energy storage element of a vehicle, the apparatus comprising at least one drive unit arrangement coupled to at least one drive coil arrangement disposed for generating a magnetic field extending from the at least one drive coil arrangement, and includes a corresponding vehicle-mounted pickup coil arrangement coupled to a power conditioning circuit arrangement for receiving the extending magnetic field for providing power to recharge the energy storage element, and wherein:
(i) the at least one drive unit arrangement is operable to excite the at least one drive coil arrangement at a fundamental frequency (f0) of at least 30 kHz; and
(ii) the at least one drive coil arrangement is implemented to be substantially devoid of ferromagnetic components for providing a path for the extending magnetic field;
wherein the at least one drive unit arrangement is operable to employ a balanced class-E amplifier arrangement for exciting the at least one drive coil arrangement at the fundamental frequency ($f_o$).

12. A wireless vehicle recharging apparatus for providing recharging power to an energy storage element of a vehicle, the apparatus comprising at least one drive unit arrangement coupled to at least one drive coil arrangement disposed for generating a magnetic field extending from the at least one drive coil arrangement, and includes a corresponding vehicle-mounted pickup coil arrangement coupled to a power conditioning circuit arrangement for receiving the extending magnetic field for providing power to recharge the energy storage element, and wherein:
(i) the at least one drive unit arrangement is operable to excite the at least one drive coil arrangement at a fundamental frequency ($f_o$) of at least 30 kHz; and
(ii) the at least one drive coil arrangement is implemented to be substantially devoid of ferromagnetic components for providing a path for the extending magnetic field;
wherein the vehicle is operable to derive its motive power from compressed air driving an air motor to provide torque to wheels of the vehicle, and the energy stored element is implemented as a combination of an air compressor and at least one high-pressure compressed air tank for received compressed air from the air compressor.

* * * * *